US011335975B1

United States Patent
Smirnov et al.

(10) Patent No.: US 11,335,975 B1
(45) Date of Patent: May 17, 2022

(54) PROTON SELECTIVE MEMBRANES BASED ON TWO DIMENSIONAL MATERIALS

(71) Applicants: NM Devices LLC, Las Cruces, NM (US); General Graphene Corporation, Knoxville, TN (US); Pavan Chaturvedi, Las Cruces, NM (US); Dhanraj Shinde, Las Cruces, NM (US)

(72) Inventors: Sergei Smirnov, Las Cruces, NM (US); Ivan Vlassiouk, Oak Ridge, TN (US); Pavan Chaturvedi, Las Cruces, NM (US); Dhanraj Shinde, Las Cruces, NM (US)

(73) Assignees: NM DEVICES LLC, Las Cruces, NM (US); GENERAL GRAPHENE CORPORATION, Knoxville, TN (US); PAVAN CHATURVEDI, Las Cruces, NM (US)

( * ) Notice: Subject to any disclaimer, the term of this patent is extended or adjusted under 35 U.S.C. 154(b) by 226 days.

(21) Appl. No.: 16/907,255

(22) Filed: Jun. 21, 2020

Related U.S. Application Data

(60) Provisional application No. 62/866,453, filed on Jun. 25, 2019.

(51) Int. Cl.
| | |
|---|---|
| *H01M 50/446* | (2021.01) |
| *C23C 16/26* | (2006.01) |
| *C23C 16/02* | (2006.01) |
| *C23C 16/56* | (2006.01) |
| *H01M 50/403* | (2021.01) |

(52) U.S. Cl.
CPC ....... *H01M 50/446* (2021.01); *C23C 16/0281* (2013.01); *C23C 16/26* (2013.01); *C23C 16/56* (2013.01); *H01M 50/403* (2021.01)

(58) Field of Classification Search
CPC .......................... H01M 50/446; H01M 50/449
See application file for complete search history.

(56) References Cited

U.S. PATENT DOCUMENTS

| | | | | |
|---|---|---|---|---|
| 2012/0288750 | A1* | 11/2012 | Kung | B82Y 30/00 977/734 |
| 2013/0192461 | A1* | 8/2013 | Miller | B01D 67/0039 95/55 |

\* cited by examiner

*Primary Examiner* — Stephan J Essex
(74) *Attorney, Agent, or Firm* — Bardmesser Law Group

(57) ABSTRACT

Proton conductive membrane includes a proton selective layer of 80-100% carbon with sp2 hybridization having a thickness of 0.3-100 nm, with 0-20% of hydrogen, oxygen, nitrogen and sp3 carbon; wherein the sp2 carbon is in a form of graphene-like material; the proton selective layer having a plurality of pores formed by any of 7, 8, 9 or 10 sp2 carbon cycles or a combination thereof, with the pores having an effective diameter of up to 0.6 nm; an ionomeric polymer layer on the proton selective layer. Total thickness of the proton conductive membrane is less than 50 microns. The ionomeric polymer is PFSA (perfluorinated sulfonic acid), PVP (polyvinylpyrrolidone) or PVA (poly vinyl alcohol) with iodide or bromide counterion dissolved inside. The graphene-like material is CVD graphene or reduced graphene oxide (rGO). A D to G Raman band ratio of the membrane is more than 0.1.

13 Claims, 47 Drawing Sheets

FIG. 2A
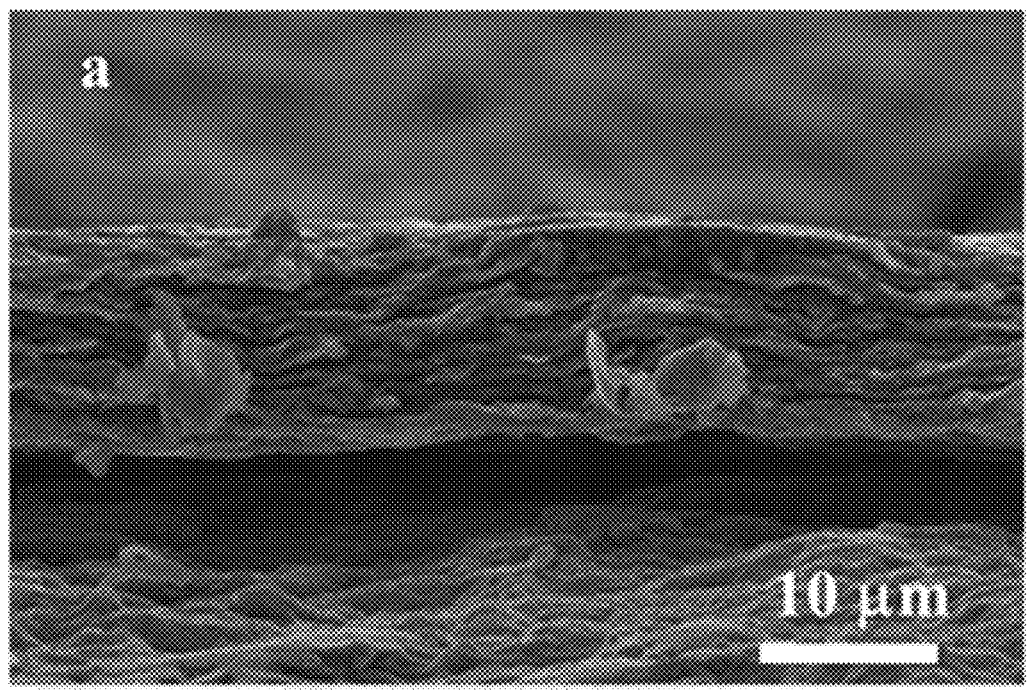
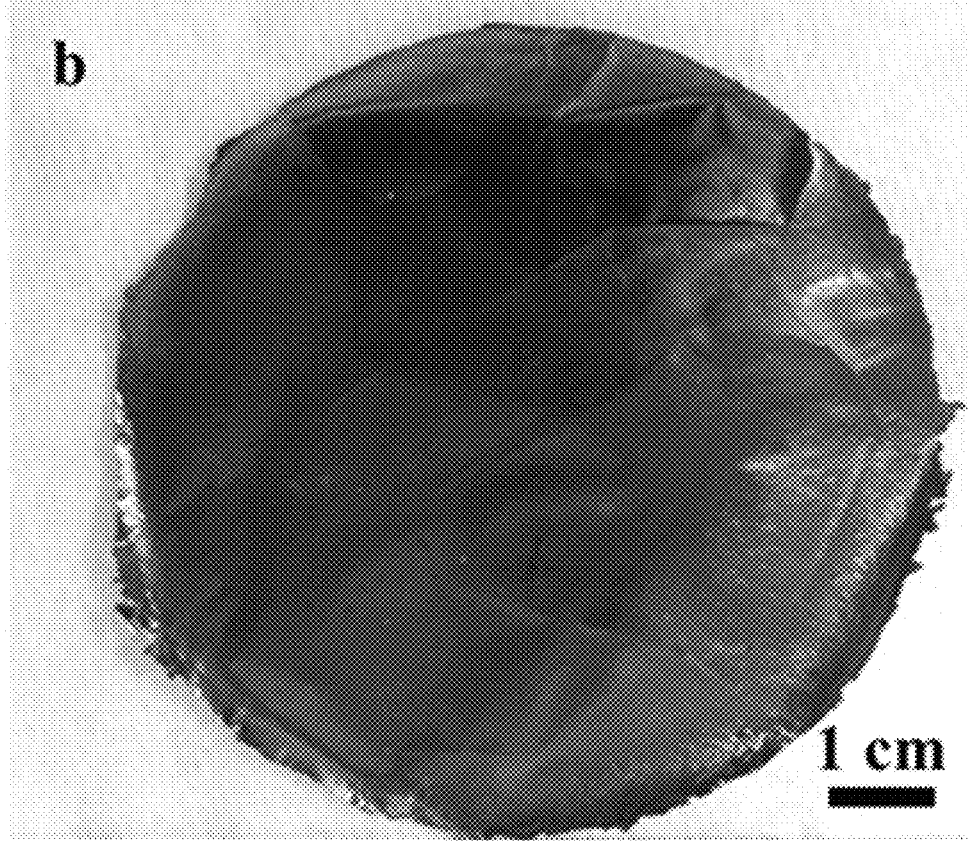
FIG. 2B

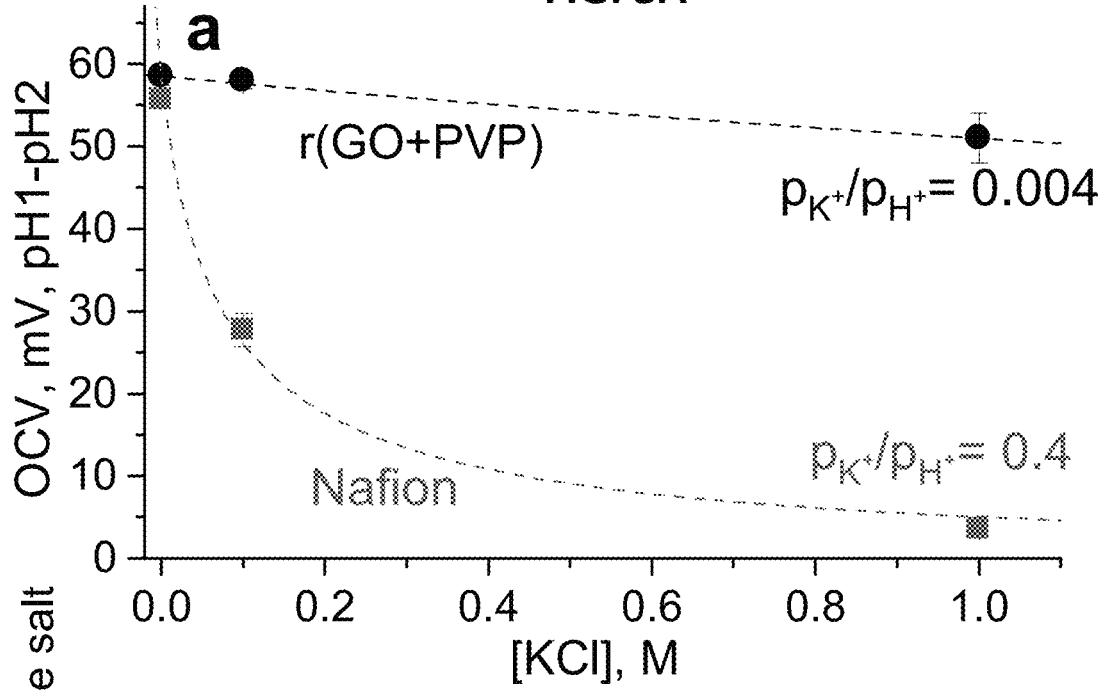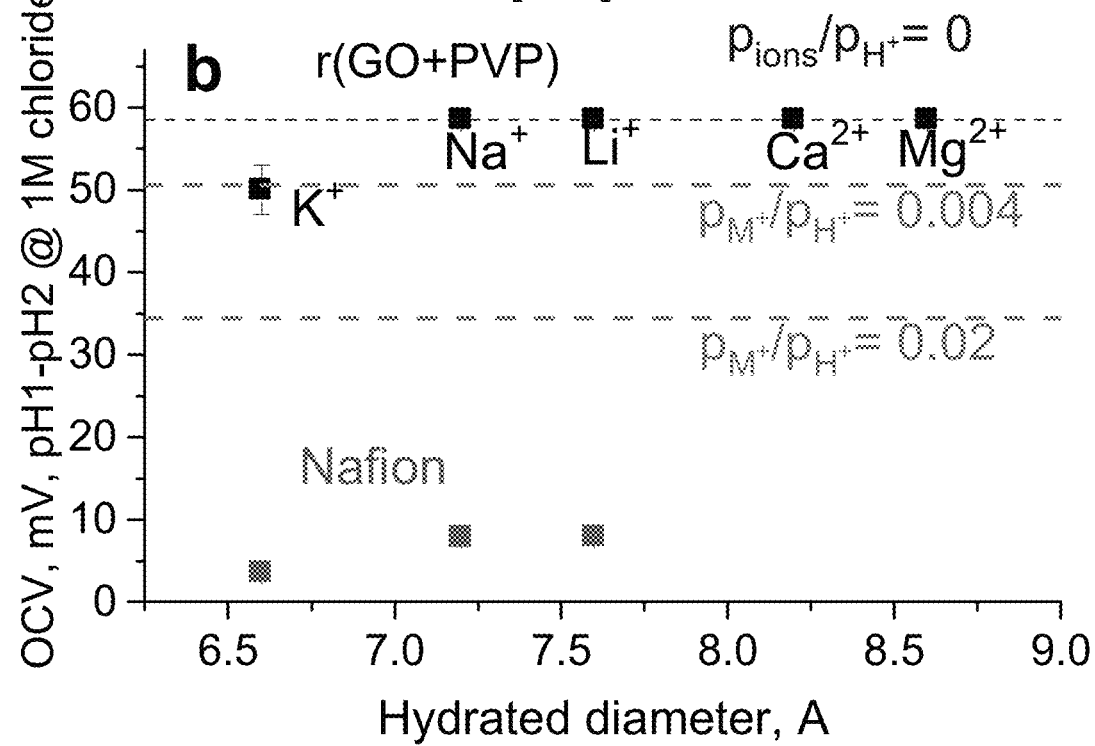

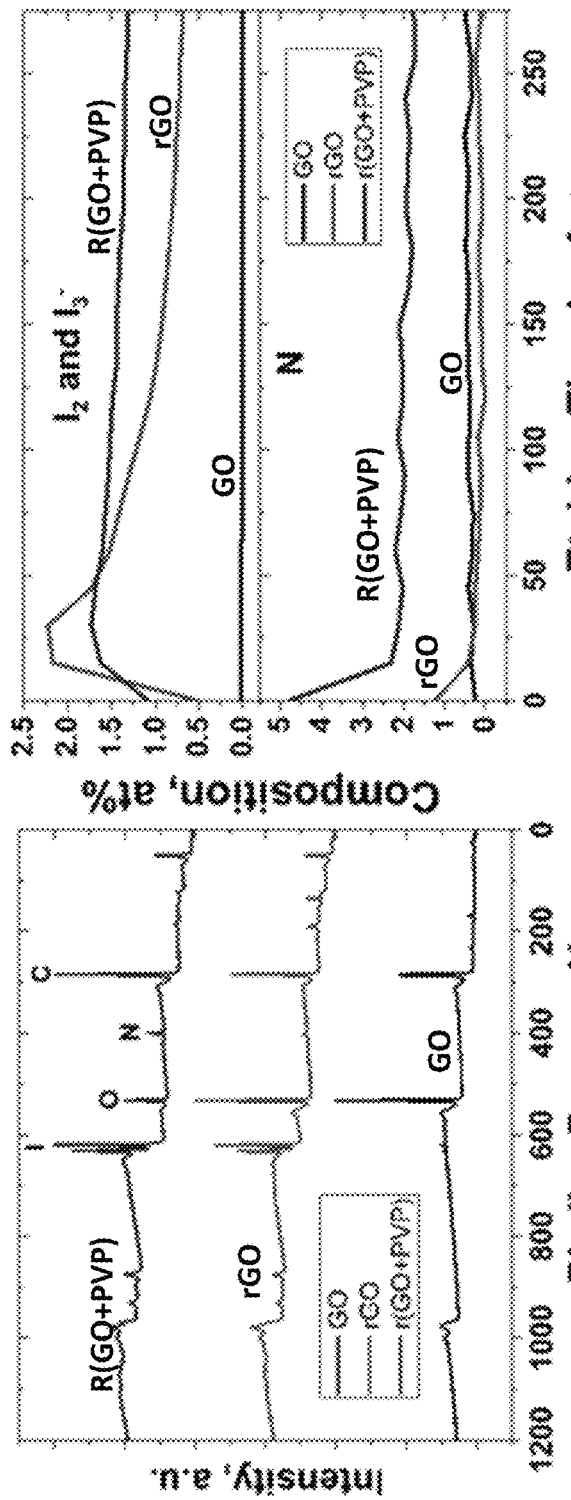
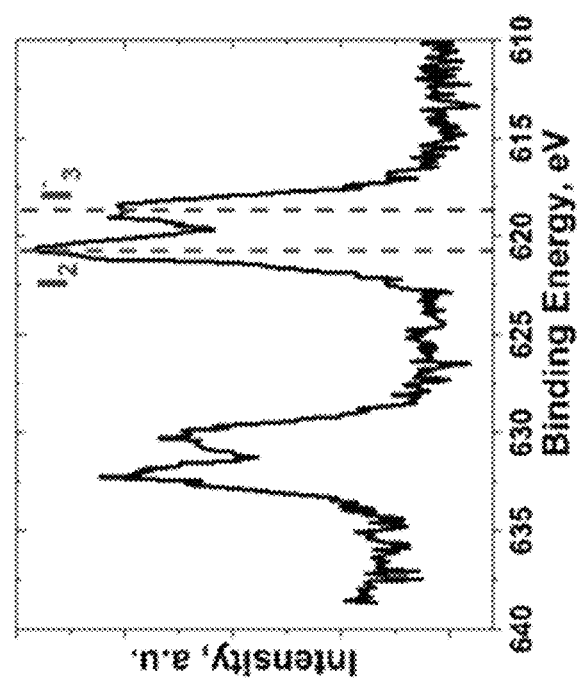
FIG. 12A
FIG. 12B
FIG. 12C

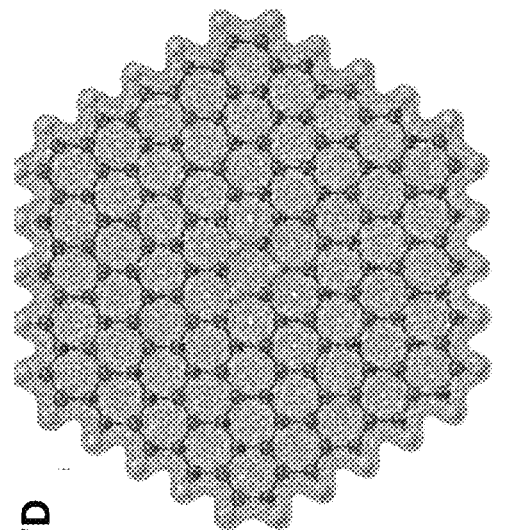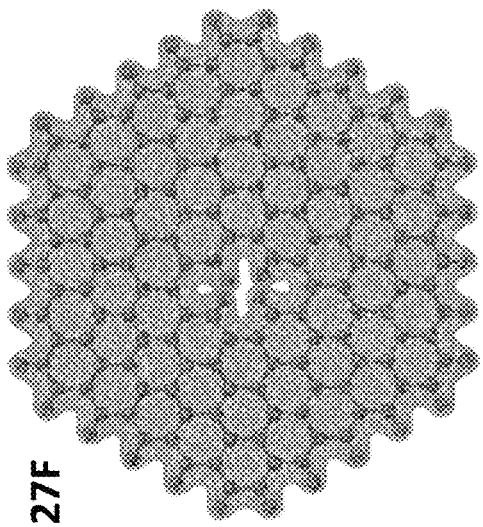
FIG. 27C FIG. 27D FIG. 27E FIG. 27F
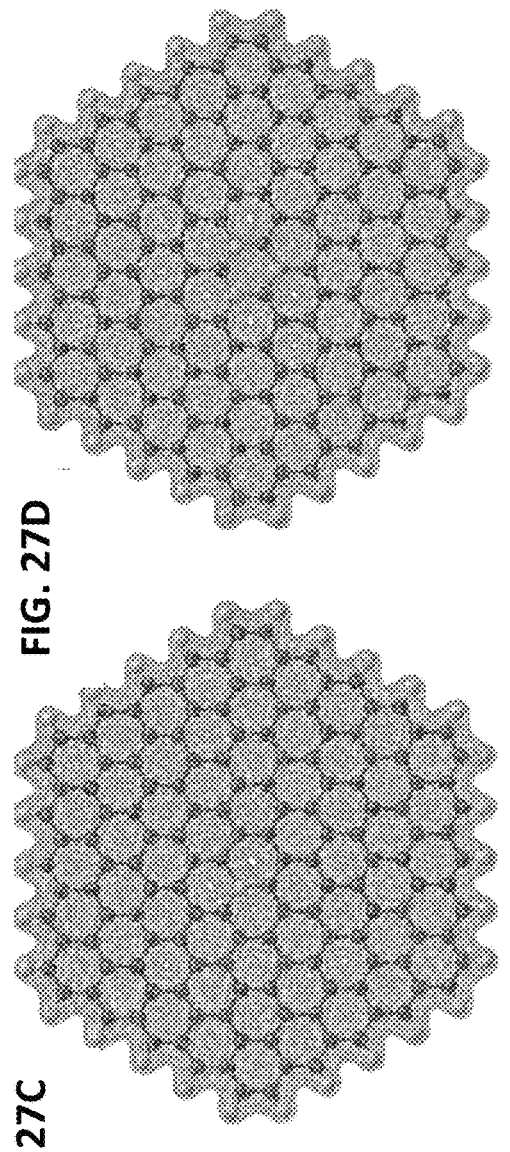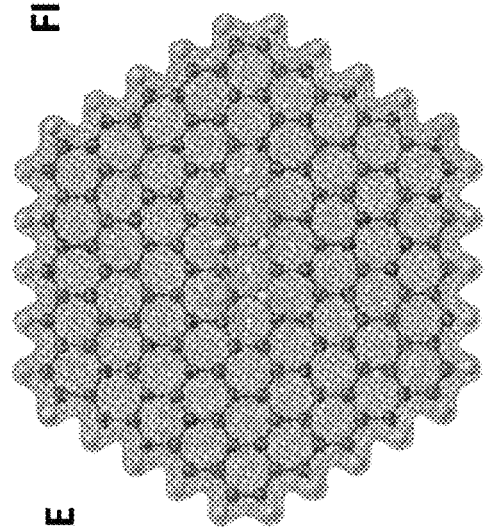

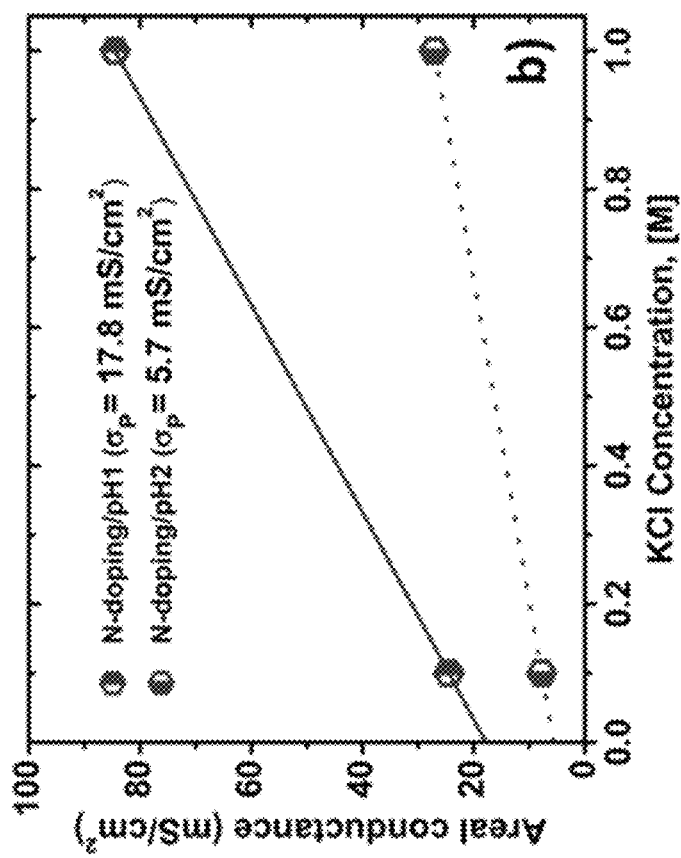
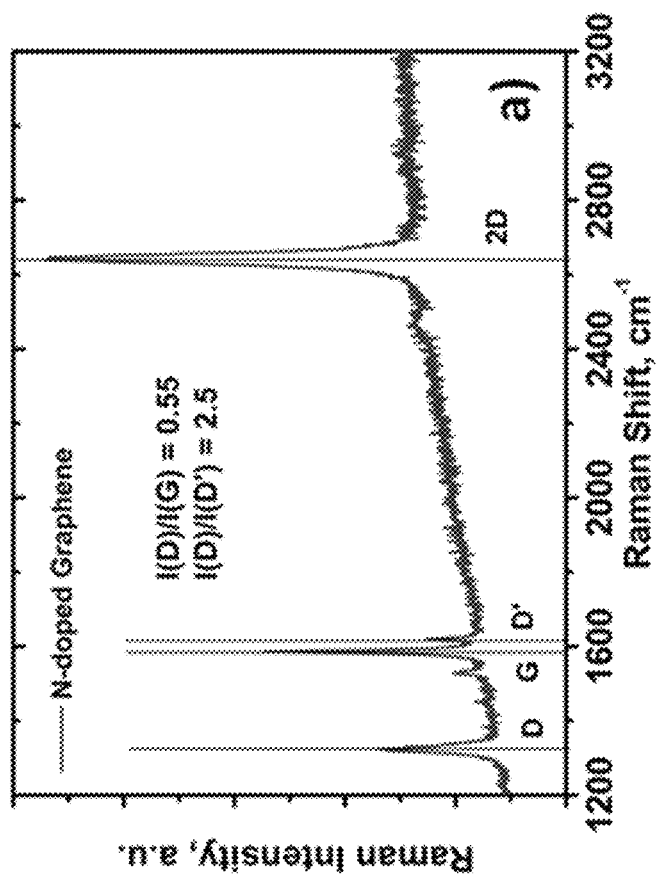
FIG. 31B
FIG. 31A

US 11,335,975 B1

PROTON SELECTIVE MEMBRANES BASED ON TWO DIMENSIONAL MATERIALS

CROSS-REFERENCE TO RELATED APPLICATIONS

This application is a non-provisional of U.S. Provisional Patent Application No. 62/866,453, filed on Jun. 25, 2019, which is incorporated herein by reference in its entirety.

STATEMENT REGARDING FEDERALLY SPONSORED RESEARCH OR DEVELOPMENT

This invention was made with government support under Contract No. DE-AR0000651 awarded by The Advanced Research Projects Agency-Energy (ARPA-E) of the Department of Energy. The government has certain rights in the invention.

BACKGROUND OF THE INVENTION

Field of the Invention

The present invention is related to proton conductive membranes based on sp2 carbon layered materials, preferably comprising graphene materials, such as CVD graphene with specially engineered pores and/or reduced graphene oxide (rGO)/polymer composites, that are better than existing membranes at rejecting cations and molecular species, and have high proton selectivity and conductance.

Background of the Related Art

Note that the following discussion may refer to a number of publications and references. Discussion of such publications herein is given for more complete background of the scientific principles and is not to be construed as an admission that such publications are prior art for patentability determination purposes.

Sustainable green energy based on renewable resources is a worldwide challenge and its realization in electrochemical storage can have different forms, many of which rely on special selective membranes. For example, proton exchange membranes (PEM) have a broad range of applications, including fuel cells, electrolyzes, flow batteries, and others. The most commonly used membranes are based on perfluorosulfonic acid (PFSA), or Nafion, which are actually cation exchange membranes (i.e., they effectively reject only anions and are less selective to rejection of cations and molecular species like methanol). They are vulnerable to crossover of molecular and ionic species, which reduces their performance. For example, crossover of methanol limits the performance of DMFC (direct methanol fuel cells) and limits PFSA use to dilute solutions of methanol in water rather than concentrated methanol. Nafion membranes also require the presence of water (e.g., high humidity) for the hydration of sulfonic groups to achieve effective transport of protons, making water management a challenging engineering task in some applications.

In the last decades, various approaches were investigated to resolve drawbacks of PFSA proton exchange membranes yielding some incremental improvements in their performance. Approaches included numerous inorganic/polymer composites membranes and other than PFSA polymers. Despite the enormous R&D efforts in this area during last decades, only one membrane in addition to PFSA was introduced to the market, which is produced by BASF. The Celtec membrane is based on polybenzimidazole doped by phosphoric acid. Recently, membranes based on 2D materials such as graphene oxide and $MoS_2$ were prepared, again, with only incremental improvements in conductivity, mechanical properties and crossover compared to pure PFSA polymer.

The idea of using carboneous nanomaterials, such as carbon nanotubes, graphene, graphene oxide (GO), and reduced graphene oxide (rGO) as multifunctioning additives to proton conductive materials that also reduce the crossover problem has been extensively explored. Stronger materials enable thinner membranes with the same conductivity to be used, thus achieving improved areal conductance. Graphene oxide has proved to be useful material in a variety of applications due to its ease of synthesis, water solubility, and the oxygen functional groups that can be conveniently altered. In the PEM applications, GO has shown advantages in minimizing the methanol crossover and improving membrane conductance. Its oxygen functional groups can be used for additional functionalization. Blends of GO/Nafion composite PEMs have been shown to reduce the methanol permeability, and it has been reported that slightly reduced GO and Nafion self-assemblies have promising behavior for direct methanol fuel cells. Reduction of GO is very sensitive to a type of reducing reagent; reducing agents that do not generate $CO_2$, CO or $O_2$, e.g., HI, HBr or ascorbic acid, produce well-packed, dense membranes that are practically impermeable for various species (see U.S. Pat. No. 10,583,407B2). Even the addition of some amount of water-soluble polymer such as polyvinyl alcohol (PVA) does not affect these impermeable barrier properties of rGO/PVA composites.

Similarly, it was shown that even pristine continuous graphene (see EP 3194072B1) has some finite probability for protons to go through, which resulted in nonzero area proton conductance through it but lower than for Nafion membranes.

SUMMARY OF THE INVENTION (DISCLOSURE OF THE INVENTION)

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

In one aspect, there is provided a method of manufacturing a proton conductive membrane, comprising the steps of producing a layer(s) of graphene on a metal film catalyst via chemical vapor deposition; transferring the layer(s) of graphene onto a PFSA (perfluorinated sulfonic acid) substrate; and generating defects in the layer(s) of graphene by bombardment of the graphene with $He^+$ or $Ne^+$ ions or by irradiation with hydrogen, nitrogen or oxygen plasma. Optionally, up to 10 layers of the chemical vapor deposited graphene are either grown in one step or sequentially transferred on top of each other. Optionally, a D to G Raman band ratio for the proton selective part of the membrane is more than 0.1. Optionally, a second layer of PFSA is added to the membrane on an opposite side of the membrane. Optionally, the adding step uses any of spray-coating, hot pressing/rolling or dip coating. Optionally, additional layer(s) of graphene are added on an opposite side of the membrane. Optionally, the defects are formed by non-hexagonal sp2 carbon cycles, with the defects having an effective diameter of up to 0.6 nm. Optionally, the layer(s) of graphene include 90-100% carbon with sp2 hybridization having a thickness of 0.3-10 nm, with remaining 0-10% of hydrogen, oxygen, nitrogen and sp3 carbon.

In another aspect, a proton conductive membrane, includes a proton selective layer of 70-100% carbon with sp2 hybridization having a thickness of 0.3-100 nm, with a remaining portion 0-30% made of hydrogen, oxygen, nitrogen and sp3 carbon; wherein the sp2 carbon is in a form of graphene-like material; the proton selective layer having a plurality of pores formed by any of 7, 8, 9 or 10 sp2 carbon cycles or a combination thereof, with the pores having an effective diameter of up to 0.6 nm; an ionomeric polymer layer on the proton selective layer. A total thickness of the proton conductive membrane is less than 50 microns. Optionally, the ionomeric polymer is PFSA (perfluorinated sulfonic acid). Optionally, the graphene-like material is reduced graphene oxide (rGO). Optionally, the graphene-like material is CVD graphene. Optionally, a D to G Raman band ratio of the membrane is more than 0.1. Optionally, the graphene-like material is CVD graphene bombarded by $He^+$ or $Ne^+$ ions. Optionally, the graphene-like material is CVD graphene treated by nitrogen, hydrogen or oxygen plasma. Optionally, the graphene-like material is CVD graphene treated by ozone. Optionally, the ionomeric polymer is PVP (polyvinylpyrrolidone) or PVA (poly vinyl alcohol) with iodide or bromide counterion dissolved inside. Optionally, the graphene-like material is a layered structure of reduced graphene oxide (rGO) and polymer between the rGO layers of the structure. Optionally, there is a second layer of graphene-like material, with the ionomeric polymer sandwiched between the layer of graphene-like material and the second layer of graphene-like material. Optionally, there is a second ionomeric polymer layer, with the layer of graphene-like material sandwiched between the layer of ionomeric polymer layer and the second ionomeric polymer layer. Optionally, the membrane has the following properties: not exceeding 0.6 ohm·$cm^2$ proton resistance (APR), a level of $VO^{2+}$ permeability coefficient less than $2\times10^{-9}$ $cm^2$/min and methanol permeability coefficient less than $2\times10^{-10}$ $cm^2$/s. In the case of graphene, the thickness of the membrane of the proton selective layer is typically 0.3-5 nm. In the case of rGO, the thickness of the membrane of the proton selective layer is typically from 3 nm up to 100 nm.

In another aspect, a proton conductive membrane, includes a plurality of layers of reduced graphene oxide (rGO), each layer having a plurality of pores; water soluble molecules that include polymers or monomers and located between the layers of rGO, wherein a ratio of the molecules to the rGO is between 0.5 and 2 by weight; and wherein a total thickness of the membrane is 10 to 50 microns for a freestanding membrane, and up to 10 microns for a membrane that is deposited onto a PFSA (perfluorinated sulfonic acid) base. Optionally, the rGO is obtained by reducing graphene oxide (GO) in an already assembled structure of GO. Optionally, the water soluble molecules are any of PVP (polyvinylpyrrolidone), MVP ((mono) vinylpyrrolidone), CL (s-caprolactam), NMCL (N-methyl caprolactam) and PVA (poly vinyl alcohol). Optionally, the ratio is between 0.9 and 1.4. Optionally, the reduction of GO to rGO is performed by HI or HBr vapor. Optionally, the water soluble molecules are PVP (polyvinylpyrrolidone). Optionally, a molecular weight of the PVP is below 5 kDa. Optionally, the membrane has the following properties: not exceeding 0.6 ohm $cm^2$ area proton resistance (APR), a level of rejection of ions, other than protons, of at least 99% and at least 99% rejection of molecules. Optionally, the membrane has the following properties: not exceeding 0.6 ohm·$cm^2$ proton resistance (APR), a level of $VO^{2+}$ permeability coefficient less than $2\times10^{-9}$ $cm^2$ $cm^2$/min and methanol permeability coefficient less than $2\times10^{-10}$ $cm^2$/s.

In another aspect, a method of manufacturing a proton conductive membrane, includes the steps of producing a layer(s) of graphene on a metal film catalyst via chemical vapor deposition; transferring the layer(s) of graphene onto a PFSA (perfluorinated sulfonic acid) substrate; and generating defects in the layer(s) of graphene by bombardment of the graphene with $He^+$ or $Ne^+$ ions or by irradiation with hydrogen, nitrogen or oxygen plasma. Optionally, up to 10 layers of the chemically vapor deposited graphene are either grown in one step or sequentially transferred on top of each other. Optionally, a D to G Raman band ratio of the membrane is more than 0.1. Optionally, a second layer of PFSA is added to the membrane on an opposite side of the membrane. Optionally, the adding step uses any of spray-coating, hot pressing/rolling or dip coating. Optionally, additional layer(s) of graphene are added on an opposite side of the membrane.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention.

In the figures:

FIG. 2A is an SEM image illustrates the nacre-like structure of a r(/GO) membrane or film of the present invention showing that the thickness, 11 µm, agrees well with the estimated thickness obtained from the amount of filtered material.

FIG. 2B is a photograph of an r(GO/PVP) membrane of the present invention.

FIG. 3A shows the open circuit voltage (OCV) for the pH1/pH2 gradient for the composite membrane r(PVP/GO) and Nafion 117 at different concentrations of KCl.

FIG. 3B shows the OCV for the same membranes in pH1/pH2 gradient solutions with 1 M of different chloride salts plotted vs. hydrated diameters of each cation.

FIG. 12A shows survey x-ray photoemission spectroscopy (XPS) spectra showing the chemical composition of dropcasted films.

FIG. 12B shows a depth profile analysis for GO (black), rGO (red) and r(PVP/GO) (blue) demonstrating the presence of nitrogen in the films only for the r(PVP/GO) sample, while iodine species were detected for both r(GO) and r(PVP/GO).

FIG. 12C shows the XPS spectrum of the iodine species region showing evident bands for $I_2$ (~620.5 eV) as well as $I_3^-$ (618.7).

FIGS. 27A-27F illustrate electron density maps for different defects.

FIG. 31A-31B show Raman spectra (a) and conductance values at different pH and [KCl] (b) for in situ incorporated N in the graphene membrane during the CVD synthesis.

FIG. 36A shows characteristic discharge capacity fading in the VFB using Nafion 211 (black) and Graphene/Nafion/Graphene (red) membranes. FIG. 36B shows OCV decrease in VFB for the same membranes with lower volume of electrolyte. shows possible CVD graphene/ionomer sandwich structures.

DETAILED DESCRIPTION OF EMBODIMENTS OF THE INVENTION

Figure 1A:
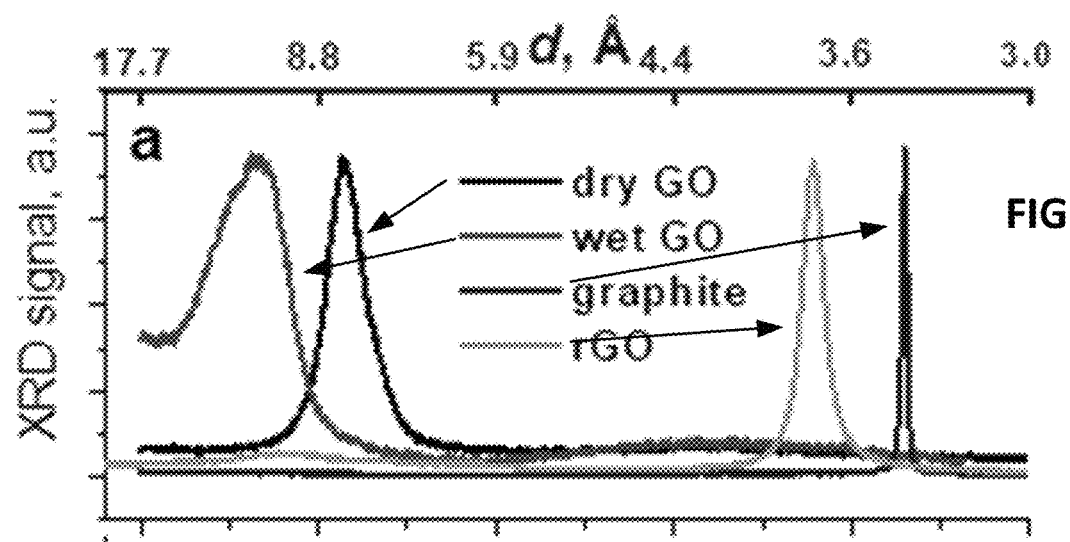
FIG. 1A is a comparison of x-ray diffraction (XRD) patterns for graphite, dry and wet graphene oxide (GO), and reduced GO (rGO) thin films.

Reference will now be made in detail to the preferred embodiments of the present invention, examples of which are illustrated in the accompanying drawings.

In the discussion below, we show various approaches to tailor the proton conducting defects in CVD graphene that retain blockage of ions and molecules but enhance native proton conductance of graphene. Such CVD graphene coupled with various substrates including ionomers (for example, PFSA membranes) in various geometries (FIG. 30) represent practical realization proton conductive membrane. Practicality was shown by operational vanadium flow battery (VFB).

Embodiments of the present invention are new types of proton conductive membranes preferably based either a) on composites of reduced graphene oxide (rGO) with different compounds such as water soluble molecules or polymers, for example PVP, PVA (polyvinylalcohol), caprolactam; or b) on CVD graphene with engineered defects. The rGO based membranes have nacre or "brick and mortar" structure recently shown to offer multiple potential advantages while single or double layer CVD graphene with engineered defects is only one or two atoms thick. In both cases of the proposed membranes, they can be used either as free standing or as sandwiches/laminates with Nafion membranes. Both types of proposed membranes provide a very selective barrier with high proton conductance and rejection of molecular and ionic species and the advantages/disadvantages for each as free standing and as a sandwich with Nafion are given below.

Prior uses of rGO and rGO with small fraction of polymer materials have been shown to be completely impermeable barriers. The main advantage of the proposed here formulation for rGO based membranes is that they can be tuned to be proton conductive but with low crossover of molecules and ions. Because of the relatively low cost and scalability, good mechanical stability and, most importantly, extremely high specificity to protons with high proton conductance makes such membranes to stand out from previous reported formulations as a unique specialty material.

A unique combination of finely tuned properties produces membranes that in most aspects are superior to those of PFSA. The rGO, polymer (e.g., PVP or PVA), and reducing reagent (HI or HBr) are preferably used to manufacture the proton conductive membranes of option a) of the present invention, which are characterized by their low cost, close to 100% rejection of all ions and molecular species such as water and methanol, and proton conductance exceeding that of Nafion. Excellent results were obtained with HI as a reducing reagent and polyvinylpyrrolidone (PVP) polymer, where rGO was produced by reduction of GO and preferably serves as a stabilizing barrier, and the polymer with well-coordinated triiodide preferably serves as an efficient proton conducting medium (likely via Grotthuss mechanism). The densely packed membrane of the present invention practically eliminates crossover of any molecular or ionic species. The finely tuned behavior depends on the polymer type, its fraction to GO, molecular weight, and the reduction conditions.

CVD graphene geometry does not require reduction, but the proton conductance was enhanced by post synthesis treatments including plasma ($N_2$ or $H_2$) and ion bombardment (He, Ne). Such treatments retain the rejection of molecular and ionic species to a different degree but improve proton conductance through graphene.

Figure 11A:
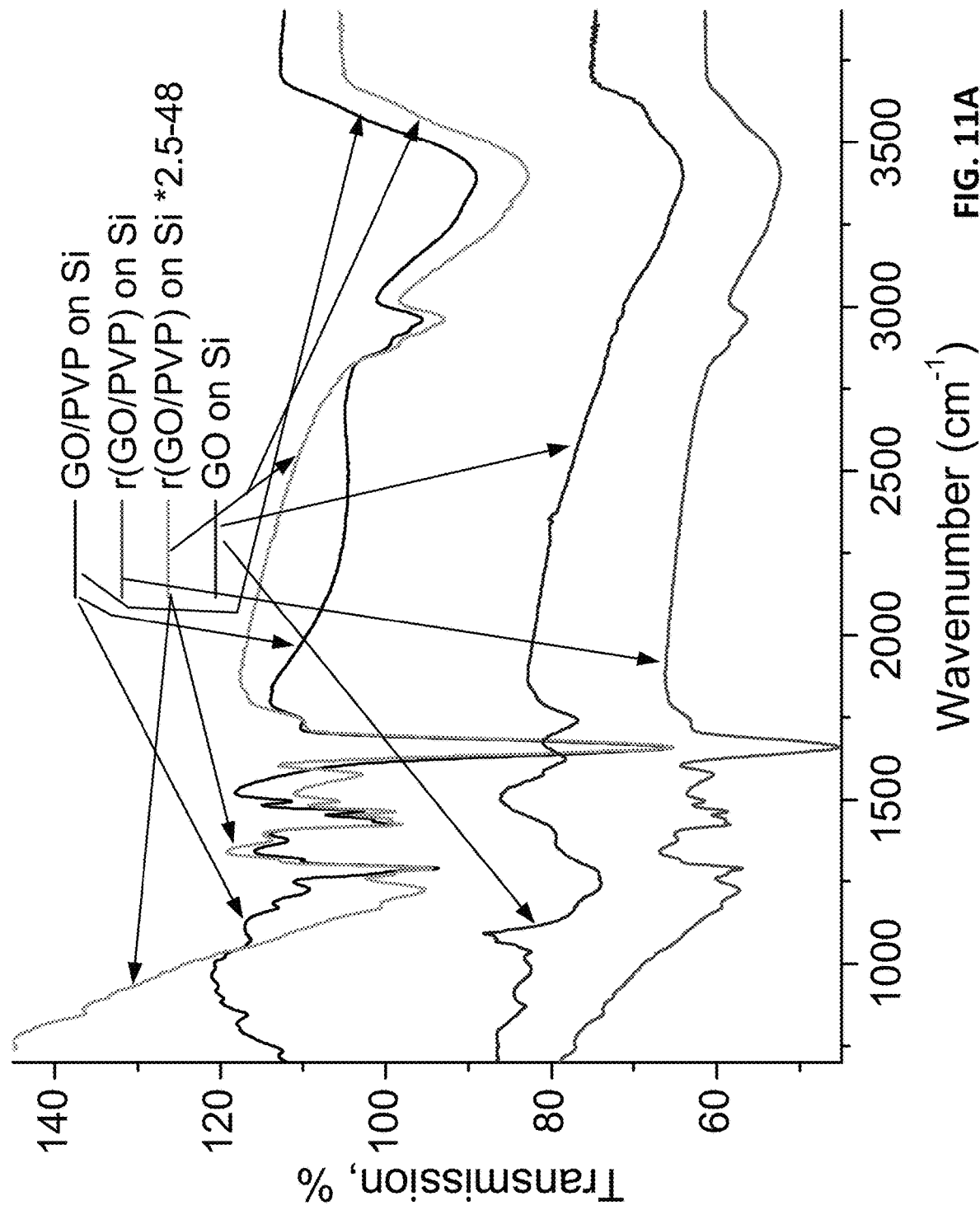
FIG. 11A and FIG. 11B show FTIR spectra of different films on Si wafers at two different wavenumber scales.
Figure 11B:
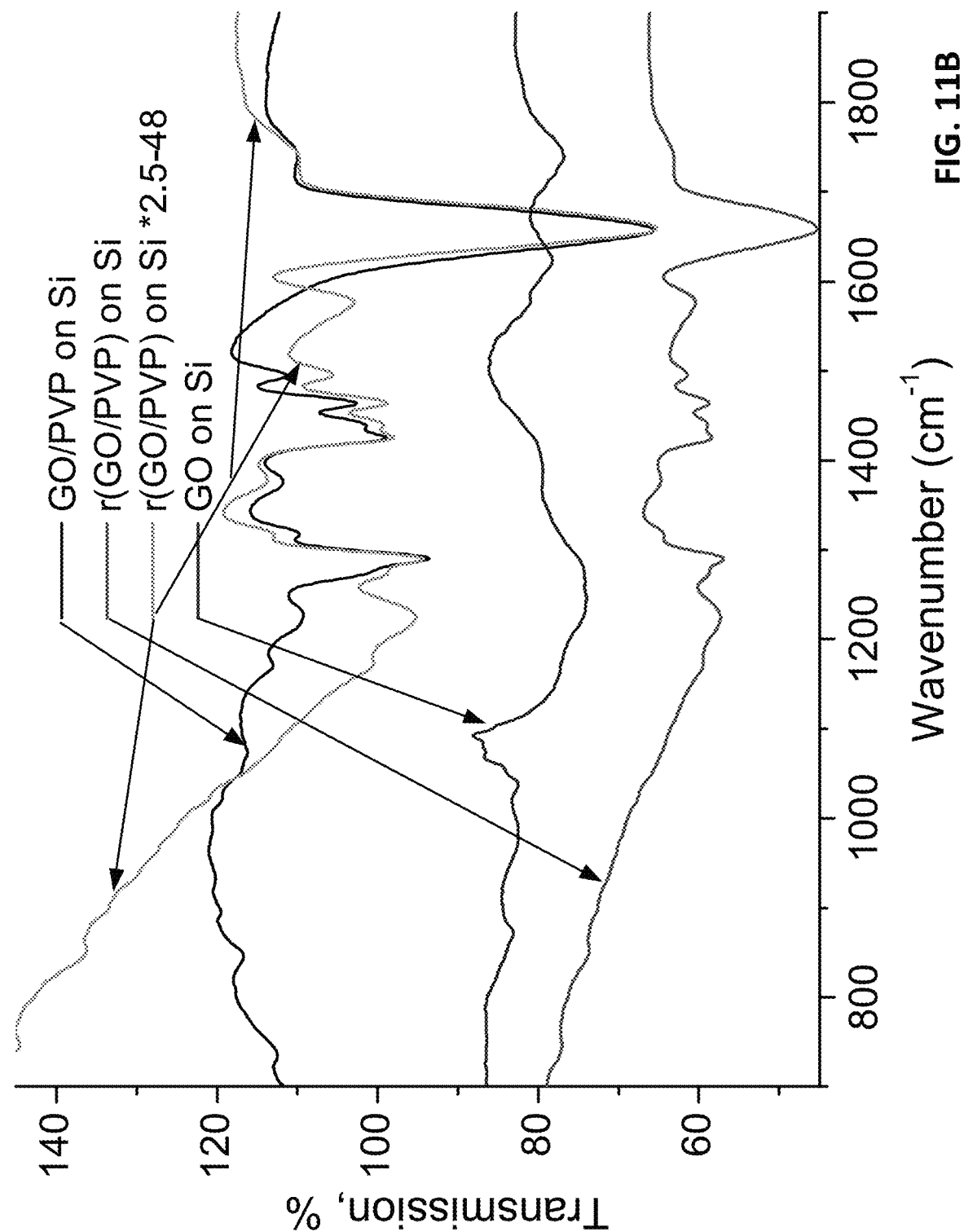
Figure 11C:
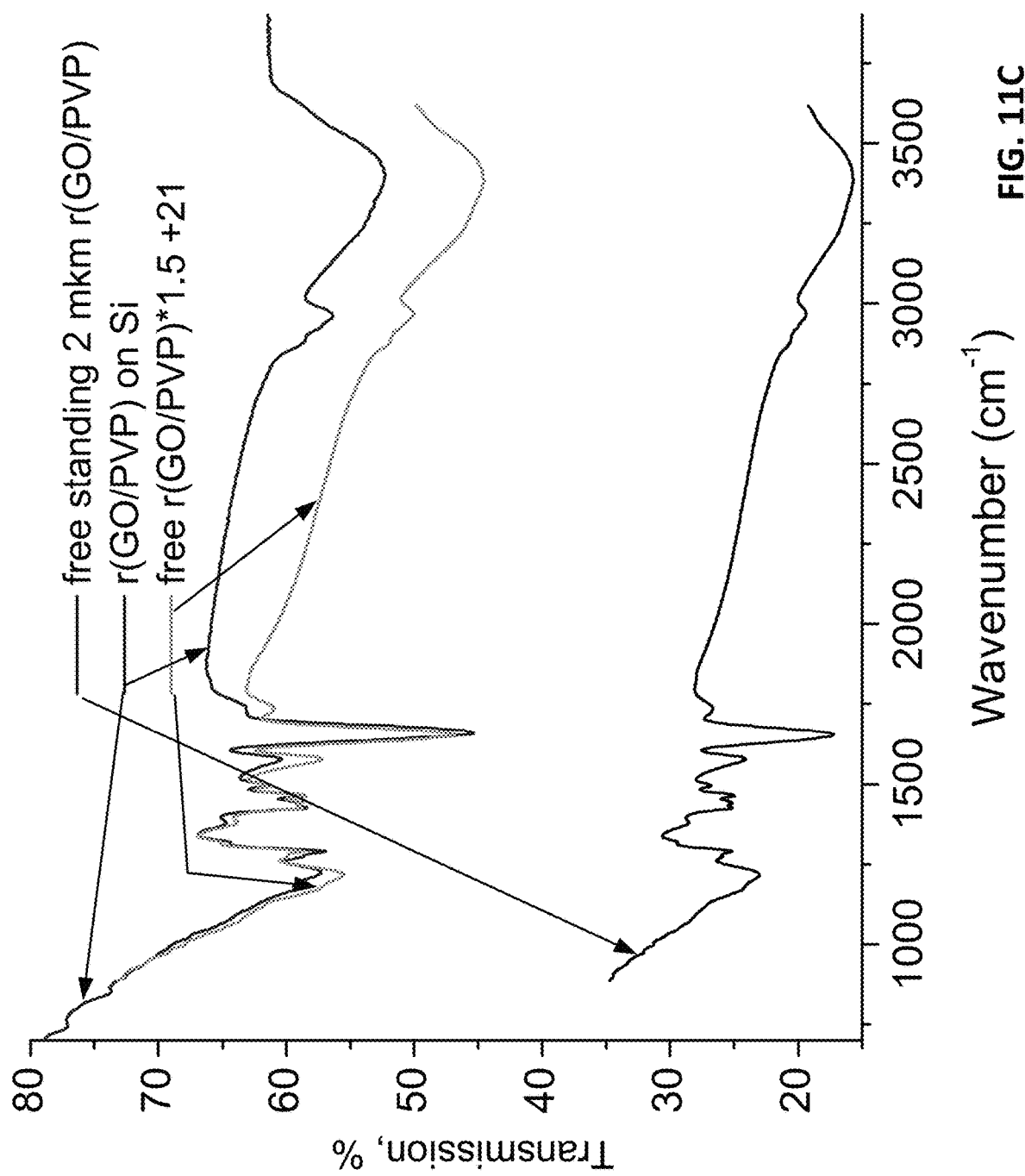
FIG. 11C and FIG. 11D show comparisons of Fourier transform infrared (FTIR) spectra of both freestanding r(PVP/GO) films and r(PVP/GO) films on Si wafers at two different wavenumber scales.
Figure 11D:
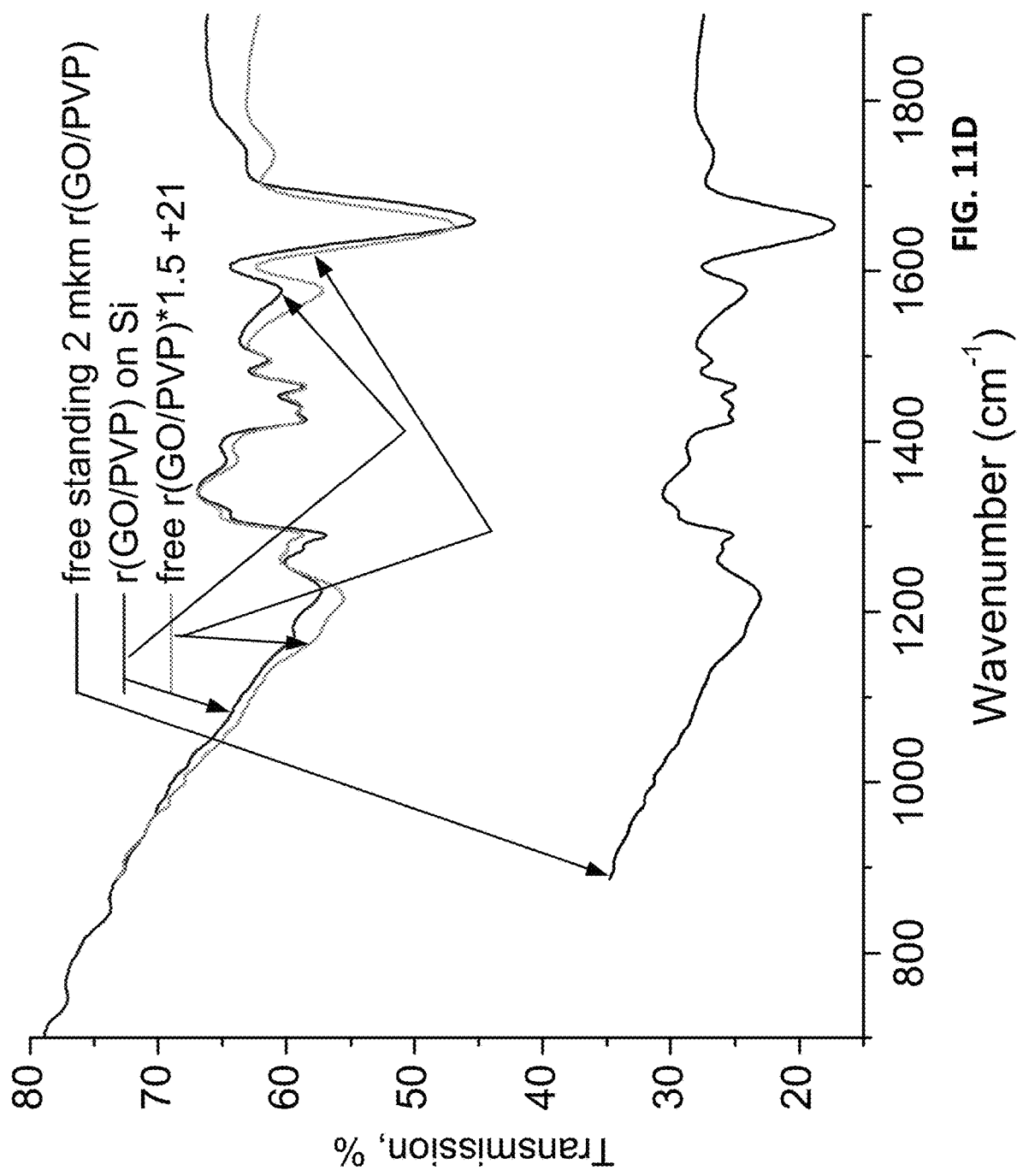
Figures 13A, 13B:
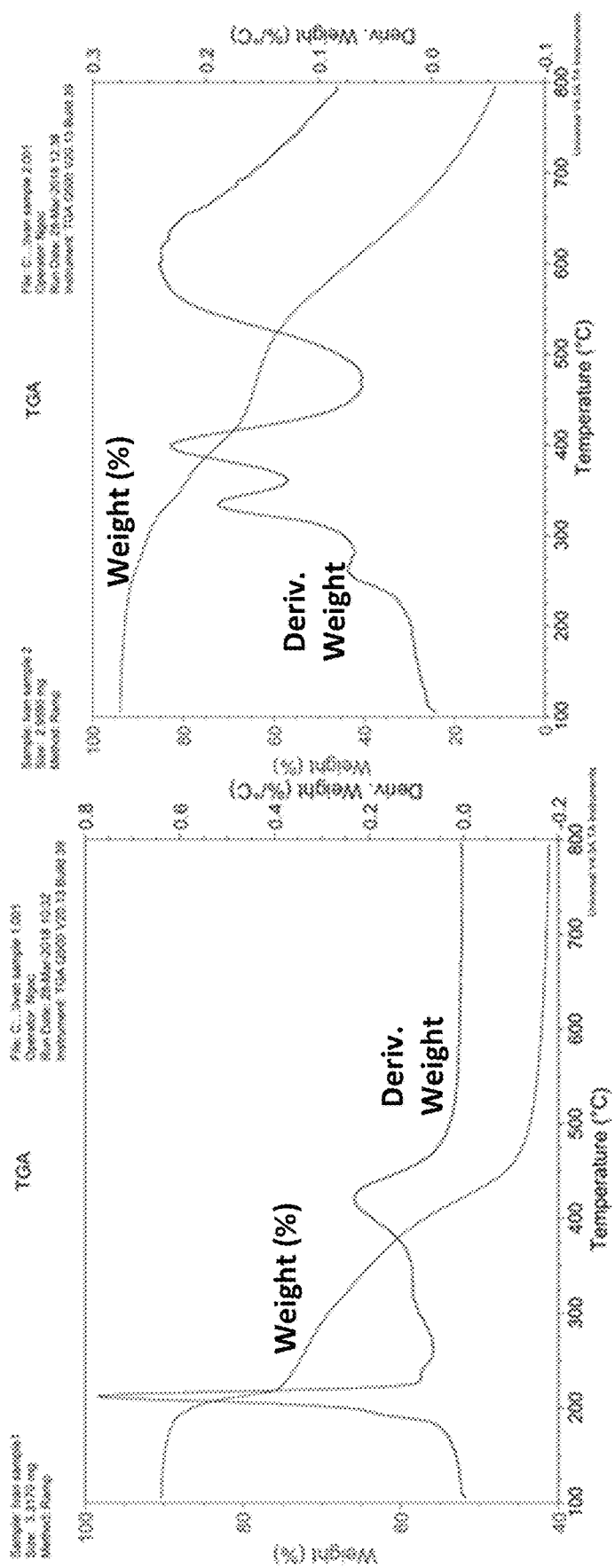
FIGS. 13A and 13B show the thermogravimetric analysis (TGA) and the derivative curves for GO/PVP and r(GO/PVP) samples respectively, saturated with water and measured in Argon atmosphere in the temperature range 100° C. to 800° C.

Although graphene oxide and reduce graphene oxide are graphene-like structures but differ from it significantly. FIG. 1A illustrates a strong dependence of the spacing between layers (d spacing) in GO membranes on humidity: the XRD (001) peak shift corresponds to a significant d-spacing increase, from 8 to 11 Å, after increasing humidity to 100%. There is no d-spacing dependence for the r(GO/PVP) membrane In FIG. 1B, which does not change even after exposure to 100% humidity, similar to rGO membranes. The low angle diffraction peaks at ~6° (001 reflection) and 12° (002 reflection) in GO/PVP and r(GO/PVP) composites can be assigned to the d-spacing between either GO-GO sheets or rGO-rGO sheets with PVP in between. The peak at ~22° (4.1 Å) is assigned to the spacing between overlapping GO or rGO sheets without PVP in between, which is supported by the decrease of this peak intensity with increasing PVP concentration (see FIG. 11A). The different pattern in r(GO/PVP) demonstrates that the GO sheets are individually dispersed in the PVP matrix and maintain such dispersion after reduction, without multi-layered rGO stacks at 24°. rGO composites with polymers retain their barrier properties due to the hydrophobic nature of rGO sheets, it illustrates negligible water uptake by the membranes. Such membranes, despite serving as barriers preventing crossover of water and ions, are shown herein to be unexpectedly excellent conductors of protons.

The membranes are proton conductive and selective almost exclusively to protons. The extremely high selectivity of such GO based membranes to protons can be illustrated by the Goldman-Hodgkin-Katz (GHK) equation that describes the open circuit voltage (OCV) across a membrane due to the concentration gradients by taking into account different permeabilities of all the ions on the two sides of the membrane:

$$OCV = \frac{RT}{F} \ln\left(\frac{p_H[H^+]_l + p_M[M^{n+}]_l + p_{Cl}[Cl^-]_r}{p_H[H^+]_r + p_M[M^{n+}]_r + p_{Cl}[Cl^-]_l}\right) \quad (1)$$

Here R is the universal gas constant, T is the absolute temperature, and F is the Faraday's constant. The relative permeabilities, $p_H$, $p_M$, and $p_{Cl}$, for the $H^{n+}$, $M^{n+}$, and $Cl^-$ ions with the concentrations $[H^+]$, $[M^{n+}+]$, $[Cl^-]$ that are different on the left (l) and right (r) sides of the membrane as denoted by the corresponding subscripts. The GHK equation can be applied for evaluating proton selectivity of membranes by measuring the OCV at different concentrations of the ions involved.

FIG. 2A is an SEM image illustrates the nacre-like structure of a r(/GO) membrane or film of the present invention showing that the thickness, 11 μm, agrees well with the estimated thickness obtained from the amount of filtered material. This corresponds to a distance between the rGO sheets of about 1.4-2.0 nm (estimated from 4 mg/mL of GO in solution, 0.75 mL of which was spread over a 3.8 cm diameter filter).

FIG. 2B is a photograph of an r(GO/PVP) membrane of the present invention.

Figure 3C:
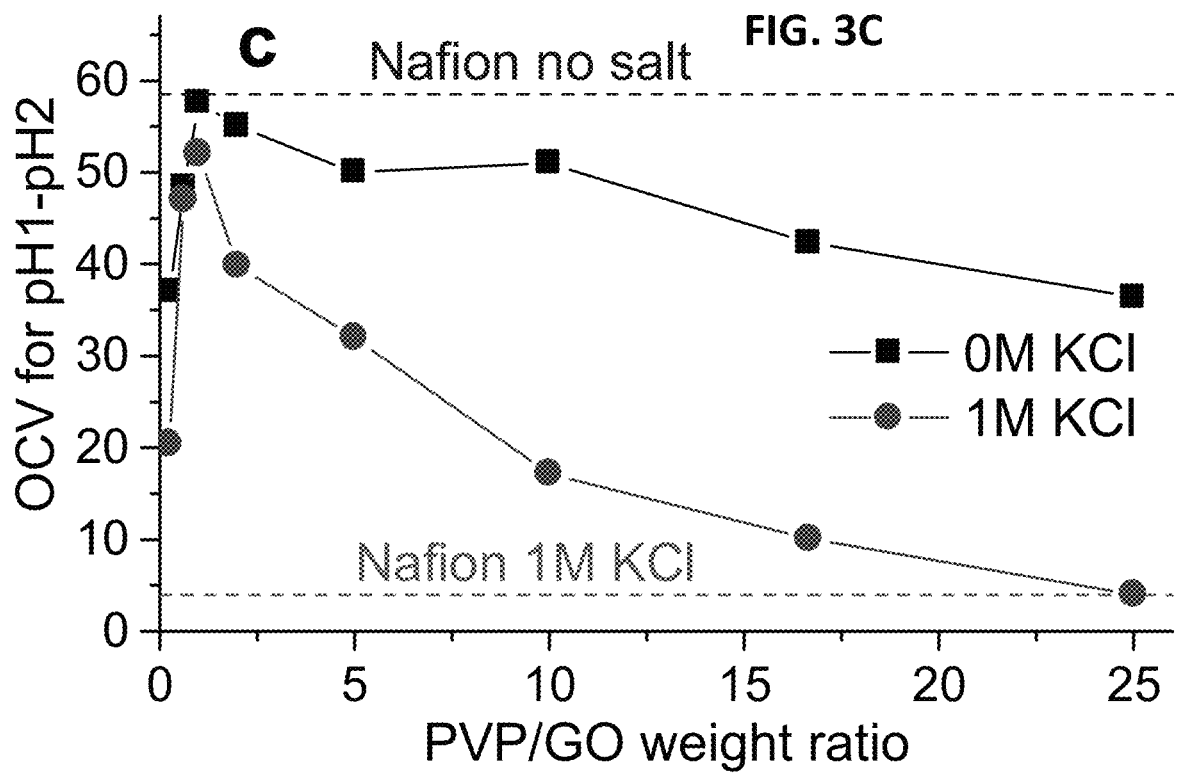
FIG. 3C shows the OCV for r(GO/PVP) membranes and Nafion 117 in pH1/pH2 gradient at 1 M KCl and for no salt solutions at different GO/PVP ratios.

FIG. 3A shows the open circuit voltage (OCV) for the pH1/pH2 gradient for the composite membrane r(0.65 PVP/GO) (MW=3.5 kDa) and Nafion 117 at different concentrations of KCl. The lines correspond to the Goldman-Hodgkin-Katz (GHK) equation with $p_{Cl}$=0 and $p_K/p_H$ as shown. In FIG. 3A the OCV for pH1/pH2 gradient in Nafion the OCV equals 59 mV, in agreement with Nafion being a cation exchange membrane, i.e., $p_C/p_H$=0. The OCV drops to 6 mV upon addition of KCl salt to both sides in the same amount of 1 M KCl, because Nafion does not reject $K^+$. From the concentration dependence it can be estimated that $p_K/p_H$~0.4 for Nafion. The analogous plot for r(GO/PVP) membrane shows very weak dependence on the amount of KCl salt instead, corresponding to $p_K/p_H$~0.004. For other salts the OCV stays at 59 mV independent of salt concentration, as summarized in FIG. 3B for various ions in a form of OCV at 1M of salt vs hydrated diameters of their cations. $K^+$ has the lowest hydrated diameter and all (larger) ions have 100% rejection. Thus, not only $Na^+$, $Li^+$, and $Ca^{2+}$ are totally rejected but different forms of vanadium ions, which are even larger, are rejected as well. These OCV values remained unchanged after keeping membranes in these solutions for weeks.

Figure 19:
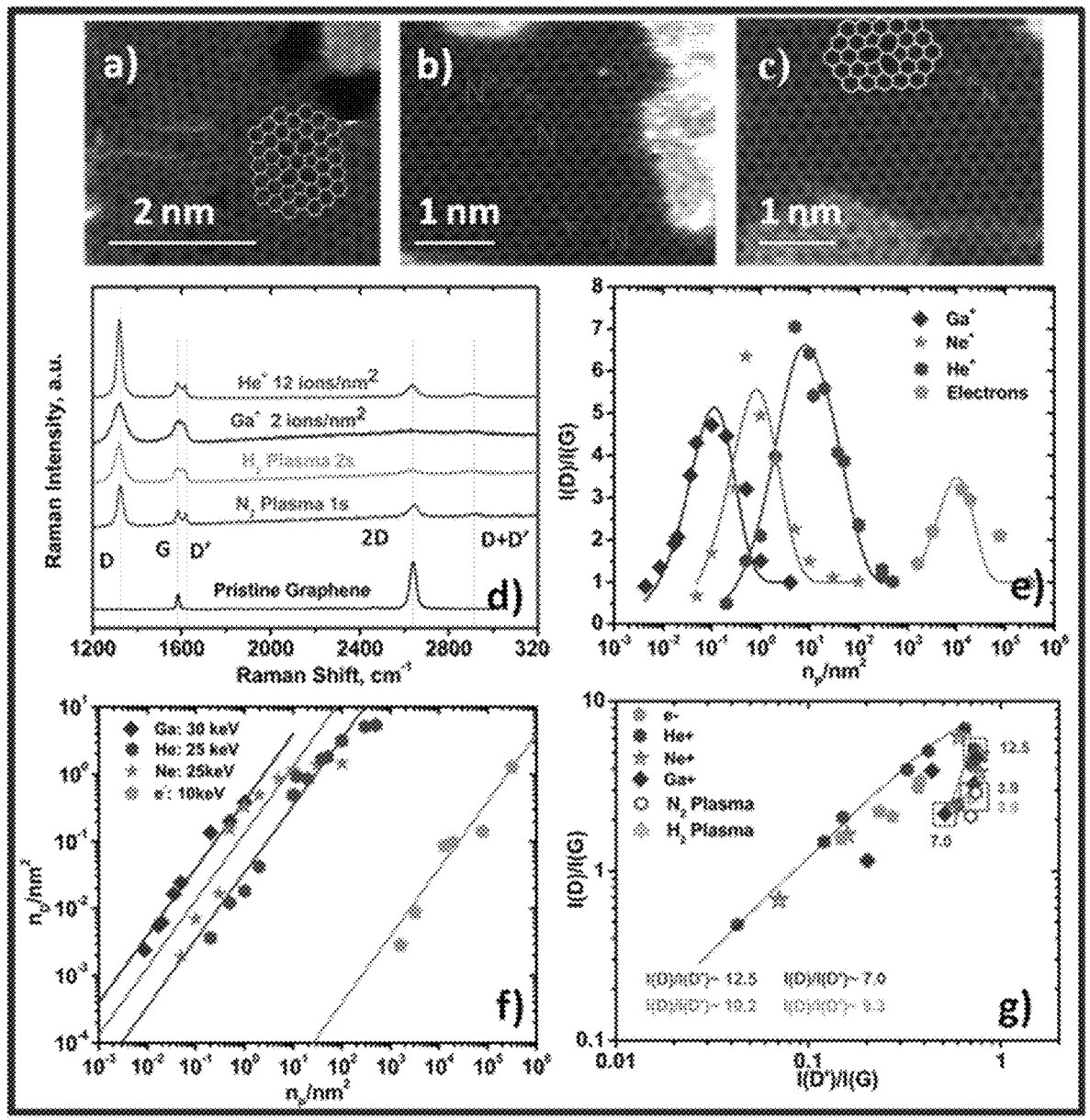
FIG. 19 shows high resolution ADF-STEM images of $N_2$ plasma treated graphene membranes (a, b, c), Raman spectra of pristine and treated graphene membranes (d), variation of the I(D)/I(G) ratio with the irradiation dose (particles per nm$^2$, $n_p$) for different sources; the numerically fitted lines (e), and f) calculated density of the defects, $n_D$; the lines represent the $n_D$=$bn_p$ dependences with b=0.6, 0.3, 0.05, and 5×10$^{-6}$, respectively; the plot of I(D)/I(G) vs I(D')/I(G) is shown in (g).

Alternatively to GHK analysis, proton selectivity can be demonstrated by measuring crossover of species of interest and/or ionic current across membrane at different pHs in the mixed electrolyte, for example KCl and HCl, and compare to the conductance in pure HCl electrolyte. For example, FIG. 19, frame (a) compiles data for areal conductance at pH2 and pH1 and the ionic conductance ratios for graphene membranes treated with different types of irradiation. The conductance for all treated membranes increased compared to the pristine graphene signifying the positive effect of the defects. It is hard to normalize to the same number of defects but $H_2$ plasma treated samples show the highest areal conductance in comparison to other treatments, which is especially clear for pH2.

The solution conductance is the sum of the products of the concentrations (activities) of ions, $[H^+]$, $[K^+]$, and $[Cl^-]$, by their corresponding mobilities, $\mu_H$, $\mu_K$, and $\mu_{Cl}$:

$$\sigma = [H^+]\mu_H + [K^+]\mu_K + [Cl^-]\mu_{Cl} \approx 10^{-pH}\mu_H + [K^+]\mu_K + [Cl^-]\mu_{Cl} \quad (2)$$

Figure 16B:
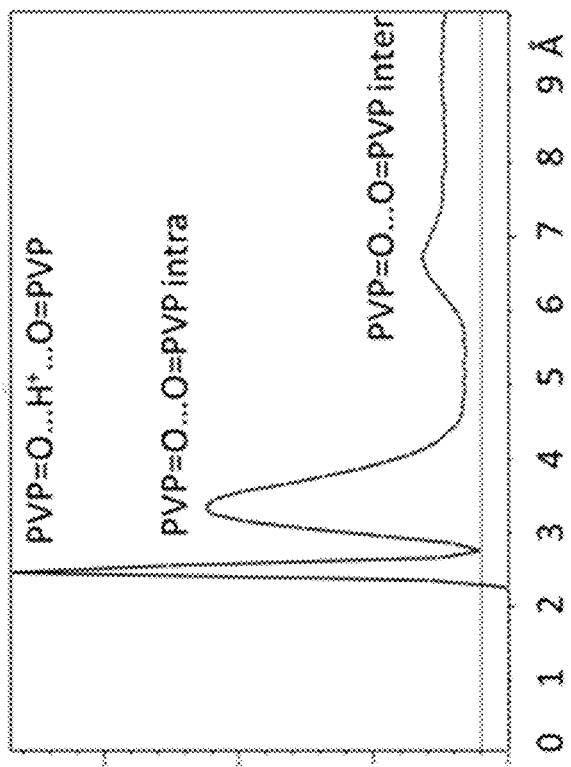
FIG. 16B shows the distribution of distances between oxygen atoms of PVP (intra- and inter-molecular) in the same assembly at 0.5 atm.
Figure 16A:
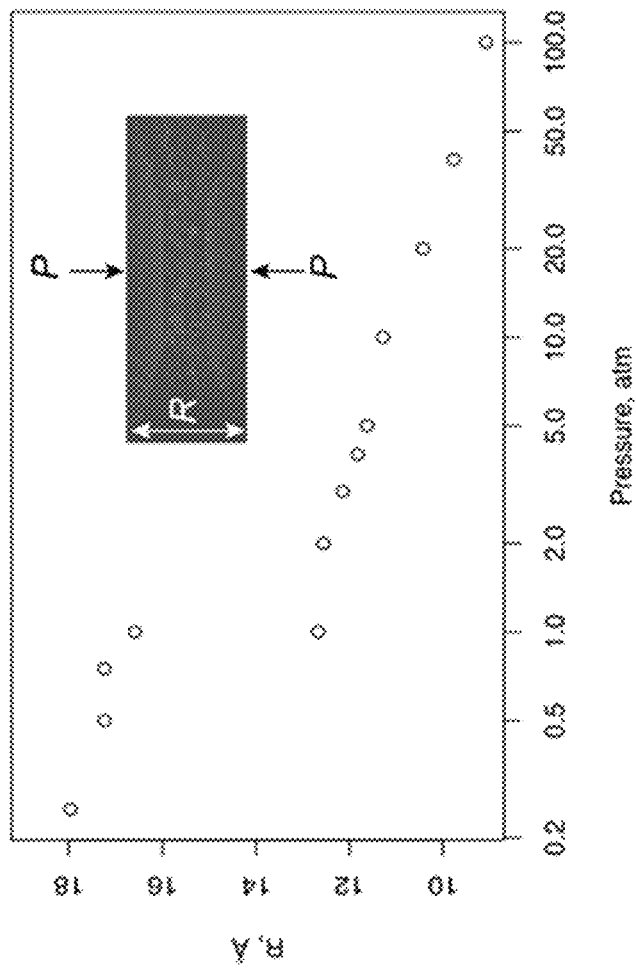
FIG. 16A shows the results of Molecular Dynamics simulations the distance between the graphene sheets as a function of pressure for the composition water:triiodide:pvp:graphene=20%:40%:110%:100% by mass.

The mobilities of $K^+$ and $Cl^-$ are approximately equal, $\sim 8 \cdot 10^{-8}$ m$^2$V$^{-1}$s$^{-1}$, while that of protons is ca. 4.8 times greater. At high pH, hydronium ion concentration has to be replaced by that of hydroxide for which the mobility is 2.7 times greater than that of $K^+$ and $Cl^-$. Thus, at pH2 conductance of solution increases by a factor of 8.3 from 0.1 M KCl to 1.0 M KCl and only by a factor of 3.6 for pH1. Such ratios would be expected for a totally nonselective membrane. Similarly, the ratios for cation selective membranes, like Nafion ($\mu_{Cl}$~0), are 7.1 and 2.6, respectively. Obviously, in the case of a perfect proton conductive membrane ($\mu_{Cl}$~0, $\mu_K$~0) the ratio would be unity for all pH. The horizontal solid and dashed lines in FIG. 19, frame (b) represent such calculated ratios for two electrolytes, at pH2 and pH1. The ionic conductance ratio for the samples is compared in FIG. 19, frame (b) to those expected for different types of selectivity identified by the horizontal lines. Treatment with the light $He^+$ ions and $H_2$ plasma show the best results—not only increased ionic conductance but improved proton selectivity as well. $He^+$ is the best of them, at least when judged by the lowest ionic conductance ratio of ~1.8 at pH2. The heaviest ion, $Ga^+$ treatment shows the highest ionic conductance ratio among the irradiated samples, ~6 at pH2 and ~2.8 at pH1, close to that of untreated graphene, but with higher conductance, suggesting a similar type of nonselective defects but in greater amount. Since the number of defects upon irradiation increased by at least two orders of magnitude, it also means that not all defects are effective in increasing the conductance. Plasma treatment is a convenient method of defect introduction and both $N_2$ and $H_2$ plasma treated samples exhibit small electrolyte dependence with the ionic conductance ratio below 3 at pH2 and enhanced conductance. Nitrogen plasma likely produces variety of defects, as illustrated by FIG. 16A-FIG. 16C, but hydrogen plasma is believed to produce mostly sp3 defects via hydrogen atom coupling to produce C—H bonds. Other plasmas, including oxygen, can likely be tuned to enhance proton conductance through graphene also. The ion-beam treated samples show poorer mechanical stability in comparison to the plasma treated graphene, which further raises appeal to makes the plasma treatment as more appealing approach that ion bombardment.

The performance of rGO composites as proton selective membranes depends on their compositions (given by the ratio of GO/polymer before reduction), the quality of GO, the type and molecular weight (MW) of the polymer, and the reducing conditions. When polyvinylpyrrolidone (PVP) is used as the polymer and HI is used as the reducing reagent, the optimum ratio for the best proton selectivity is PVP/GO~1 (see FIG. 3C). It roughly corresponds to a 'monolayer' of PVP in between two rGO layers. The proton conductance proceeds in both directions, along the rGO layers and perpendicular to them through defects. Such a pseudo monolayer structure facilitates proton movement along the rGO layers and allows effective rejection of other than proton ions. The drop of OCV with increasing PVP content happens for both the zero salt and the high salt concentrations. It means that the rejection is lost not only to cations but to anions as well. With increasing PVP content, the gap between the rGO sheets increases, which causes the membranes to be more fragile, vulnerable to swelling, and to have much less overall selectivity. At high PVP content they are so fragile that rGO is no longer capable of holding them intact and they slowly disintegrate in water. Some of the excess PVP gets washed off during filtration during preparation, which does not occur for the compositions near optimum, in which all of the PVP from the solution ends up in the composite membrane. Lowering the PVP content also causes the proton selectivity to decline, probably due to greater nonuniformity of the effective channels formed in between the resulting rGO. Lowering the PVP content is also accompanied by a drop of proton conductance; eventually purely rGO membrane forms a barrier layer also impenetrable by protons. Note that rGO membranes are conductive via electrons, and r(GO/PVP) membranes with high PVP content are still electron conductive.

Figure 3D:
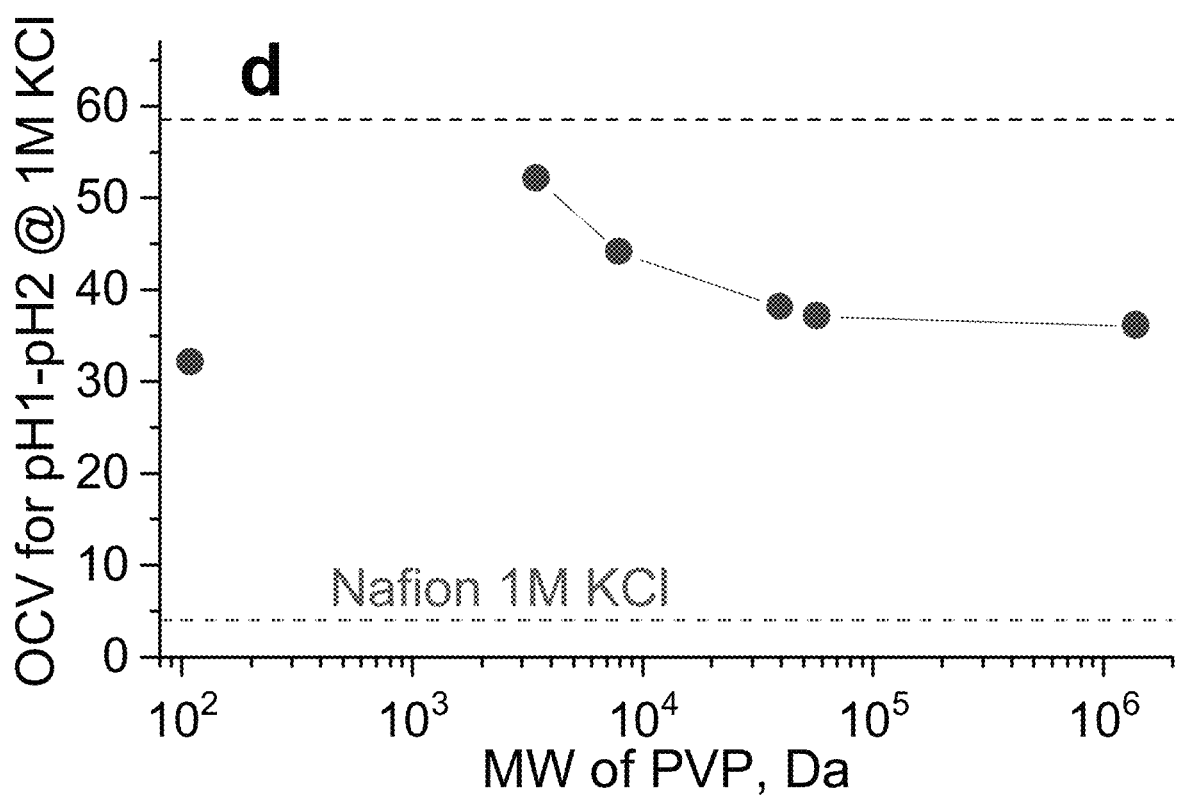
FIG. 3D shows the OCV for pH1/pH2 gradient and 1M KCl solutions for the same thickness and composition of membranes with PVP/GO=0.65 as a function of molecular weights (MW) of PVP.
Figure 4:
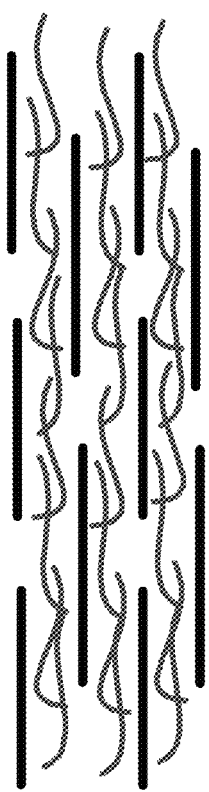
FIG. 4 is an illustration of the effect of PVP (blue) length, short (left) and long (right) on selectivity in composite with rGO (black).
Figure 4:
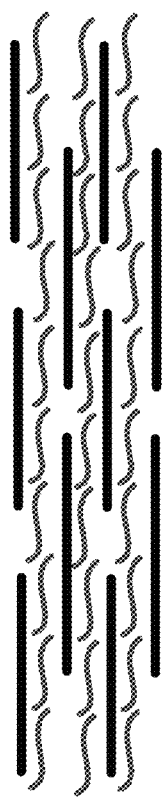

With the ratio PVP/GO=0.65 held constant, varying the molecular weight (MW) of PVP reduces the proton selectivity, as seen in the OCV at 1M KCl in FIG. 3D. Besides the monomer, the lowest MW of PVP available was 3500 Da, which demonstrated the best OCV performance. The adverse effect of increasing MW is similar to that of increasing the fraction of PVP—longer polymer strands have a greater probability to lay on top of each other and disrupt pseudo monomer layer in between rGO sheets, which correlates with the interlayer distance increase with higher MW polymers. Shorter chains of PVP are more effective in packing side by side and thus producing less bulging holes between the rGO layers. This difference is schematically depicted in FIG. 4, which is an illustration of the effect of PVP length on selectivity in composite with rGO. The shorter polymer on the left is neatly packed into a monolayer while the long one on the right has the polymer chains crossing each other and hindering neat packing.

The effect appears to saturate at very high MW, corroborating that explanation. The membranes prepared with high MW PVP also require longer time for drying which probably is also an indication of the longer time required for effective packing. In the extreme case of very short PVP, i.e., its monomer, produces a poorer outcome, likely due to its significant loss during filtration. Thus, there is an optimal range of MW for high OCV values, but other parameters are preferably included for further optimization, such as proton conductance, electrical resistance, and mechanical strength.

Another aspect of the preparation procedure that influences rGO/polymer membrane performance is the way the graphene oxide is reduced. It has been shown that laminates of GO reduced with a reducing agent which did not generate $CO_2$, CO, or $O_2$, e.g., HI, HBr or ascorbic acid, are dense and produce membranes practically impermeable barriers that limit any material flux through them. When used for the composite GO/PVP membranes of the present invention, these three reducing reagents are quite distinct. Ascorbic acid reduction produces membranes that are less dense than those obtained with HBr and HI. Moreover, reduction from HI or HBr solutions is also not as effective as when using their hot vapors. The best outcome is obtained when both sides of the membrane have been exposed to the hot vapors. That scenario is best realized for laminates of GO/PVP that are on porous substrates (membranes) rather than on flat surfaces. When on a porous substrate, not only do the HI vapors have access to both sides but the products of the reduction reaction also can more easily exit the composite membrane. The duration of the reduction step is also important but, as Table 1 illustrates, even after 2 hours under the typical conditions with an 11 μm effective thickness of the membrane, the performance, at least from the OCV side, is almost at the maximum. A 24 hour duration was chosen as the standard treatment as no detectable change after additional treatment was observed.

Unlike the membrane density/compactness, which is very similar for HI and HBr, the performance is different between the two reducing reagents. Because effective proton conductance through a macroscopic layer requires acidic groups between which protons can jump without hindrance, formation and stabilization by polymer of such acidic groups in the composite is important. Halides reduce GO and, as a result, get oxidized themselves to halogens. Some gets washed off but some remains in the form of trihalide (triiodide or tribromide) or longer polyhalogen ions. Hydrogen iodide is a stronger acid (pKa=−10) than hydrogen bromide (pKa=−9) and can form triiodide more readily than tribromide. The higher acidity of hydrogen iodide/triiodide and of its larger chains compared to that of bromide apparently makes the difference, as the former does not bind protons very tightly and promotes its easy movement by hopping. As seen from Table 1, HBr reduced GO/PVP serves as a good cation exchange membrane —OCV at zero salt is close to the theoretical, but it precipitously declines at 1 M KCl to just 15 mV, which is still significantly higher than Nafion OCV values.

TABLE 1

OCV* data for pH1/pH2 gradient for different composite membrane formulations

| Membrane composition and preparation method | Zero salt (mV) | 1M KCl (mV) |
|---|---|---|
| Membranes reduced by HI vapor | | |
| GO + HI 24 h, rGO | 39 | 6 |
| PVP/GO = 1 + HI 2 h | 56 | 46 |
| PVP/GO = 1 + HI 24 h, r(PVP/GO) | 59 | 52 |
| PVP/GO = 1 + HI 48 h | 59 | 52 |
| MVP/GO = 1 + HI 24 h | 56 | 32 |
| CL/GO = 1 + HI 24 h | 58 | 38 |
| NMCL/GO = 1 + HI 24 h | 58 | 39 |
| PVA/GO = 1 + HI 24 h | 56 | 24 |
| PAA/GO** = 1 + HI 24 h | 35 | 5 |
| SDBS/GO = 1 + HI 24 h | 33 | 5 |
| PEG/GO = 1 + HI 24 h | 34 | 5 |
| PVPY/GO = 1 + HI 24 h | 34 | 5 |
| SDS/GO = 1 + HI 24 h | 39 | 6 |
| Other types of membranes | | |
| PVP/GO = 1 + HBr 24 h | 56 | 15 |
| A small open pore | 35 | 4 |
| GO | 33 | 5 |
| Nafion 212 | 59 | 5 |
| Nafion 117 | 59 | 4 |

PVP = polyvinylpyrrolidone, MVP = (mono) vinylpyrrolidone, CL = ε-caprolactam, NMCL = N-methyl caprolactam, PVA = poly vinyl alcohol, PAA = polyamyl amide, SDBS = sodium dodecyl benzene sulfonate, SDS = sodium dodecyl sulfate, PVPY = Poly-4-vinyl pyridine, GO = unreduced graphene oxide
*all values are given with the accuracy ca. 1 mV
**the membrane is not uniform and fragile Iodine/triiodide can readily coordinate onto PVP, but there are some other molecules and polymers such as CL (caprolactam), NMCL (N-methyl caprolactam), and PVA (polyvinyl alcohol) where such coordination is also plausible and has been reported. Table 1 illustrates that the OCV for similarly prepared r(GO/CL), r(GO/NMCL), and r(GO/PVA) composites not only are close to the theoretical value at zero salt, but also quite decent (38, 39, and 24 mV respectively) at 1 M KCl. This is in drastic contrast to other polymers which do not coordinate triiodide well, such as SDS, SDBS, PEG, and PVPY, despite an outstanding quality (in terms of density) of such membranes. Their OCV values in Table 1 are similar to those of GO or rGO, and not much different from what is observed for an open hole, i.e., a nonselective membrane. Films with polyacrylamide (PAA), for some reason, cannot be made uniform and their poor quality is likely the reason of inferior performance.

Figure 1B:
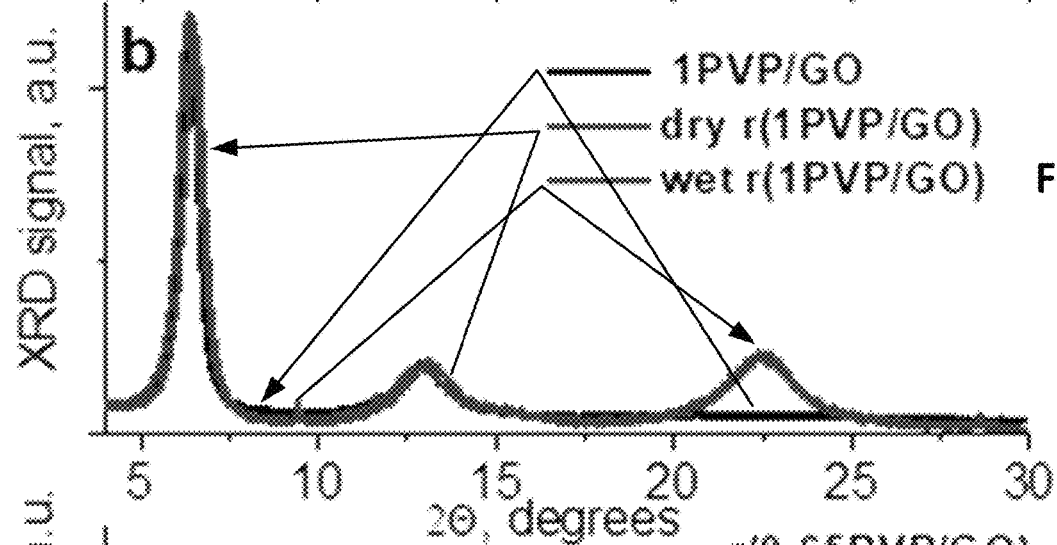
FIG. 1B shows XRD patterns for a composite prepared from (1PVP/GO), where the polyvinylpyrrolidone (PVP) has a molecular weight MW=3500, and after reduction with HI vapor, r(1PVP/GO).
Figure 1C:
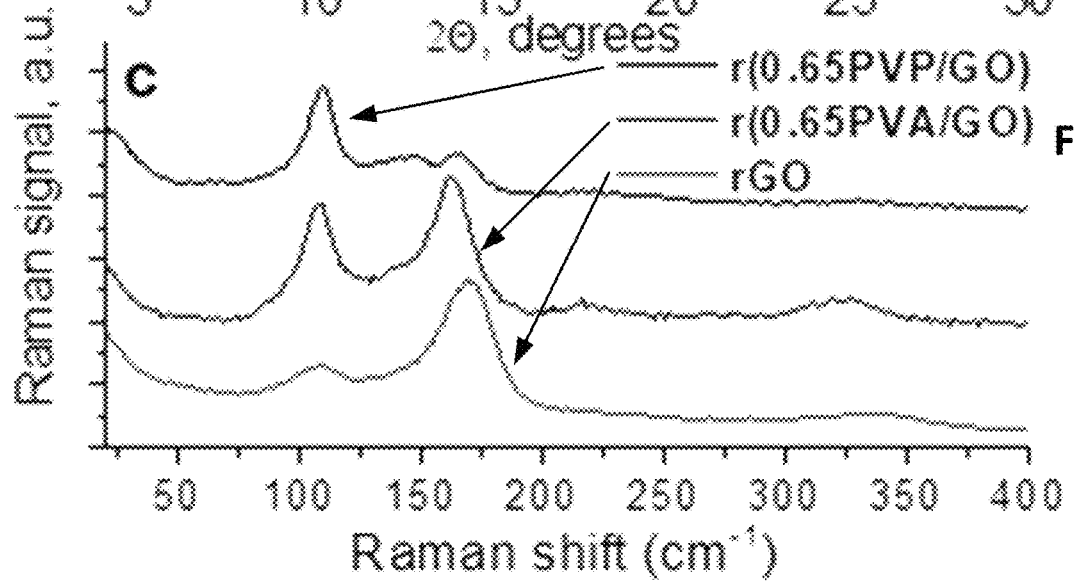
FIG. 1C shows Raman spectra of different composite films: rGO, r(0.65 PVA/GO), and r(0.65 PVP/GO), in the low frequency region with 532 nm excitation, with all samples reduced in HI vapor.
Figure 1D:
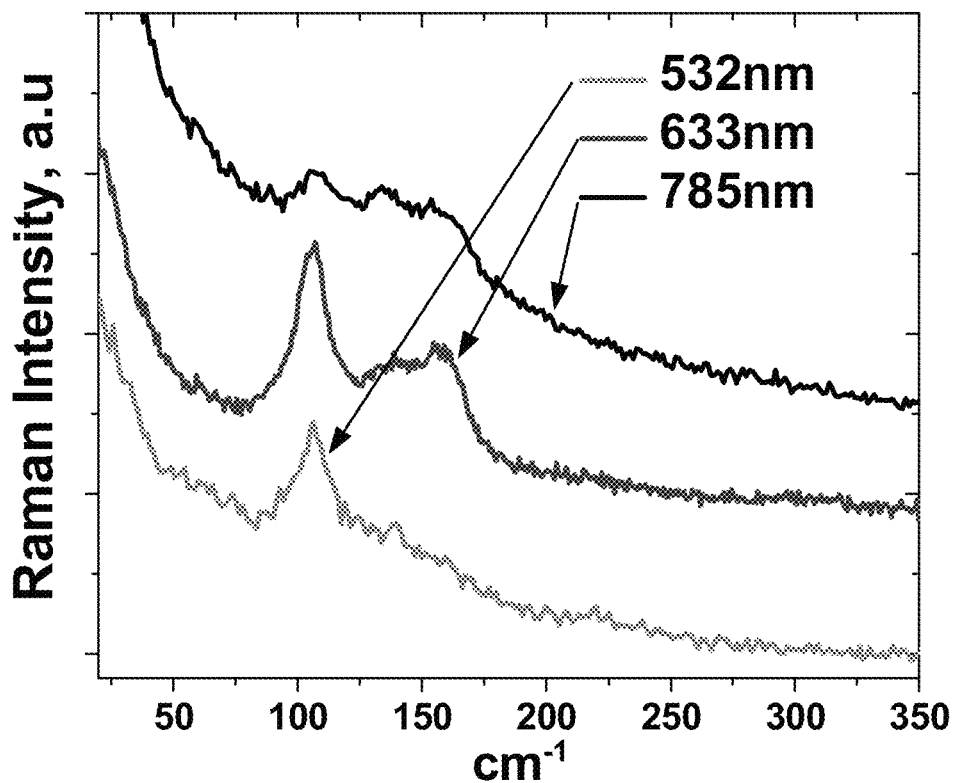
FIG. 1D shows Raman spectra of r(0.651.6 PVP/GOGO/PVP) in the low frequency region with different excitation energies.
Figure 1E:
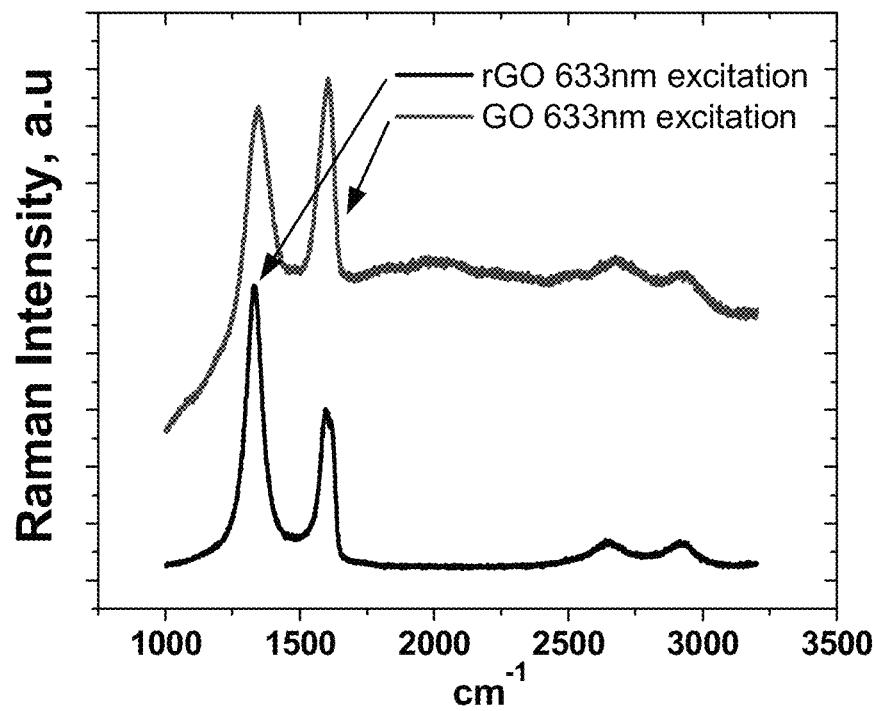
FIG. 1E shows Raman spectra in the 1000-3200 $cm^1$ range for a GO membrane before and after reduction.
Figure 1F:
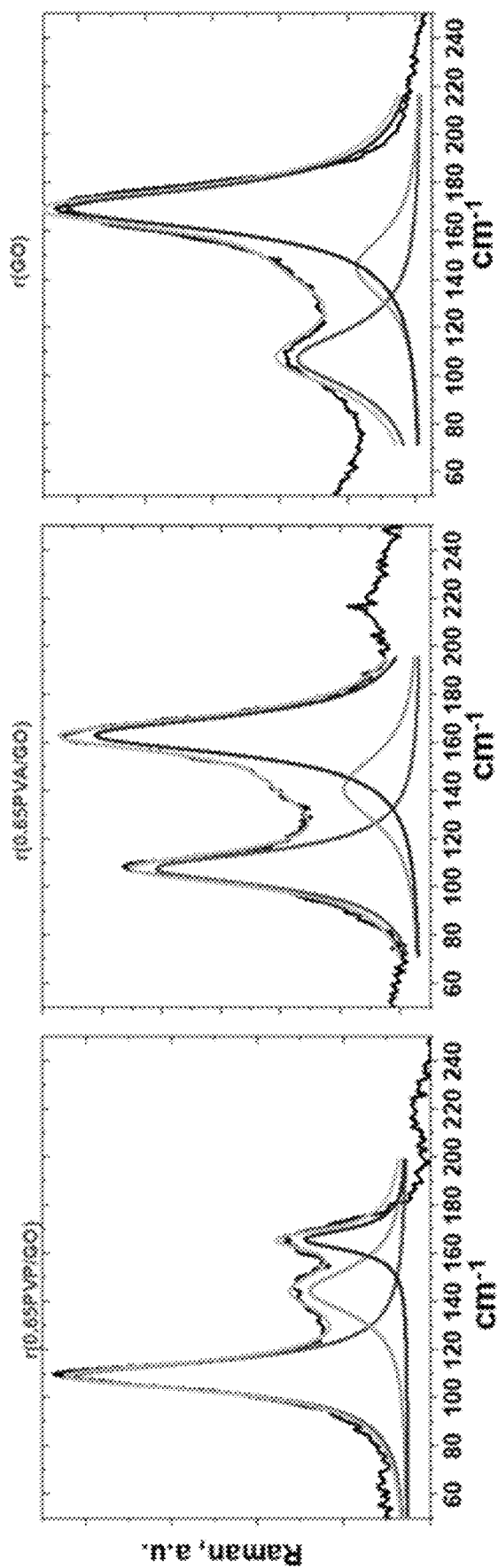
FIG. 1F shows Deconvolution of Raman spectra of different composite films from FIG. 1D: rGO, r(0.65PVA/GO), and r(0.65 PVP/GO) in the low frequency region with 532 nm excitation.

Triiodide can be detected by its characteristic Raman signal at 110 cm$^{-1}$ (as opposed to the $I_2$ signal at 170 cm$^{-1}$), and by XPS (see FIGS. 12A-12C). FIGS. 1C-1E show Raman spectra of different samples reduced with HI, where different intensities of these peaks can be clearly seen for them. It is known that solid $I_2$ [d (I-I)=2.715 A] shows a peak near 180 cm$^{-1}$ which moves towards lower frequencies when $I_2$ interacts with donors to form charge-transfer (CT) complexes. The Raman peak at 110 cm$^{-1}$ is assigned to the active symmetrical stretching in $I_3^-$, while the peak at 145 cm$^{-1}$ is attributed either to the outer I-I stretching in a bent $I_5^-$ or asymmetric $I_3^-$, or Fermi resonance between $v_1$ and $2v_2$ in symmetrical $I_3^-$, i.e., both $I_3^-$ and/or $I_5^-$ species can contribute to it. There is a correlation between the 110 and 170 cm$^{-1}$ ($I_3^-/I_2$) peak ratio and the proton selectivity of the composite. Indeed, this ratio is the highest (3.2) for r(GO/PVP) and decreases to 0.8 and 0.35 for r(GO/PVA) and rGO, respectively; see the deconvolutions in FIG. 1F using three bands: ~110 cm$^{-1}$ ($I_3^-$, red), ~145 cm$^{-1}$, ($I_3^-/I_5^-$, green) and ~170 cm$^{-1}$ ($I_2$, blue). A similar trend is observed for $I_{3/5}^-/I_2$ ratio (intensities of the 145 and 170 cm$^{-1}$ peaks) which declines in the order 1.05, 0.23, and 0.18 for r(GO/PVP), r(GO/PVA) and rGO, respectively. Increasing the excitation wavelength results in a lower $I_3^-/I_2$ peak ratio, which correlates with $I_2$ having absorption maximum at the longer wavelength (~500 nm), as compared to $I_3^-$ and $I_5^-$ species.

The main features in the Raman spectra of GO and rGO are the so-called G and D peaks, which are at about 1560 and 1360 cm$^{-1}$, respectively. The ratio of $I_D/I_G$ gives the information about the average distance between the defects. For example, the r(GO/PVP) sample shows $I_D/I_G$~1.8 for 633 nm excitation corresponding to the average distance of about 2 nm between the defects, and the density of these defects decreases upon reduction but remains high. The type of such defects cannot be recovered from the Raman spectra directly and thus their role in proton conductance is not obvious. The contribution to the overall proton conductance from such defects is likely significant as the proton selectivity declines upon decreasing the size of GO sheets with rigorous ultrasound treatment.

XPS spectra (FIG. 12A) confirm the presence of C, O, N, and I in the composite membranes and both, $I_2$ (at ~620.5 eV) and $I_3^-$ (at 618.7), are detected (FIG. 12C) in agreement with Raman assessment. The TGA analysis (see below) for GO/PVP and r(GO/PVP) membranes also confirm a strong binding of iodine with the amount close to that of PVP.

Amides (PVP, MP, CL, NMCL) and alcohols (PVA) are useful in their ability to accept and hold protons. This is usually associated with the pKa of an appropriate acid. The aqueous values for amides (proton sits on carbonyl) is pKa(amide)=−0.5-1, for an alcohol pKa(alcohol)=−2, and for ethers pKa(ether)=−3.5. Even though the pKa value of HI (and $HI_3$) is much lower in water, in the environment of lower polarity in the polymer squeezed between the rGO sheets it dramatically increases because the ionic pair H$^+$/I$^-$ (H$^+$/$I_3^-$) does not solvate as well in a low polarity solvent. Table 2 illustrates it through calculations.

TABLE 2

Computed pKa shifts (relative to the pKa of H$^+$[N-Ethyl-2-pyrrolidone]) of various acids [PBE0/def2-SVP, SMD solvation model]

| Acid | Benzene $\varepsilon$ = 2.3 | DCM[b] $\varepsilon$ = 8.9 | Acetone $\varepsilon$ = 20.5 | MeCN $\varepsilon$ = 35.6 | Water $\varepsilon$ = 78.4 | Exp (water) |
|---|---|---|---|---|---|---|
| H$^+$[acetone][a] | −10.8 | −7.6 | −8.0 | −7.7 | −5.1 | |
| H$^+$[methylacetate][a] | −13.6 | −10.2 | −11.5 | −10.1 | −7.4 | |
| H$^+$[2-pyrrolidone][a] | −1.5 | −0.6 | −0.6 | −0.5 | −0.1 | |
| H$^+$[acetamide-N-dimethyl][a] | −0.4 | 1.5 | 1.2 | 1.2 | 1.5 | |
| H$^+$[acetamide-N-methyl][a] | −0.7 | 0.9 | 0.8 | 0.7 | 0.5 | |
| H$^+$[acetamide-NH$_2$][a] | −1.7 | −0.7 | 0.2 | 0.5 | 0.2 | |
| H$^+$[N-methyl-caprolactam][a] | 0.9 | 1.0 | 1.1 | 1.2 | 1.6 | |
| H$^+$[caprolactam][a] | 0.4 | 0.7 | 0.8 | 0.8 | 1.1 | |
| H$^+$[(H$_2$O)$_1$] | −24.6 | −15.4 | −16.6 | −14.7 | −5.9 | −1.7 |
| HI$_3$ | 12.8 | −5.9 | −12.0 | −12.4 | −13.1 | |
| HBr$_3$ | 20.9 | −1.8 | −5.5 | −7.1 | −7.8 | |
| HI | 28.8 | 0.7 | −4.1 | −6.1 | −7.1 | −10 |
| HBr | 45.0 | 19.4 | 15.0 | 13.1 | 12.5 | −9 |

[a]Proton was placed on the carbonyl oxygen atom
[b]Dichloromethane

The same Table confirms that dissociation of C=O . . . H$^+$ and C—OH . . . H$^+$ is less sensitive to solvent polarity, as is expected for the proton transfer reactions, In such a scenario, pKa values of HI$_3$ and C=O . . . H$^+$ (or C—OH . . . H$^+$) can become quite close but still likely with preferential proton transfer from HI$_3$ to C=O. The greater acidity of protonated alcohol should cause the equilibrium shift from its protonated form and thus less proton conductance and/or selectivity. Even more pronounced is that shift with ethers, where the protonation of ether becomes doubtful. Switching from HI to HBr with lower pKa has a similar effect.

The role of water in the proton transfer here is not well defined but its amphoteric character should be helpful, especially when the acidic (C=O) groups have interruptions in short spaced continuous chains. Its pKa (H$_3$O$^+$)=−1.7 value is very close to that of protonated amide, which makes the exchange between them not accompanied by a significant barrier.

Figure 17A:
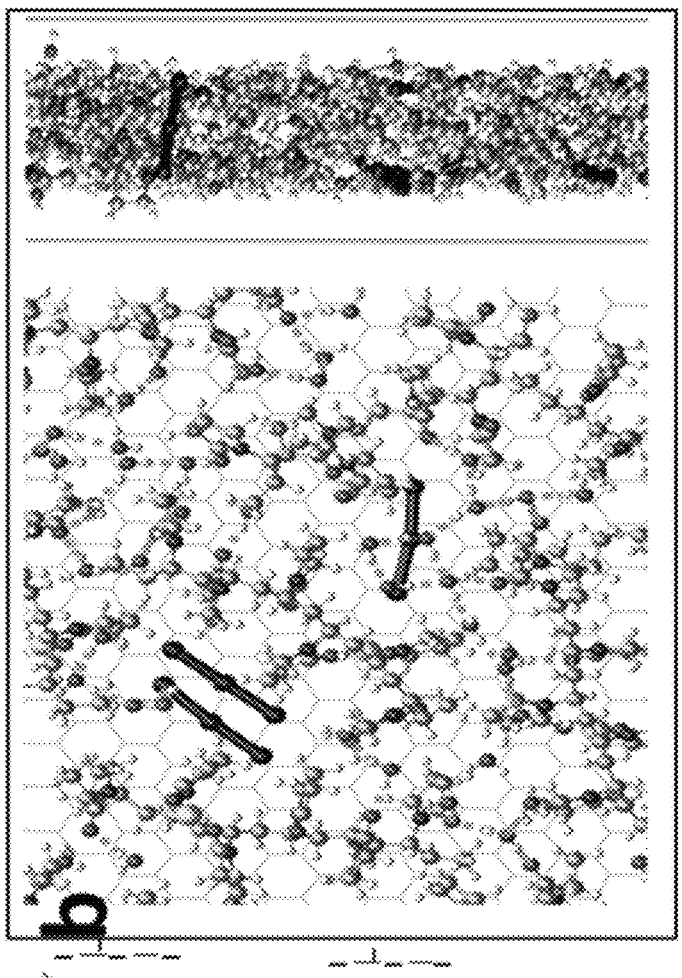
FIG. 17A is an illustration of a possible structure for proton wires in $PVP/HI_3$ complexes where a hydrogen bonded proton is shared between carbonyls of opposite chains of PVP.

With typical methodology used in designing selective membranes, all of the components are assembled separately and cast to produce a film of desired dimensions. For example, in PFSA sulfonic groups are attached to a perfluorinated polymer backbone and the membrane is produced from this material. In contrast, in embodiments of the present invention, the components (GO and PVP) are assembled from an aqueous solution and transformed into the resulting film (by reducing the GO and adding triiodes) to achieve the necessary properties. Solubility of a polymer in water is not a requirement as other solvents, where GO and the polymer can be chosen. PVP can form complexes with $HI_3$ in the stoichiometry of $2PVP:1HI_3$, which is accompanied by disappearance of the carbonyl signal of PVP in FTIR (at ~1660 $cm^{-1}$) and appearance of a broad peak at ~760 $cm^{-1}$; this can be assigned to the =O . . . H . . . O= functionality, as shown in FIG. 17A. There is a decline of the carbonyl signal after reduction in r(GO/PVP) by close to a factor of 2 (FIGS. 11A-11D), but there is no absorbance at 760 $cm^{-1}$ because there is actually a strong decline of the optical density at lower frequencies. Reduction of GO produces metallic looking film of rGO with such a dramatically greater optical density that transmittance is essentially zero and not shown in FIGS. 11A-11D.

Based on the XPS and FTIR data it is likely that the r(GO/PVP) film has $nPVP:HI_3$ stoichiometry with n close to n=3-4 and the proton wire confined between closely packed carbonyl groups of PVP. It prevents other species except for protons to move thorough that confinement via a Grotthuss-like mechanism. Some of that motion may proceed in between the rGO sheets, while some may comprise perpendicular motion through the defects in rGO, possibly in comparable amounts.

Figure 9:
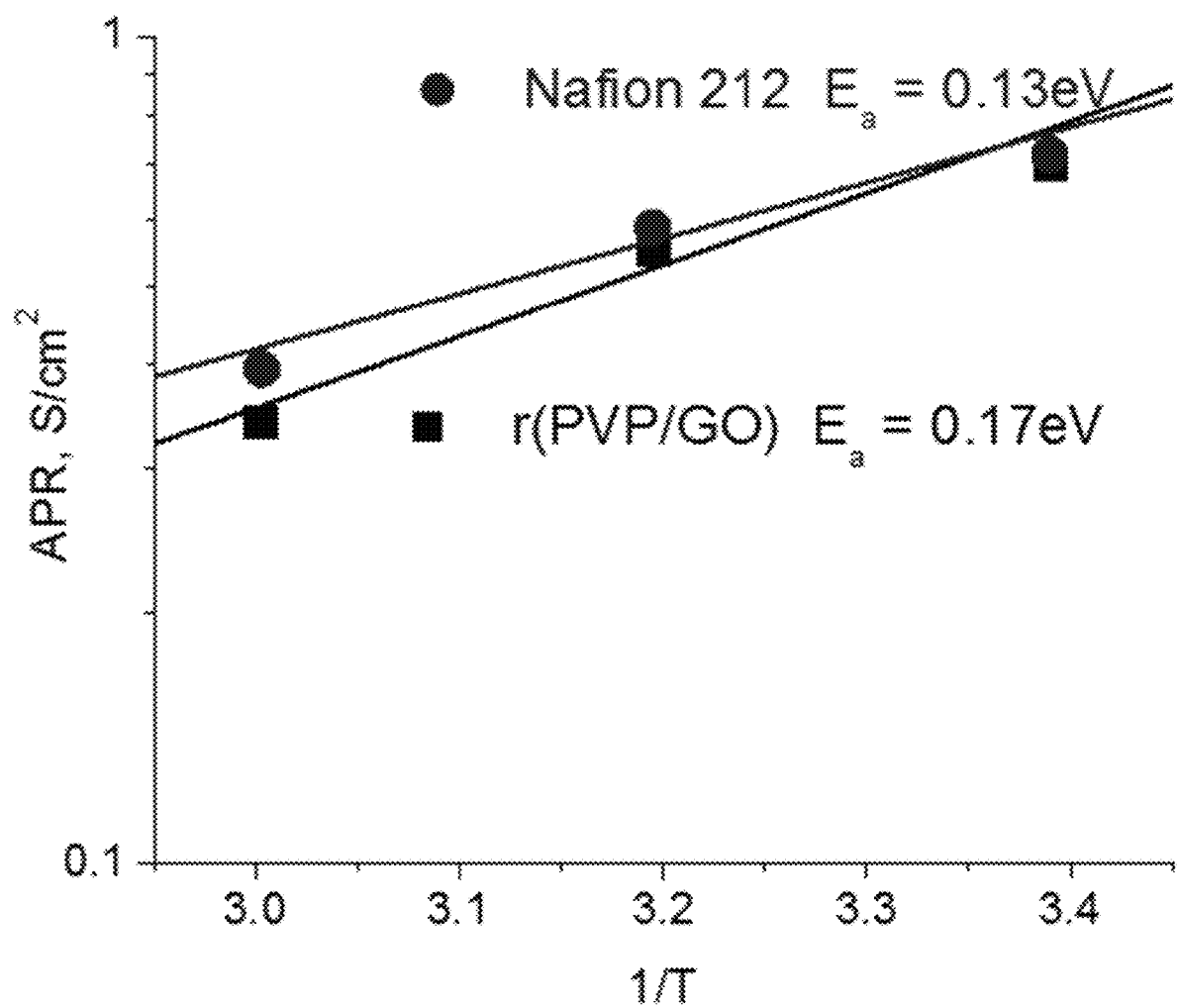
FIG. 9: Temperature dependence of APR (area proton resistance) in 1.5M $VOSO_4$+3M $H_2SO_4$ electrolyte measured at 100 kHz for Nafion 212 and r(PVP/GO).
Figure 17B:
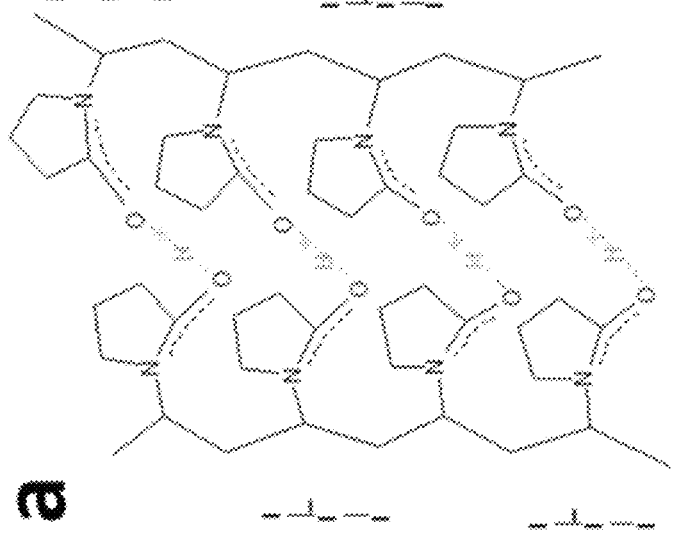
FIG. 17B shows top and side views of the ensemble resulting from a 100 ns molecular dynamics (MD) simulation
Figure 17C:
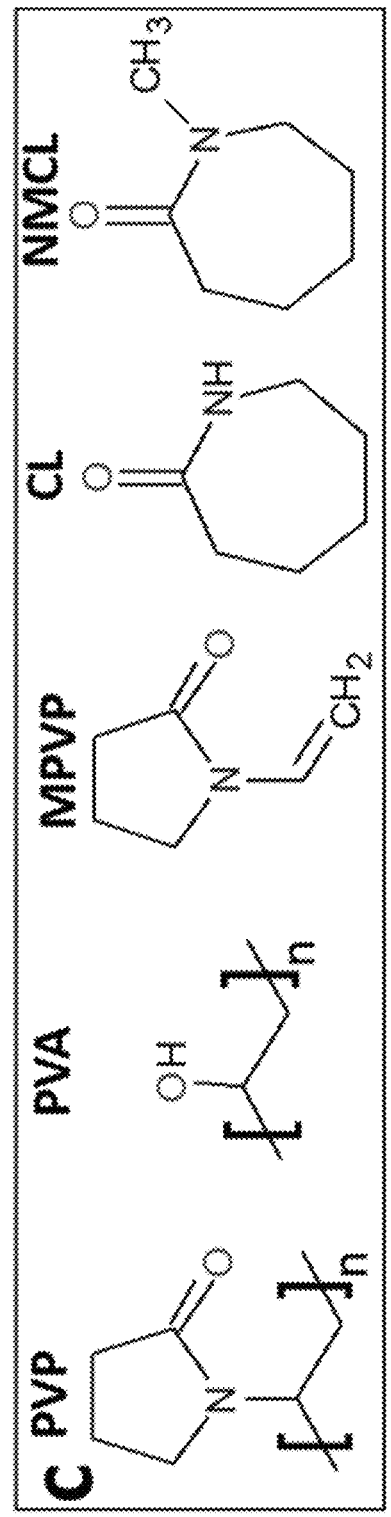
FIG. 17C shows the chemical structure of molecules and polymers that show significant proton selectivity. PVP=polyvinylpyrrolidone, MVP=(mono) vinylpyrrolidone, CL=F-caprolactam, NMCL=N-methyl caprolactam, and PVA=poly vinyl alcohol.

FIGS. 17A-17C illustrate how all these features come together in molecular mechanics modeling of the system containing protonated PVP, triiodide ions, and water molecules sandwiched by two graphene sheets. The molecular dynamics simulations demonstrate that under atmospheric pressure, PVP forms a monolayer in which pyrrolidone fragments have strong tendency to be oriented perpendicularly to the graphene sheets. The adjacent pairs of pyrrolidones in such assembly can cooperatively stabilize protons via C=O . . . $H^+$ . . . O=C bonds while triiodide ions are spatially separated from the protons. Interestingly, water molecules showed extended chains of hydrogen bonds that might be beneficial for proton transfer by the Grotthus mechanism. Without this residual water, the activation barrier for proton transfer might be much higher than the experimentally observed ~0.17 eV, which is only moderately higher than that of Nafion (FIG. 9).

Figure 5A:
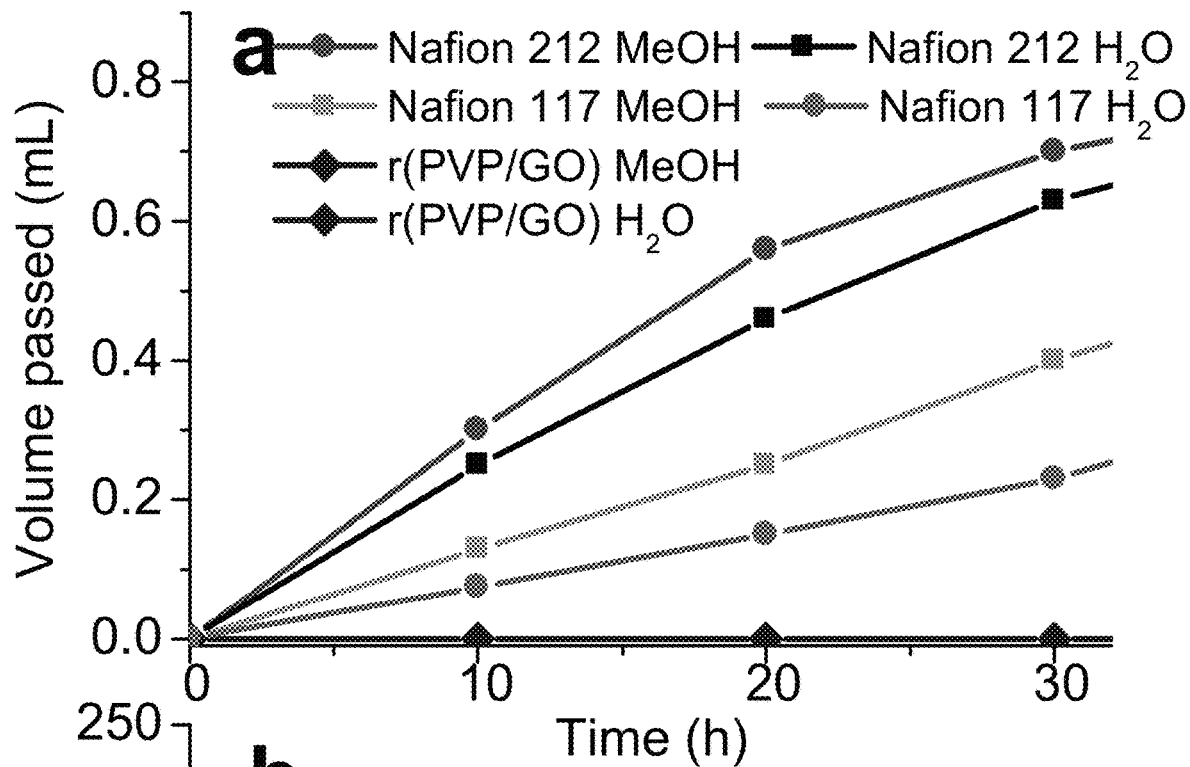
FIG. 5A shows crossover of MeOH from a 50/50 aqueous solution into water through 0.3 cm$^2$ of Nafion 212, Nafion 117, and r(GO/PVP) membranes.
Figure 5B:
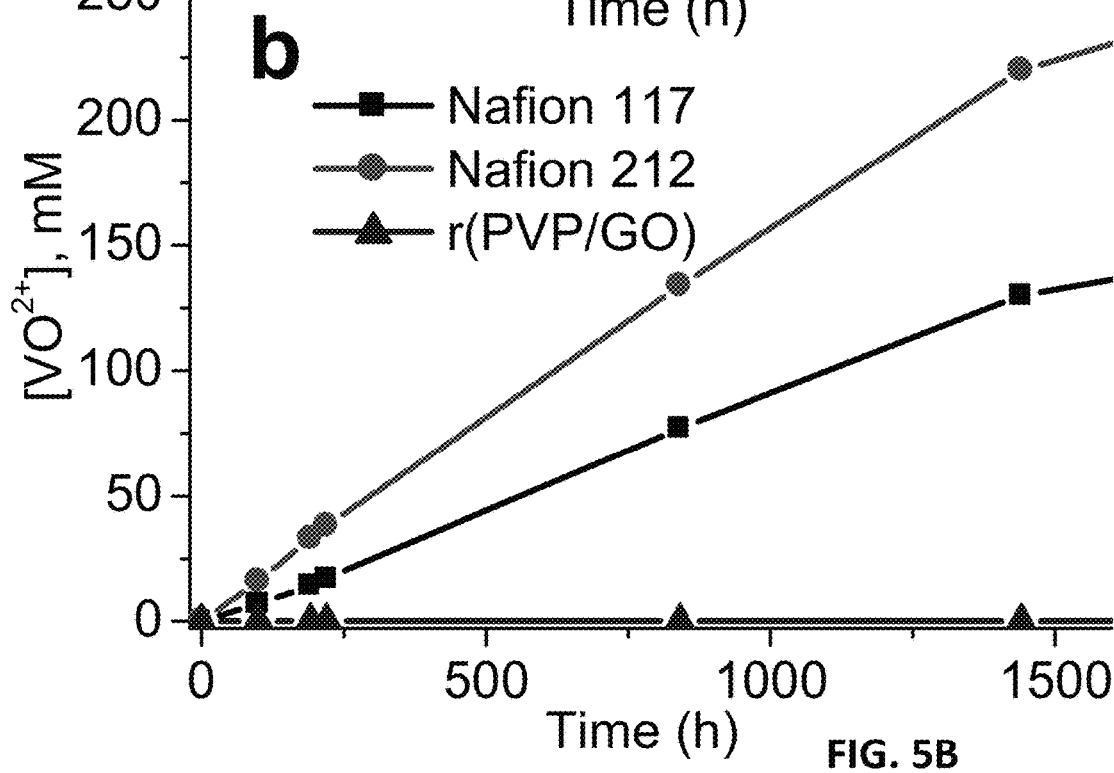
FIG. 5B shows crossover of $VO^{2+}$ through 0.3 cm$^2$ of Nafion 212, Nafion 117, and r(GO/PVP) membranes between isotonic solutions of 1.5M $VOSO_4$+3M $H_2SO_4$ and 1.5M $MgSO_4$+3M $H_2SO_4$.
Figure 30:
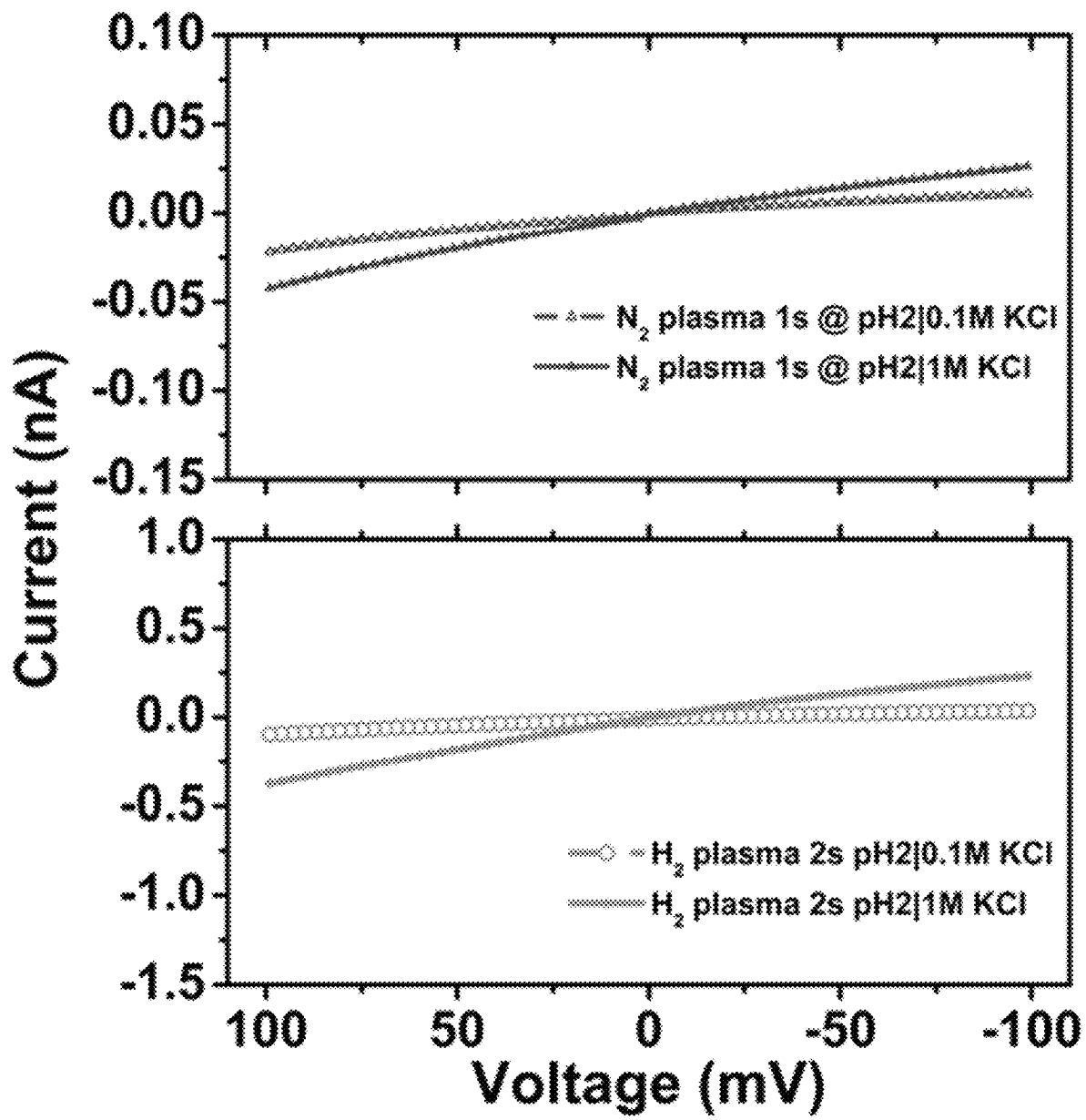
FIG. 30 shows I-V plots for graphene membranes (2.5 μm diameter) treated by plasma ($N_2$ and $H_2$).

The lack of permeation (typically referred to as crossover) of other species in r(PVP/GO) membranes is shown in FIGS. 5A-5B, while CVD graphene membranes demonstrate similar outcome. The permeability of vanadium ions in a vanadium flow battery (VFB) with current state of the art PFSA membranes requires engineered solutions for crossover mitigation increasing overall cost and lowering battery efficiency. Other types of flow batteries with nonsymmetrical electrolytes suffer even more from ion crossover. Minimization of methanol crossover vital for direct-methanol fuel cells (DMFC), while elimination of water permeation, will benefit many types of fuel cells and flow batteries. As illustrated, embodiment membranes of the present invention have essentially zero crossover for all of these species, at least for low PVP/GO ratios. Membranes based on CVD graphene are more convenient to handle with polymer supports, which can be Nafion membrane. Such geometry (Gr|Nafion|Gr) is depicted in FIG. 30. It demonstrates $VO^{2+}$ crossover suppression more that 150+ times compared to bare Nafion, while MeOH crossover is suppressed 30+ times. For comparison, behavior of Nafion 117, Nafion 212 and 211 are also given. The lack of $VO^{2+}$ crossover for GO membranes is not surprising; perfect rejection of even smaller ions can occur, but blockage of water and methanol are more valuable. Note that out of different option of graphene on Nafion, the more convenient for plasma treatment option is with graphene on top, i.e., Gr|Nafion|Gr. At the same time, Gr|Nafion|Gr even without plasma treatment shows relatively good proton conductance, probably due to intrinsic tension brought by forceful binding between graphene and Nafion. Moreover, similar sandwich geometries can be employed also with rGO/PVP membranes (e.g., r(PVP/GO)/N211 or N212/r(PVP/GO)/N212), where, by virtue of not requiring to be free standing, r(PVP/GO) can be made significantly thinner and thus having even better proton conductance Table 3 summarizes all these parameters for Nafion membranes, free standing r(PVP/GO) and CVD graphene (Gr) sandwiched with Nafion membranes.

TABLE 3

Area proton resistance and crossover data for r(GO:PVP) and different commercial Nafion membranes

| Membrane | Thickness (μm) | Area proton resistance ($\Omega$ $cm^2$) | $VO^{2+}$ crossover ($10^{-7}$ $cm^2$/min) | MeOH crossover ($10^{-7}$ $cm^2$/s) | Water crossover ($10^{-8}$ $cm^2$/min) |
|---|---|---|---|---|---|
| Nafion-212 (N212) | 50* | 0.75 ± 0.3 | 1.2 ± 0.1 | 1.4 ± 0.1 | 6.9 ± 0.2 |
| Nafion-117 (N117) | 183* | 2.2 ± 0.3 | 2.2 ± 0.2 | 2.2 ± 0.2 | 7.8 ± 0.3 |
| Nafion 211 (N211) | 25 | 0.35 ± 0.2 | 2 ± 0.2 | 1.2 ± 0.2 | N/A |
| r(GO: PVP) | 11 ± 1 | 0.6 | 0 | 0 | 0 |
| Gr/N211/Gr | 25 | 0.75 ± 0.2 | 0.012 | 0.04 | <1 |
| Gr/N211/Gr + plasma | 25 | 0.35 ± 0 0.1 | 0.012 | 0.04 | <1 |

The proton conductance along with the selectivity and the electronic resistance of the r(GO/PVP) and CVD graphene membranes of the present invention make them commercially viable. Using a vanadium flow battery (VFB) as a testing configuration, the proton conductance of r(GO/PVP) composite membranes with the same thickness and slightly altered GO/PVP ratios, as well as Gr/N211/Gr were measured in concentrated sulfuric acid and in a typical electrolyte for VFB. The results for r(GO/PVP) presented in FIGS. 5A-5B indicate that: i) the OCV values have a well pronounced maximum for GO/PVP=1, ii) under the same conditions, the conductance of the composite membranes of the present invention can be even higher than that for untreated Nafion 212, iii) the proton conductance increases with increasing fraction of PVP, and stays essentially constant for 1<PVP/GO<2, and iv) the electronic resistance strongly increases with the fraction of PVP, essentially exponential at first, but then slows down.

So, for further optimization, a high PVP/GO ratio may result in an increase in both the area proton resistance (APR) and electronic resistance. Without crossover of water and ions, the only mechanism left for discharging a VFB battery is through electron conductance. As shown in FIG. 5C, there is some obvious improvement in the battery discharging time from r(2PVP/GO) to r(3PVP/GO) membrane—it increases from 2.8 hours to 5.7 hours with the same 0.5 mL vanadium cells, the latter being greater than the 5.6 hours obtained using Nafion 212 at the same conditions. When high MW is used instead, the discharge time increases even further, to more than 30 hours, due to higher electronic resistance (11 k$\Omega$ cm$^2$) compared to that with low MW PVP of the same composition, but it suffers the drawback of slightly increased proton APR.

Figure 6A:
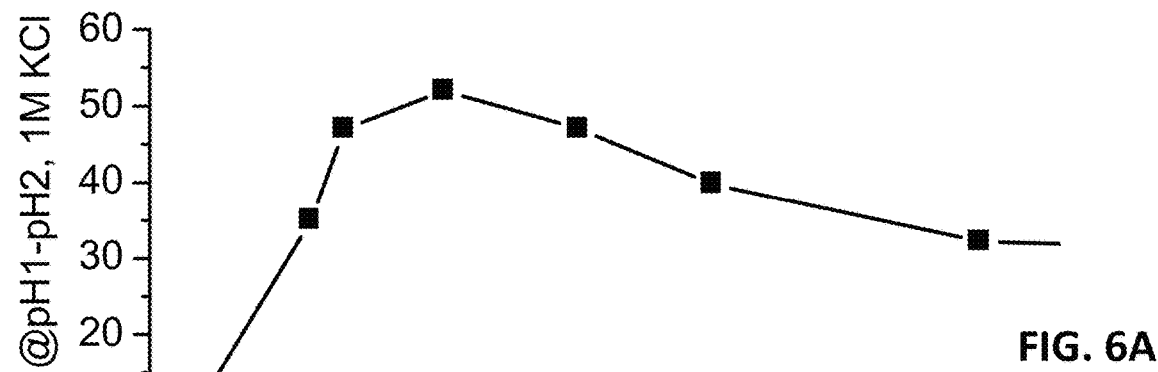
FIGS. 6A-6C show the OCV at 1M KCl for pH1/pH2 gradient (a), area proton resistance (APR) (b), and area electronic resistance (AER, c) for membranes with different PVP/GO ratios (normalized to the same mass).
Figure 6B:
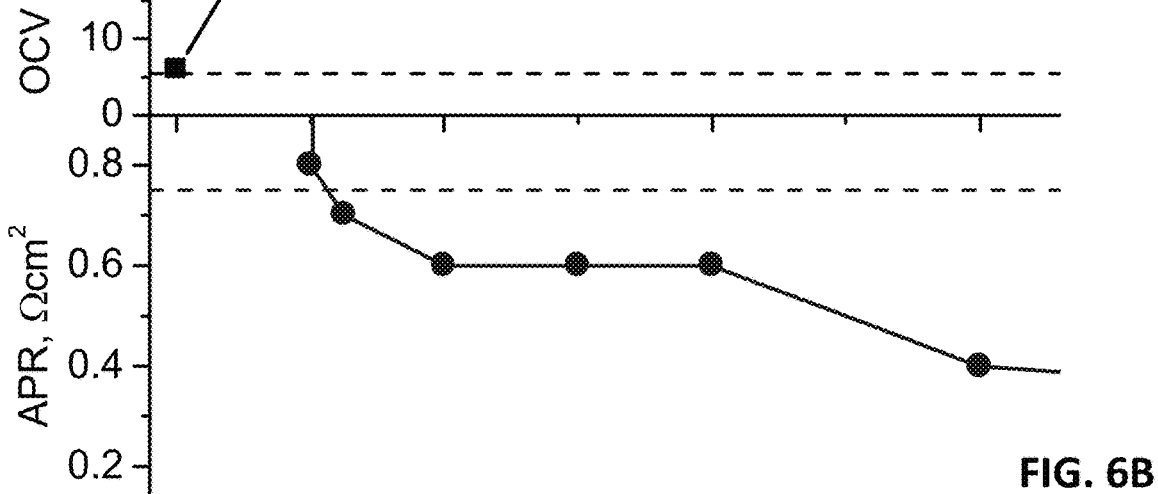
Figure 6C:
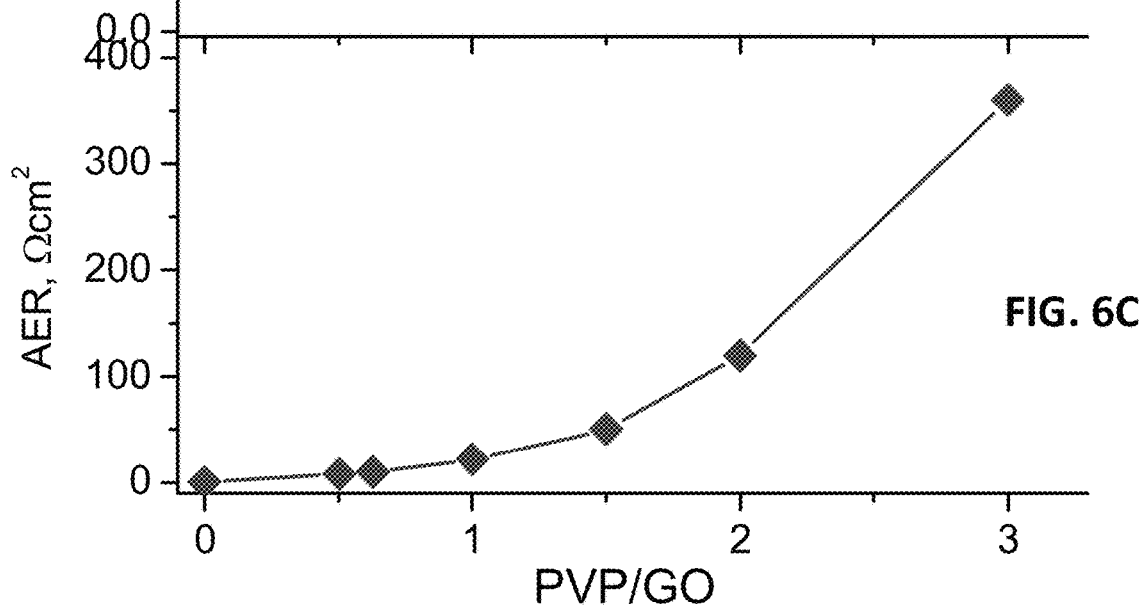

FIGS. 6A-6C show the OCV at 1M KCl for pH1/pH2 gradient (a), area proton resistance (APR) in 1.5M VOSO$_4$+ 3M H$_2$SO$_4$ electrolyte measured at 100 kHz (b), and area electronic resistance (AER, c) for membranes with different PVP/GO ratios (normalized to the same mass). Low MW PVP (3.5 kDa) was used in all cases. The dashed lines show values for Nafion 212 at the same conditions.

Figure 35:
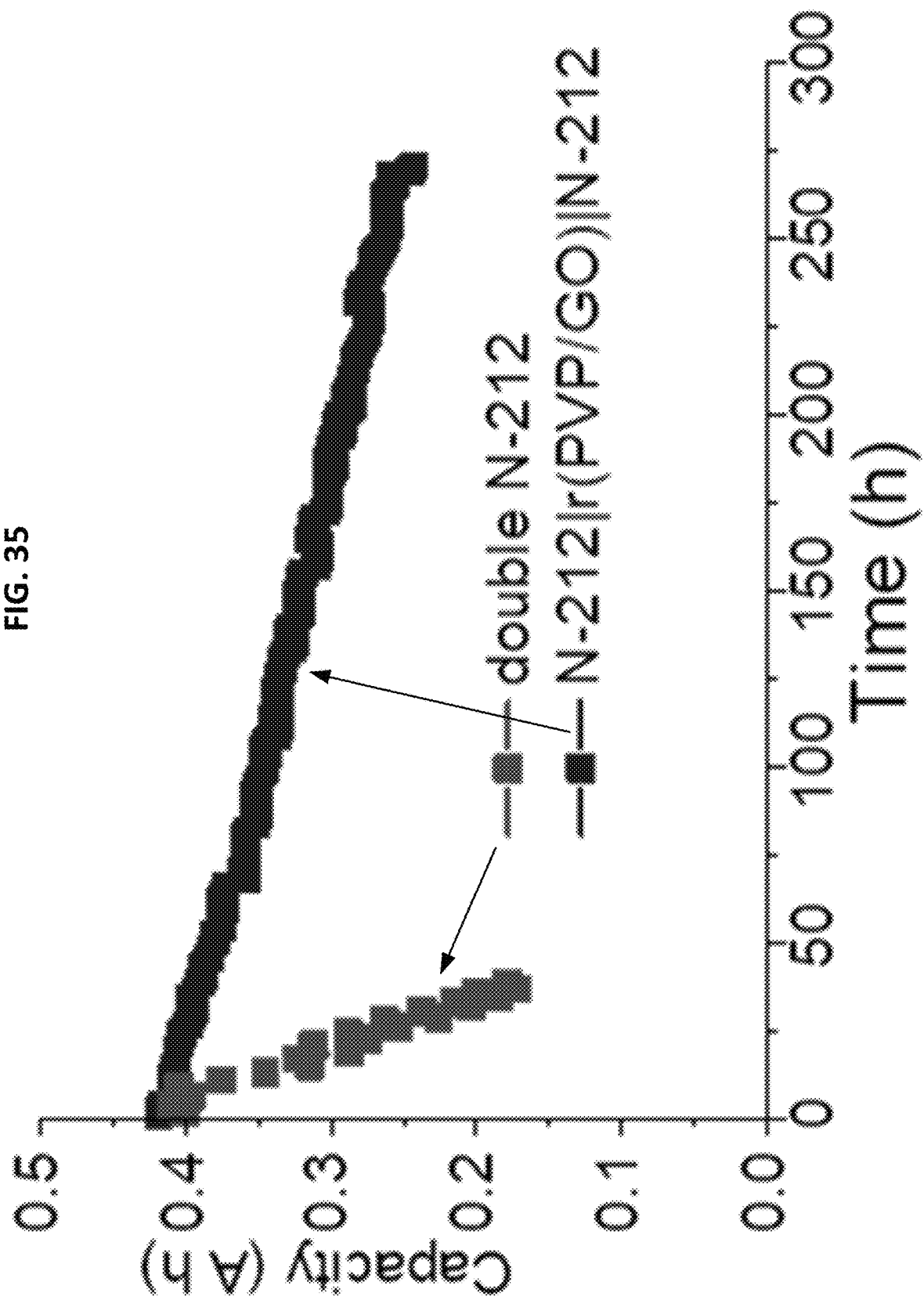
FIG. 35 shows the capacity fading in a 30 mL VFB cell with 1.5M $VOSO_4$+3M $H_2SO_4$ as a function of time for two configurations: two N212 membranes and r(PVP/GO) membrane sandwiched between the two N212 membranes, i.e., N212/r(PVP/GO)/N212.

The easiest way to eliminate negative effect of electronic resistance is to encapsulate r(PVP/GO) membrane into Nafion. FIG. 35 illustrates that in stability testing of loaded battery r(1PVP/GO) membrane sandwiched between two Nafion 212 (N212) membranes. Because of the crossover, the capacity of the cell with a double N212 membrane declines much faster compared to N212|r(PVP/GO)|N212 sandwich. Non-zero capacity decline for composite membrane is due to increasing proton resistance of N212 in vanadium solution, which increased from 0.46 Ohm to 0.55 Ohm after 11 days.

Defects in the Graphene/GO

Figure 20:
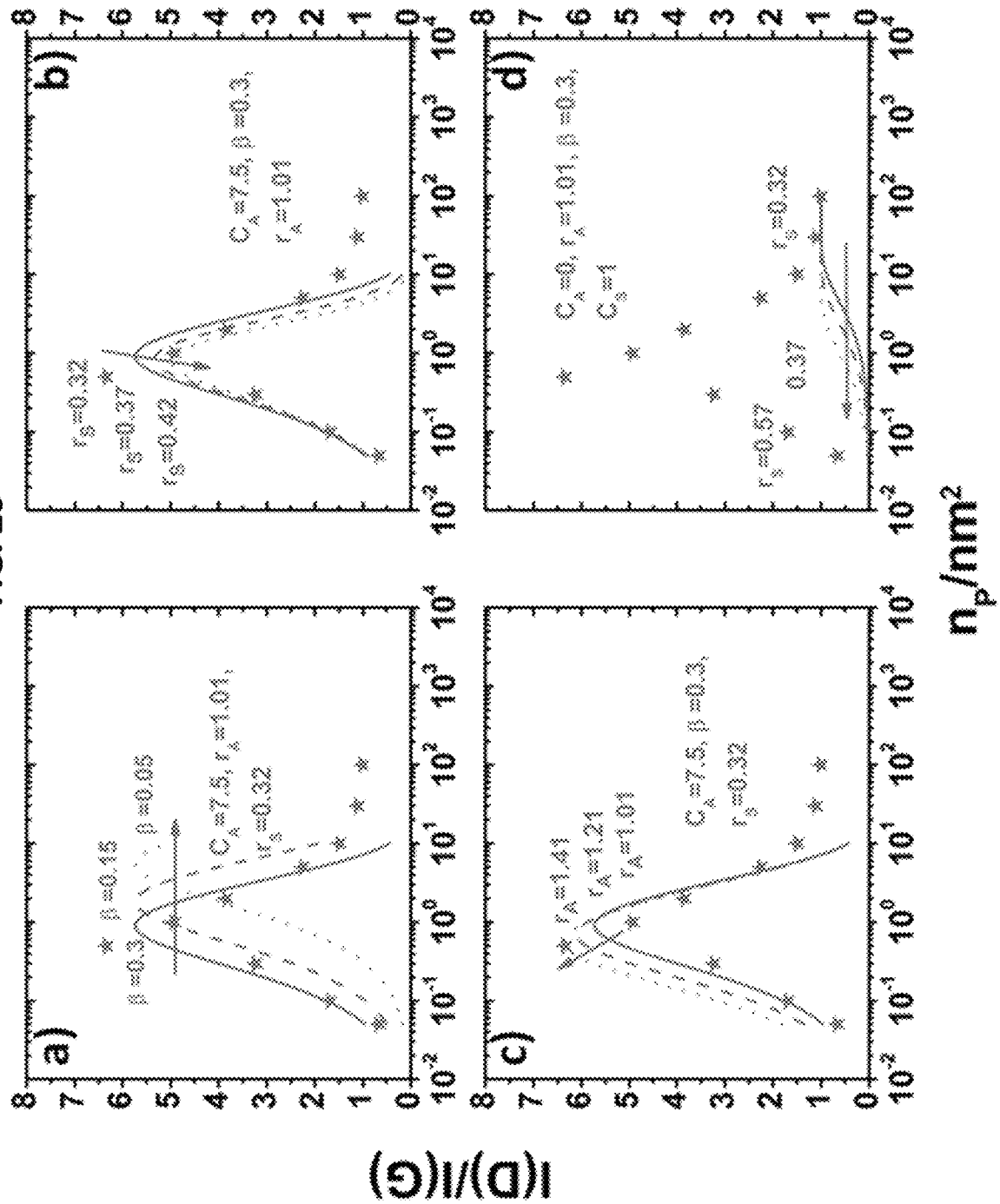
FIG. 20 (frames (a)-(d)) shows a comparison of D/G ratio using areal intensity, A(D)/A(G), and amplitude, I(D)/I(G) for He and Ne ion-beam treated graphene membranes.

FIG. 20 (frames (a)-(d)) shows a comparison of D/G ratio using areal intensity, A(D)/A(G), and amplitude, I(D)/I(G) for He and Ne ion-beam treated graphene membranes.

Figure 21:
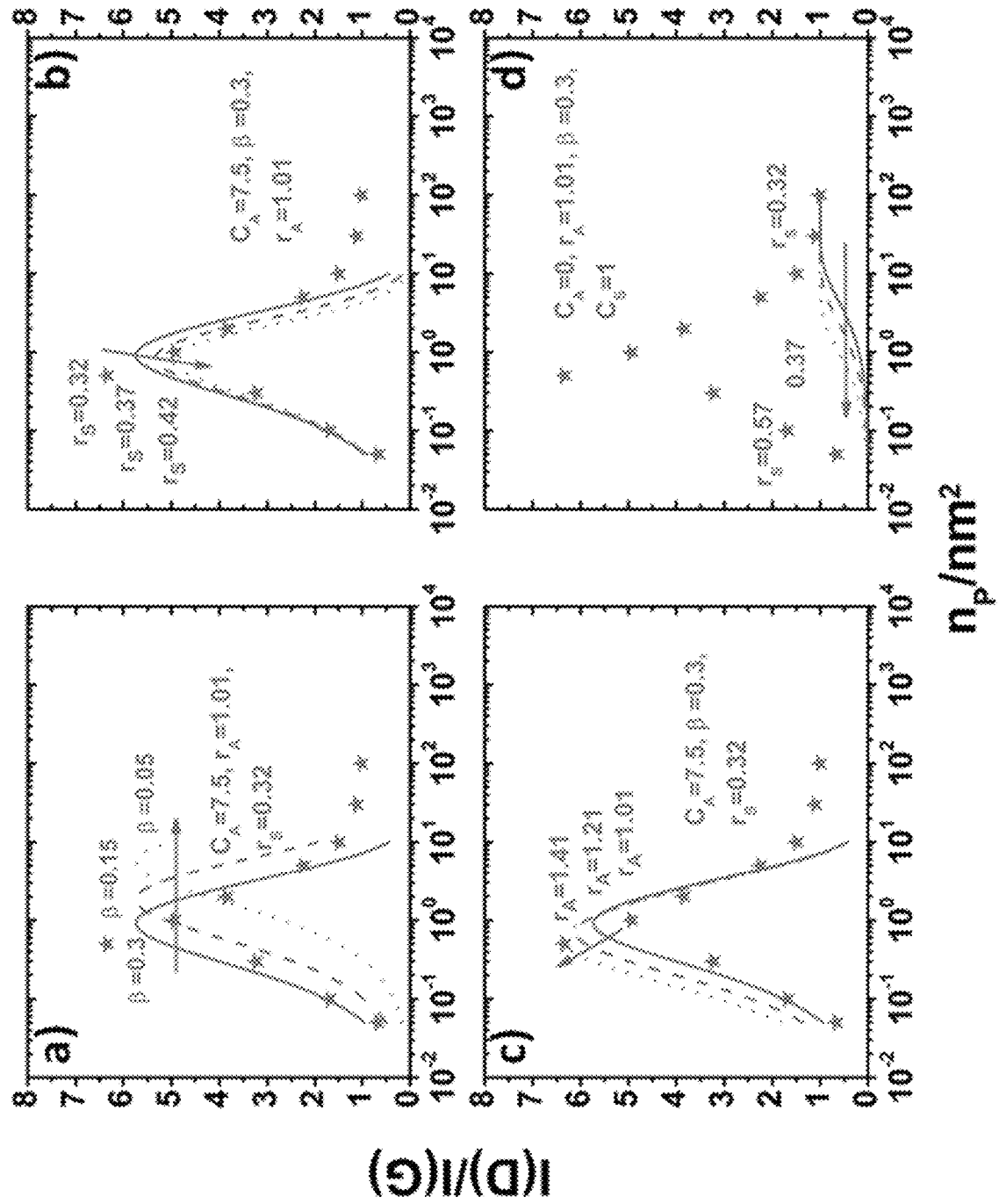
FIG. 21 (frames (a)-(d)) shows fitting $I_D/I_G$ dependence on dosage.

FIG. 21 (frames (a)-(d)) shows fitting I$_D$/I$_G$ dependence on dosage using the following equation:

$$\frac{I_D}{I_G} = C_A \frac{(r_A^2 - r_S^2)}{(r_A^2 - 2r_S^2)} \left( e^{-\pi r_S^2/L_D^2} - e^{-\pi (r_A^2 - r_S^2)/L_D^2} \right) + C_S \left( 1 - e^{-\pi r_S^2/L_D^2} \right)$$

where r$_S$ and r$_A$ are the radii of the actual disordered zone (defect) and the corresponding activated region around in which the D band scattering takes place. a) Decreasing the yield expectantly shifts the curve without alteration to the right. b) Increasing r$_S$ also shifts the maximum to the left by decreases the right wing of the curve with simultaneous narrowing. c) Increasing r$_A$ also shifts the maximum to the left but with increasing the left wing with simultaneous increase of the maximum value (up to C$_A$). d) Contribution from the defect region is given by the maximum magnitude C$_S$ which is reached at lower n$_p$ with increasing r$_S$. Its behavior counteracts the effect of changing r$_S$ on the CA region.

Figures 22A, 22B:
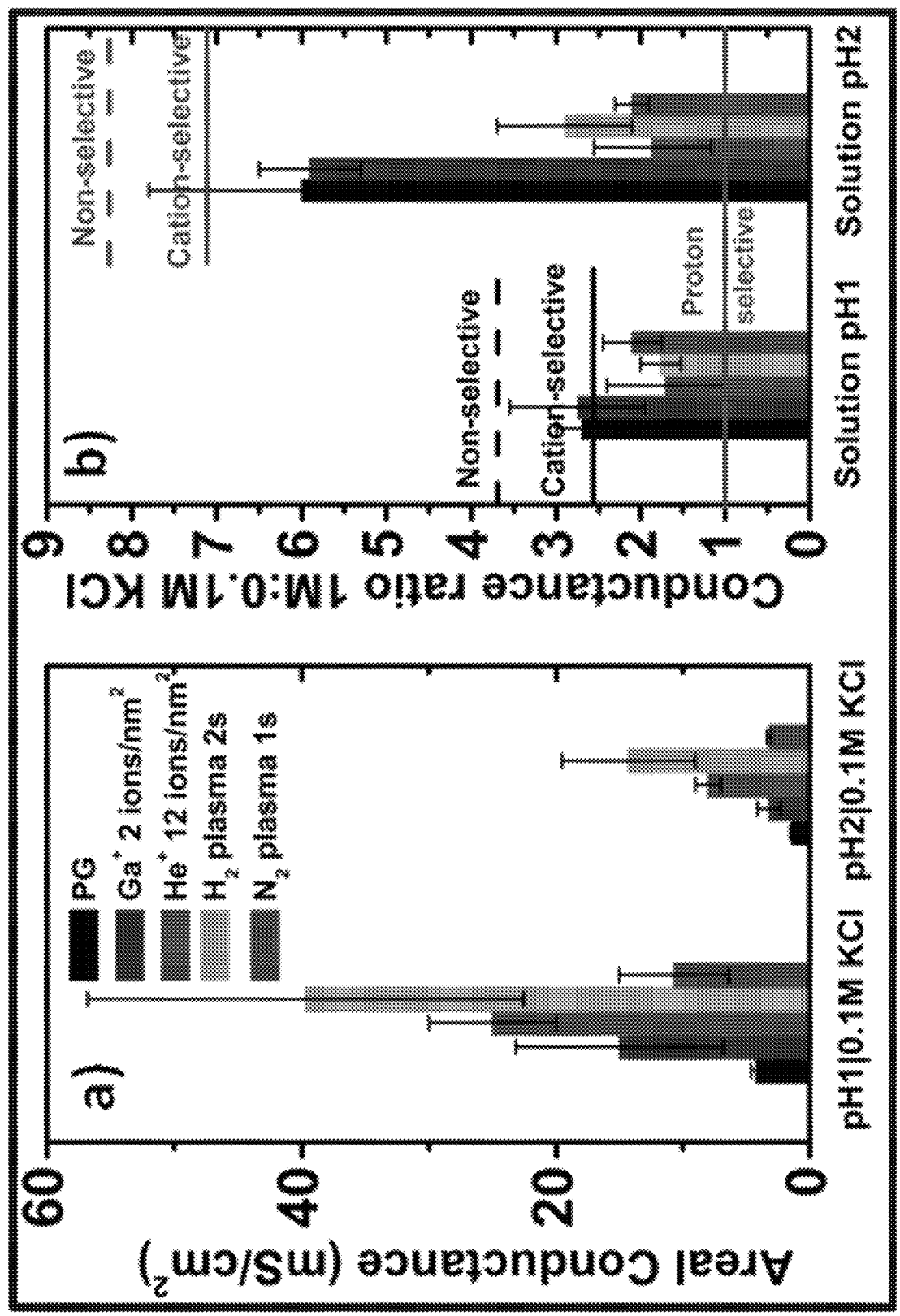
FIGS. 22A-22B show the areal conductance (a) and the ratios of conductance for solutions at 1M KCl and 0.1M KCl for pH1 and pH2 (b) for pristine and treated graphene samples.

FIGS. 22A-22B show the areal conductance (a) and the ratios of conductance for solutions at 1M KCl and 0.1M KCl for pH1 and pH2 (b) for pristine and treated graphene samples. Red and black colored dashed and solid lines represent the expected ionic conductivity ratio (1M KCl: 0.1M KCl) for nonselective and cation selective (anion rejective) membranes at pH2 and pH1, respectively.

Figure 23:
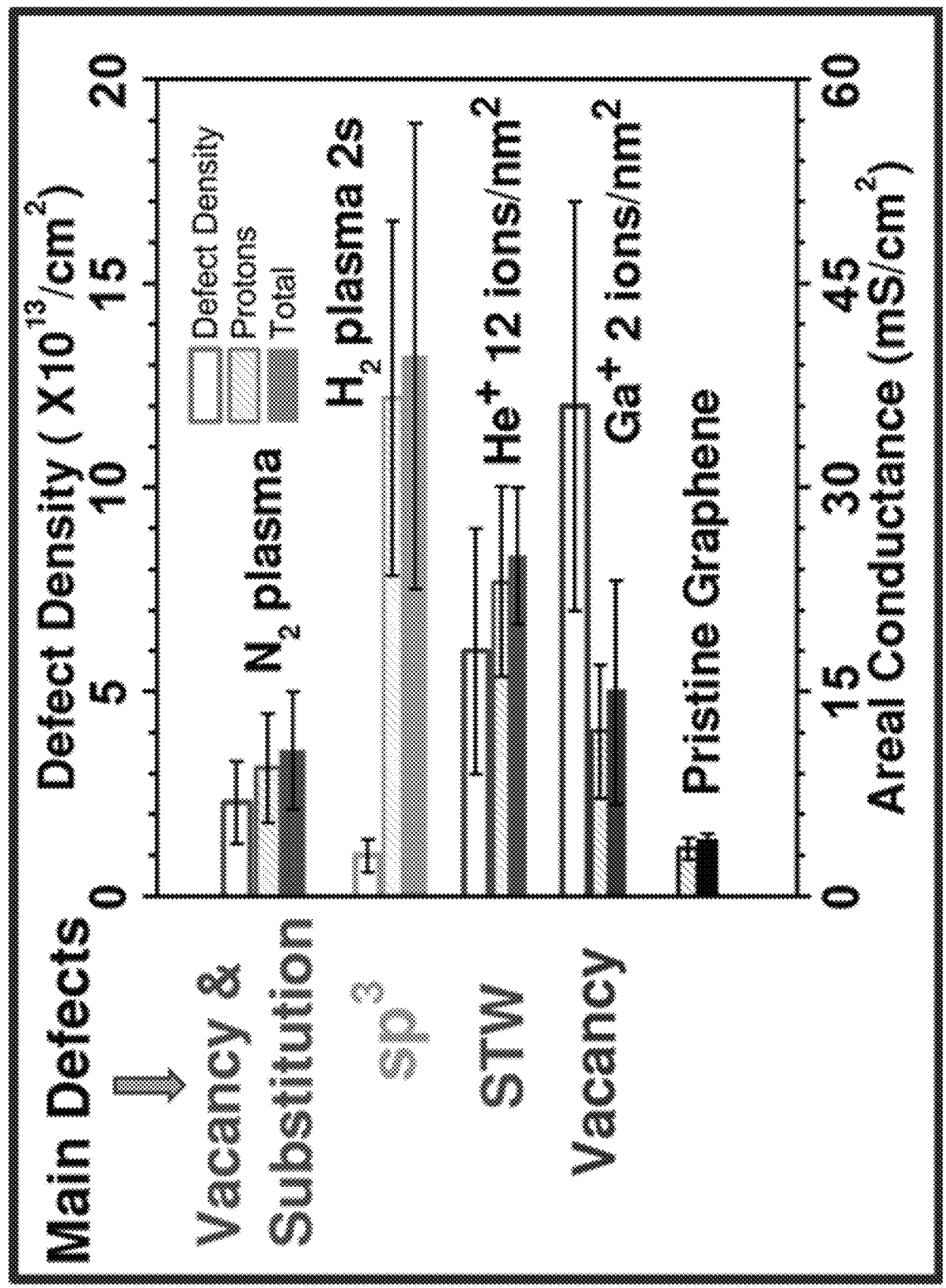
FIG. 23 shows areal conductance at pH1|0.1M KCl (solid bars) and the estimated portion from protons (dashed bars) along with the defect density (empty bars) for different graphene samples.

FIG. 23 shows area conductance at pH1|0.1M KCl (solid bars) and the estimated portion from protons (dashed bars) along with the defect density (empty bars) for different graphene samples.

Figure 24:
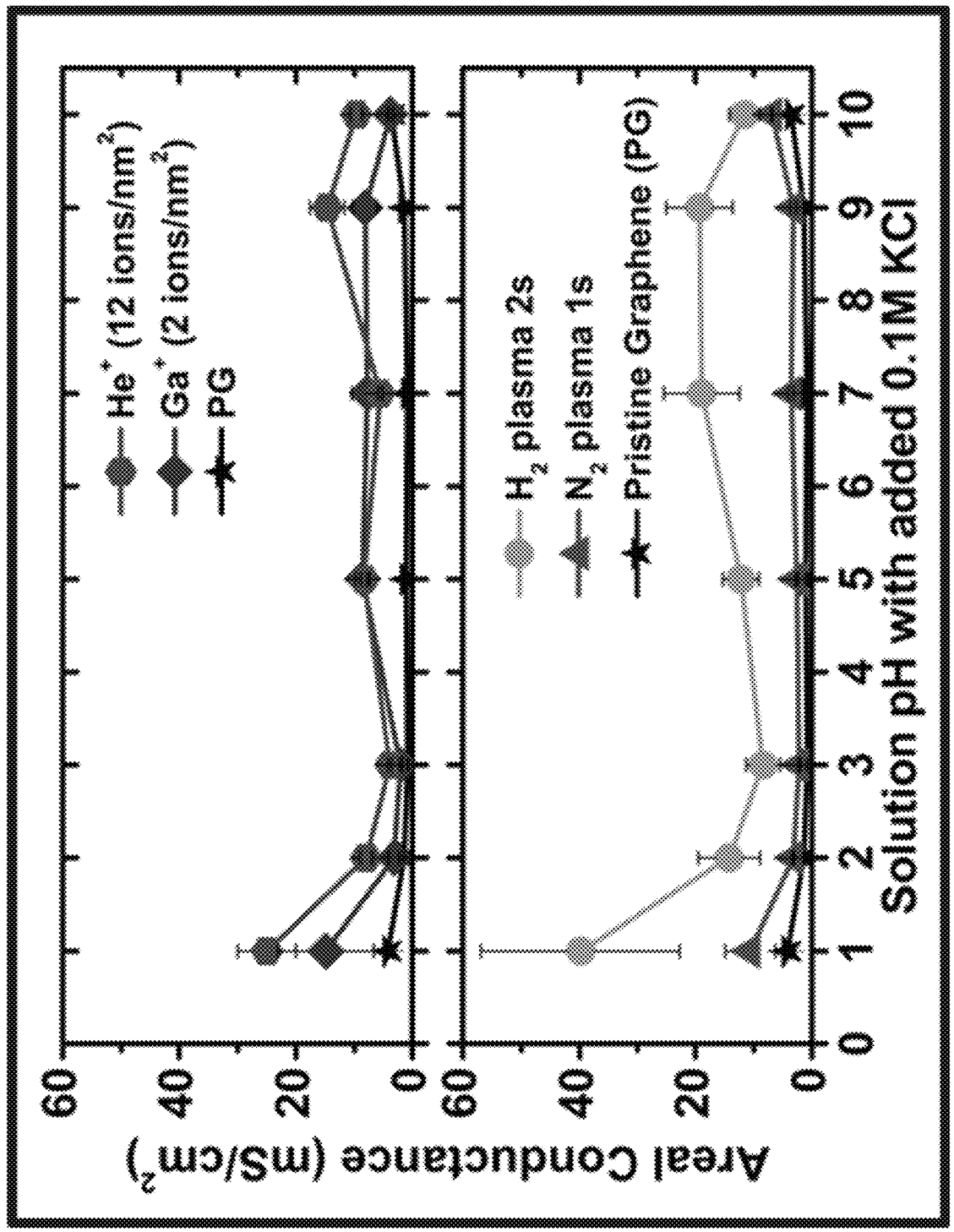
FIG. 24 shows areal proton conductance as a function of pH for ion-beam treated (a) and plasma treated (b) graphene membranes in comparison to pristine graphene.
Figure 25A:
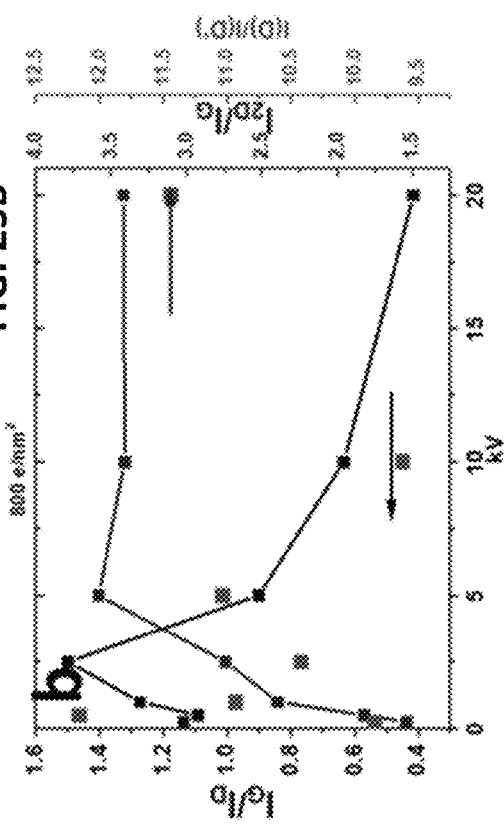
FIGS. 25A-25D illustrate the effect of bombardment by electrons of different energies at $n_p$=800 e/nm² (top) and np=19500 e/nm² (bottom) in regular SEM.
Figure 25B:
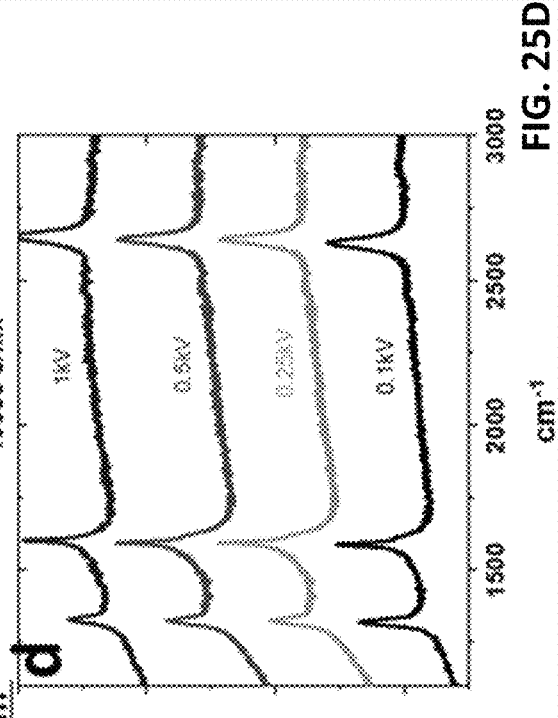
Figure 25C:
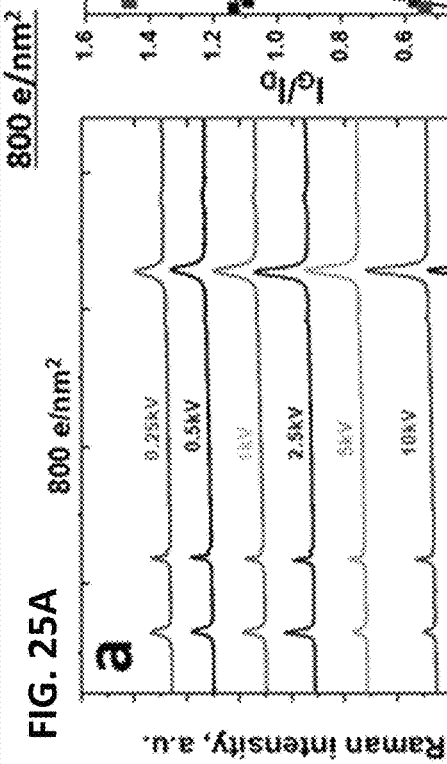
Figure 25D:
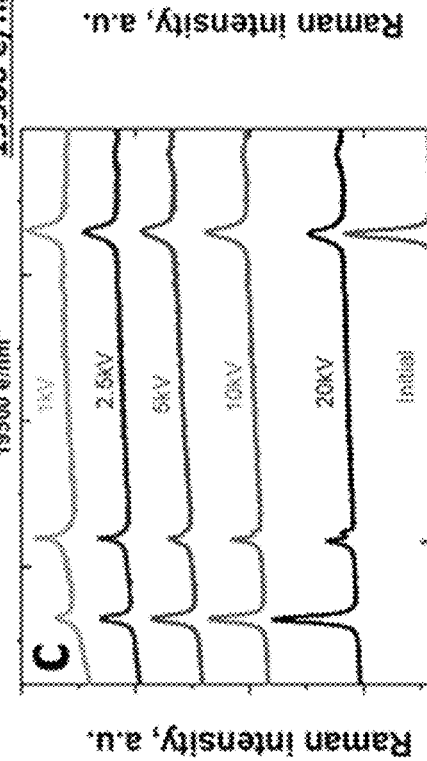

FIG. 24 shows area proton conductance as a function of pH for ion-beam treated (a) and plasma treated (b) graphene membranes in comparison to pristine graphene.

FIGS. 25A-25D illustrate the effect of bombardment by electrons of different energies at n$_p$=800 e/nm$^2$ (top) and n$_p$=19500 e/nm$^2$ (bottom) in regular SEM. a) Raman spectra of single layer graphene bombarded by electrons with different energies. b) I$_G$/I$_D$, I$_{2D}$/I$_G$ and I$_D$/I$_{D'}$ plots calculated from spectra shown in a). c), d) are similar to a), but with higher dosage—19500 e/nm$^2$.

Figure 26:
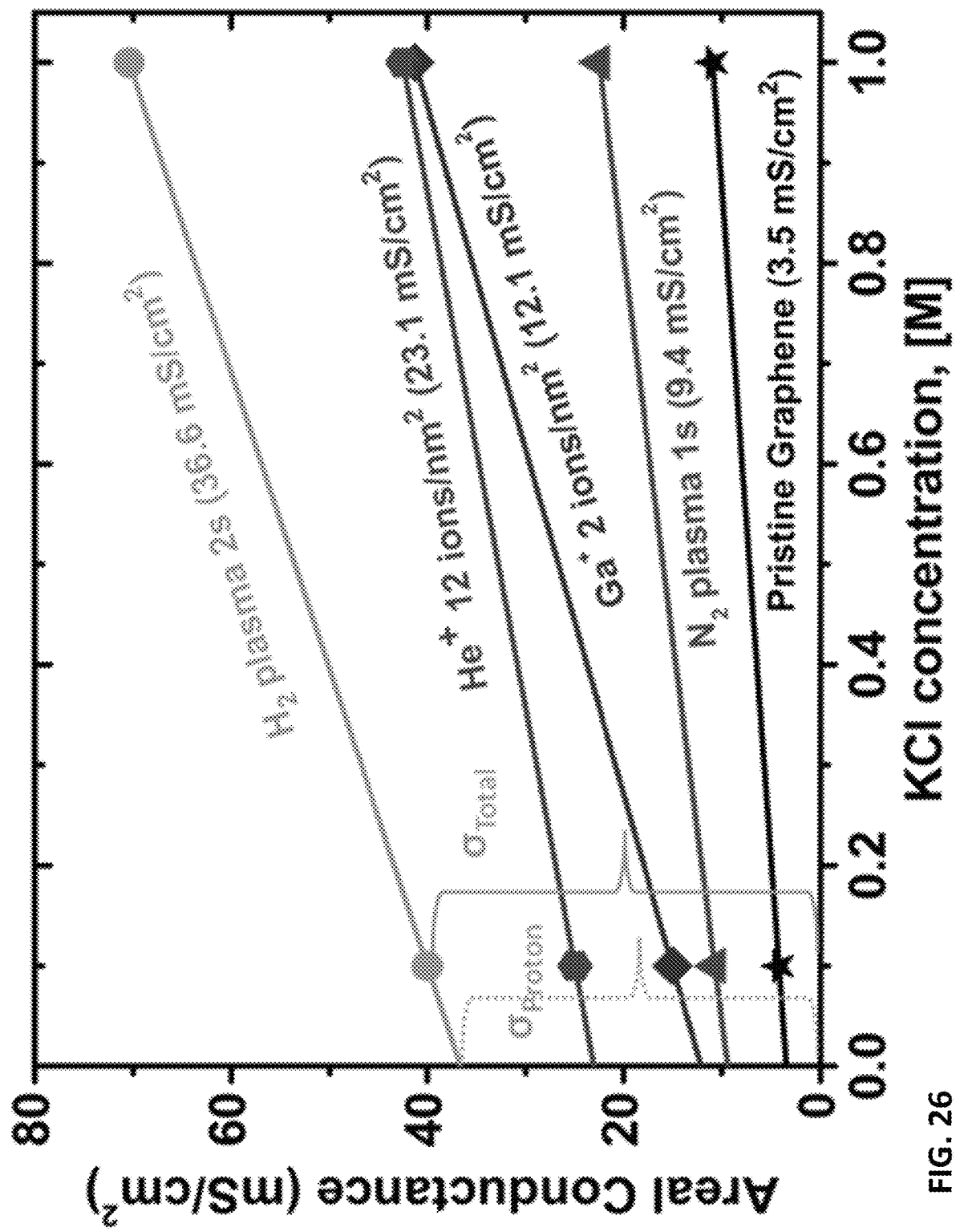
FIG. 26 shows the procedure for deriving the contribution to the total conductance, $s_{Total}$, from that of protons only, $s_{proton}$, using the dependence on salt concentration, [KCl], at solution pH1.
Figure 27B:
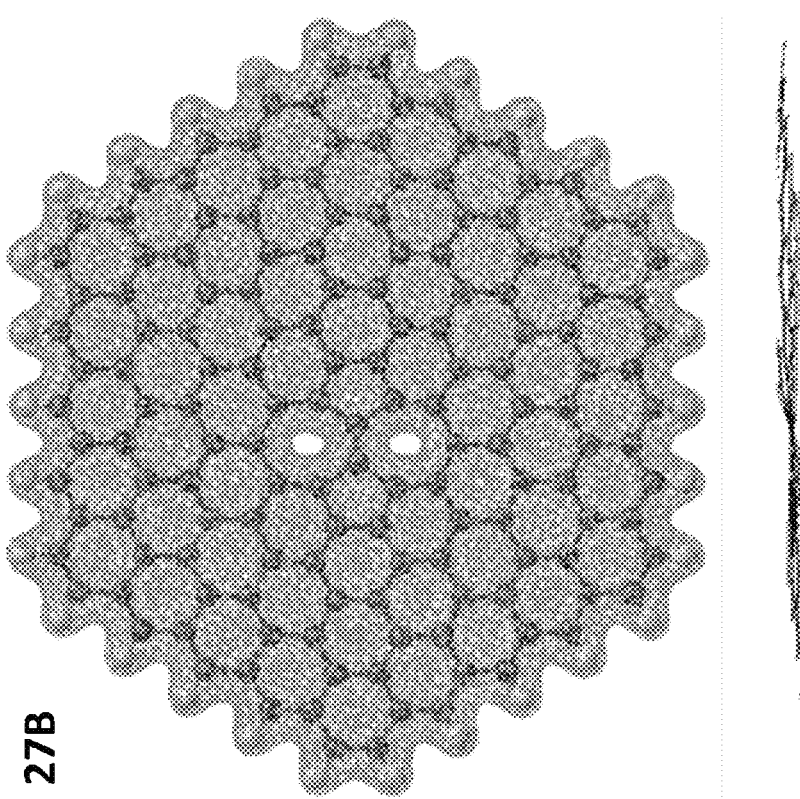
Figure 27A:
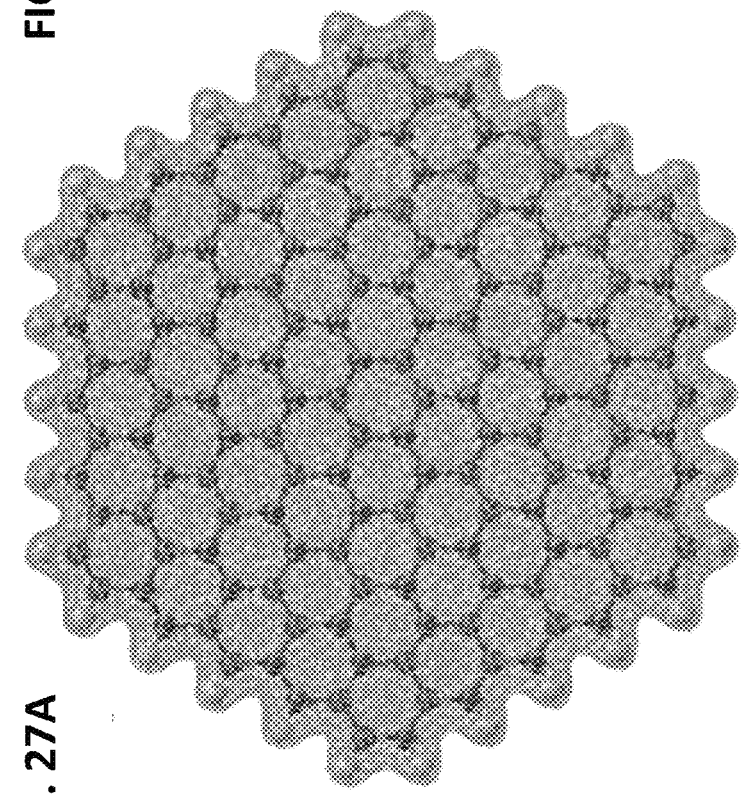

FIG. 26 shows the procedure for deriving the contribution to the total conductance, s$_{Total}$, from that of protons only, s$_{proton}$, using the dependence on salt concentration, [KCl], at solution pH1.

FIGS. 27A-27F illustrate electron density maps (0.03) calculated through optimized by PM3 semi-empirical method (HyperChem 7.0) for pristine graphene (a), Stone-Thrower-Wales, STW, characteristic for light ion (He$^+$, Ne$^+$) bombardment (b), sp3 defects with hydrogen termination of different type produced by hydrogen plasma irradiation, two neighboring hydrogens on the same side (c), 6 hydrogens in chair conformation (d), 12 hydrogens in boat conformation (e) and vacancy defect with 2 knocked off carbons with 4 hydrogens terminating the dangling bonds (f). The wire diagrams below each molecule illustrate the out of plane distortions.

Generally, these figures illustrate the defects in the graphene, as departing from hexagonal cyclical structures of sp2 hybridized carbon atom. For carbon, sp2 hybridization generally corresponds to planar structures, like that in graphene. The sp2 atoms at the edges may have to be bonded to some other atom or a group of atoms, e.g., hydrogen. With a seven or eight carbon cycle of sp2 carbons, hydrogens would still point out, and so a 'hole' in a seven or 8 members ring in graphene would not need to have hydrogens inside. (Typically, these are 7, 8, 9 and/or 10 cycles, but higher numbers are also possible.) But in a much larger hole, the extra electrons at the edge carbons no longer can be dangling (radicals) and would have to be bound to hydrogen or oxygen, or something else.

Figures 28A, 28B:
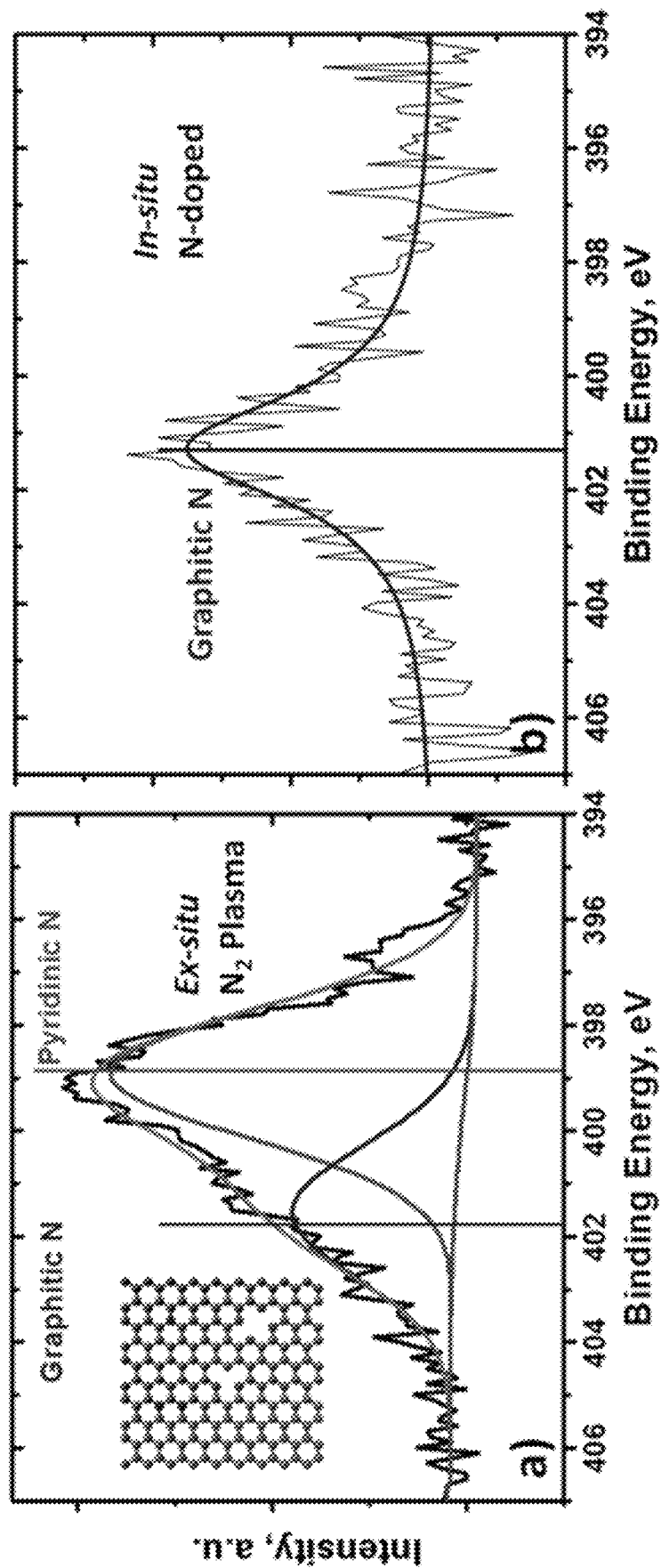
FIGS. 28A-28B show XPS spectra of nitrogen incorporated into graphene via a) ex situ $N_2$ plasma treatment and b) in situ CVD growth with acetonitrile as a precursor.

FIGS. 28A-28B show XPS spectra of nitrogen incorporated into graphene via a) ex situ N$_2$ plasma treatment and b) in situ CVD growth with acetonitrile as a precursor.

Figure 29:
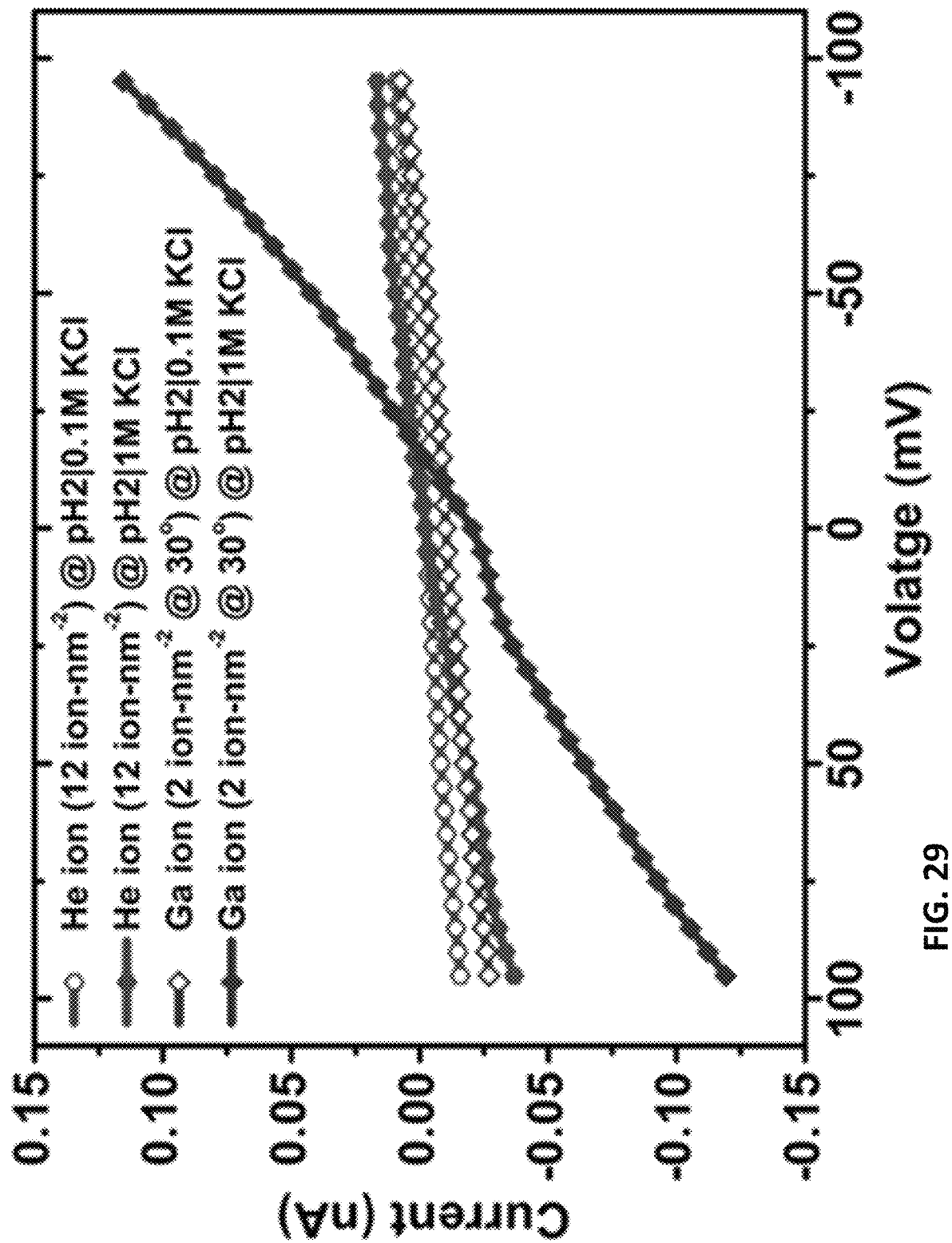
FIG. 29 shows I-V plots for graphene membranes (5 μm diameter) treated by ion-beams (He+ and Ga+). Ion-beam dosages are mentioned in the figure.

FIG. 29 shows I-V plots for graphene membranes (5 µm diameter) treated by ion-beams (He$^+$ and Ga$^+$). Ion-beam dosages are mentioned in the figure.

TABLE 4

Fitting parameters for the experimental I$_D$/I$_G$ in CVD graphene treated with different sources

| Particle | Defect yield, β | r$_S$, nm | r$_A$, nm |
| --- | --- | --- | --- |
| Ge$^{+*}$ | 0.60 ± 0.20 | 0.85 | 1.92 |
| Ne$^{+*}$ | 0.30 ± 0.17 | 0.40 | 1.04 |
| He$^{+*}$ | 0.05 ± 0.02 | 0.20 | 0.94 |
| e$^{-*}$ | (5 ± 1) × 10$^{-6}$ | 1.47 | 2.10 |
| N$_2$ Plasma** | NA | 0.6 | 2 |
| H$_2$ Plasma** | NA | 1 | 3 |

*Based on the fit of I$_D$/I$_G$ vs n$_p$.
**The values of r$_A$ and r$_S$ were taken as average for vacancy and STW type of defects, observed in the STEM images.

Figure 36A:
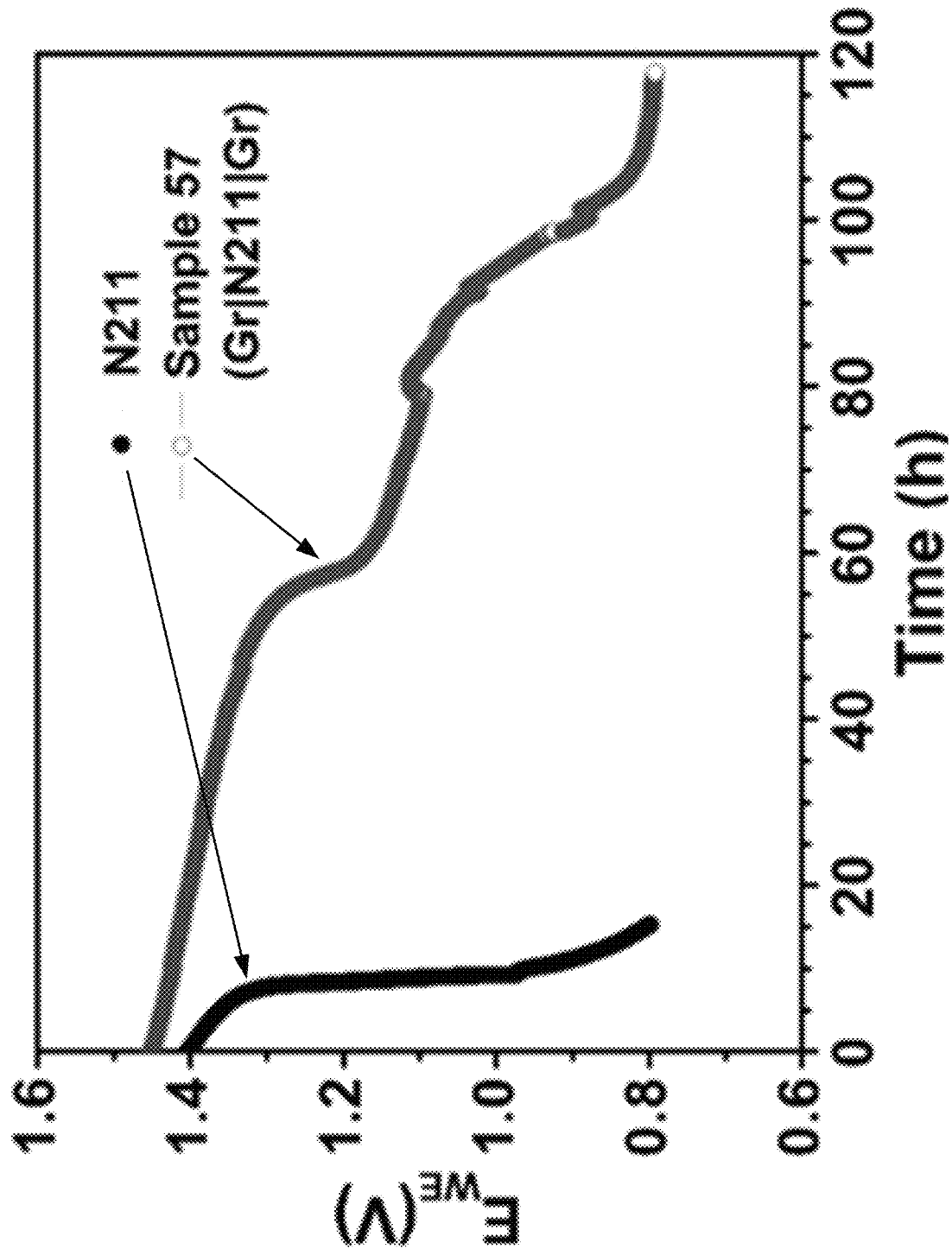
FIGS. 36A-36B show an example of Gr/N/Gr membrane performance in Vanadium Flow Battery.
Figure 36B:
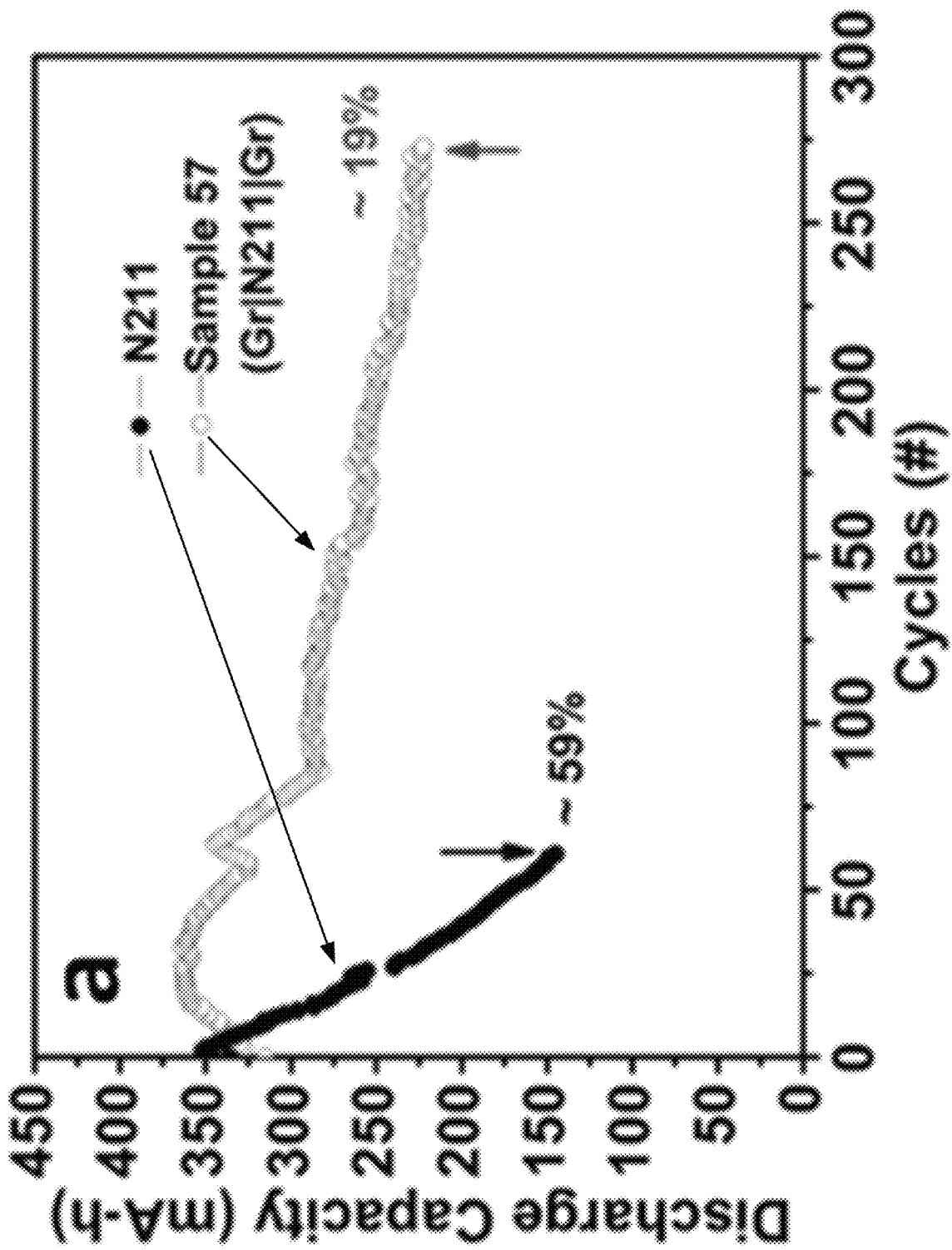

Similar to the approach with r(GO/polymer) membranes, advantageous behavior of irradiated graphene can be demonstrated by sandwiching it with Nafion. FIG. 36 and Table 3 demonstrate that Gr/N211/Gr membrane significantly suppress crossover of other than hydrogen ionic and molecular species which results in much slower capacity fading in VRB battery compared to bare Nafion.

EXPERIMENTAL METHODS

Materials.

An aqueous dispersion (0.4 wt %) of graphene oxide was purchased from Graphenea. Polyvinyl pyrrolidone (PVP) of different molecular weights was purchased from Acros Organics, and Nafion was obtained from the Fuel Cell Store. Nafion was tested "as received" without any pretreatment. Hydroiodic acid, hydrobromic acid, hydrazine, ascorbic acid, PVA, PAA, SDBS, PEG, PYPY were purchased from Sigma Aldrich and vanadium oxy sulfate was purchased from Fisher Scientific.

r(PVP/GO) Membrane Preparation.

The poly vinyl pyrrolidone (PVP) powder of the desired molecular weight and proportion to GO was added in the GO solution; for example, when 40 mg of polyvinyl pyrrolidone (PVP) were added to 10 mL of 0.4% GO solution, the resulting PVP/GO (in the 1:1 ratio) solution was produced. This solution was sonicated for 10 minutes in a bath ultra sonicator (VWR 40 kHz, 48 W) to form a homogeneous dispersion. Subsequently, 0.75 mL of that PVP/GO solution was vacuum filtered on a 1.5" PET hydrophobic support membrane (with 100 nm pores) but not to full dryness. A slightly wet GO/PVP film with PET support was reduced in HI (54%) vapor at 95° C. for 24 hours. Afterwards, the obtained r(GO/PVP) membrane can be easily delaminated from the PET membrane. It was repeatedly rinsed with ethanol and water to remove residual HI. For conductance and OCV measurements, the membrane was placed in between the parafilm sheets with circular openings of 0.3 $cm^2$.

The concentration of PVP and GO in the filtrate was measured by optical absorption. PVP has a characteristic peak at 213 nm and less than 2% of PVP was observed in that filtrate for PVP:GO when 3500 Da PVP was used. Smaller amounts were observed for that composition with PVP of larger molecular weights. Thus, even with PV of small MW most of it remains in the film and the PVP/GO composition is practically the same as in solution.

To further emphasize the uniqueness of the HI reduction, proton conductance for r(GO/PVP) membranes prepared by different reducing agents like HBr (46%), hydrazine, or ascorbic acid was verified. The membrane prepared by HBr treatment shows a moderate selectivity, OCV of 15 mV for pH1-pH2 @1M KCl condition, whereas, hydrazine and ascorbic acid treated films were very fragile and difficult to handle during the experiment. Such films were found to have poor proton selectivity compared to the HI and HBr treated GO/PVP samples.

Other means of preparing the film, Dr. Blade casting and evaporation from a Teflon beaker, did not work as well, although the former was better. It reflects the importance of the multiple features. First, accessing the membrane's both sides during reduction when on PET membranes allows more uniform (and possibly faster) reduction. Second, alignment of GO flakes by unidirectional water flow in vacuum filtration also establishes pathways that are later employed in the reduction process.

TABLE 5

OCV* data for pH1 /pH2 gradient for different methods of preparation of the same composite membrane formulations, 1.6 PVP/GO and reduction for 24 h in HI vapor

| Membrane composition and preparation method | Zero salt (mV) | 1M KCl (mV) |
|---|---|---|
| Vacuum filtration | 59 | 52 |
| Dr. Blade on a glass | 39 | 5 |
| Dr. Blade on a PET membranes | 56 | 39 |
| Spin coating | 59 | 35 |
| Slow evaporation in Teflon beaker | 39 | 5 |

*all values are given with the accuracy ca. 1 mV

Graphene Synthesis Using Chemical Vapor Deposition (CVD)

Graphene was synthesized using atmospheric pressure CVD as previously described. Briefly, 75 μm thick copper (Nimrod Copper) was electropolished in an $H_3PO_4$ based solution and inserted in 3" diameter quartz tube. Foils were annealed at 1065° C. for 30 min under 500 sccm flow of 2.5% $H_2$/Ar. Growth was performed by addition of 0.1% $CH_4$/Ar ramping the flow to 20 sccm in 2 hours. After the growth, furnace was opened for fast cooling.

Free Standing Graphene Membrane Preparation

Figure 18:
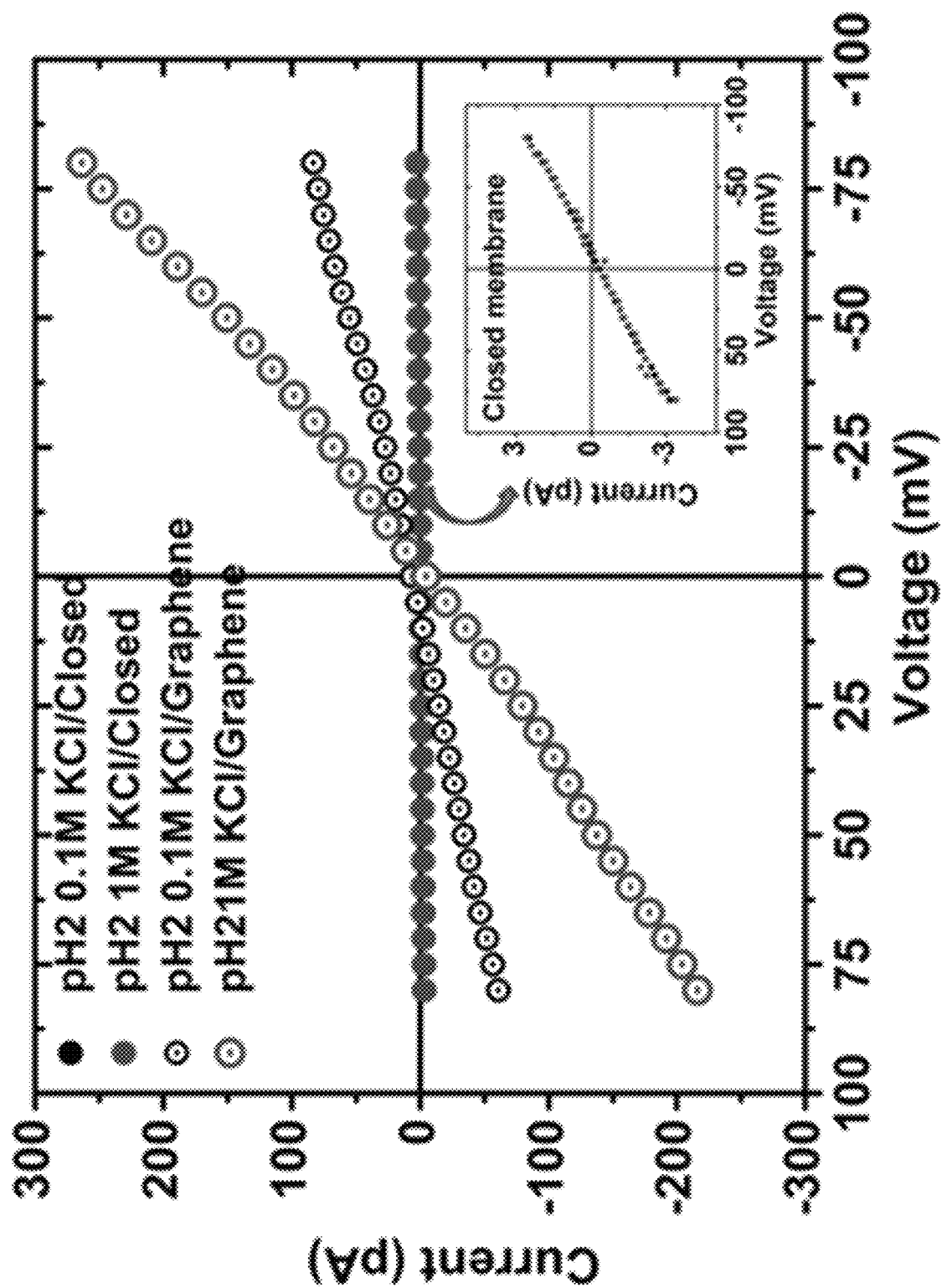
FIG. 18 illustrates representative I-V curves (obtained from the averaging the CV) for closed SiN membrane and with graphene at a scan rate of 8 mV/s.

Because of extreme thickness, free standing graphene survives mechanical stress during transfer only for relatively small sizes but it allows demonstration of the effect of graphene by itself. The SiN chips with 300 nm thick suspended SiN membranes were prepared using regular clean room techniques as previously described. (FIG. 18 illustrates representative I-V curves for closed SiN membrane and with graphene at a scan rate of 8 mV/s.)

5 μm holes were etched by reactive ion etching (RIE). The CVD grown graphene samples were transferred onto the chips using the wet chemical etching approach, i.e., when a thin polymer layer was first spin coated on graphene followed by etching away the metal foil and transferring graphene with polymer onto the chip and subsequent dissolution of the polymer. Alternative method of transfer involves hot-pressing graphene onto a polymer, e.g., Nafion. It can be used for preparation of sandwiched structures with Nafion like shown on FIG. 30. In that case hot pressing was at 150 C using 150 kg/$cm^2$ for 3 minutes.

FIGS. 31A-31B shows Raman analysis (a) and b) conductance at different pH and [KCl] along with estimated proton conductance for in situ incorporated N in the graphene membrane during the CVD synthesis.

Introduction of Defects

Defects were created in already transferred graphene samples either using ion-beams or plasmas. Irradiation was performed as follows: electron beam (10 kV) dosing was performed using a Zeiss Merlin SEM, gallium (30 kV)—using an FEI Novalab 600 FIB, neon (25 kV) or helium (25 kV)—using a Zeiss Orion NanoFabwere. Raman scattering was used to evaluate the resulting defects in a broad range of irradiation dosages. The measurements were performed using a Renishaw instrument typically with 633 nm laser excitation Two types of plasma treatments were utilized for defect engineering on graphene membrane using an Oxford Plasmalab 100 (RF 13.56 MHz) at operating power and chamber pressure of 15 W at 10 mTorr for $N_2$ plasma, and 10 W at 10 mTorr for $H_2$ plasma, respectively.

Manufacturing

The most convenient form for manufacturing of the membranes at this point is in the form of sandwiches with Nafion.

CVD Graphene Membrane Manufacturing Flowchart.

Figure 32:
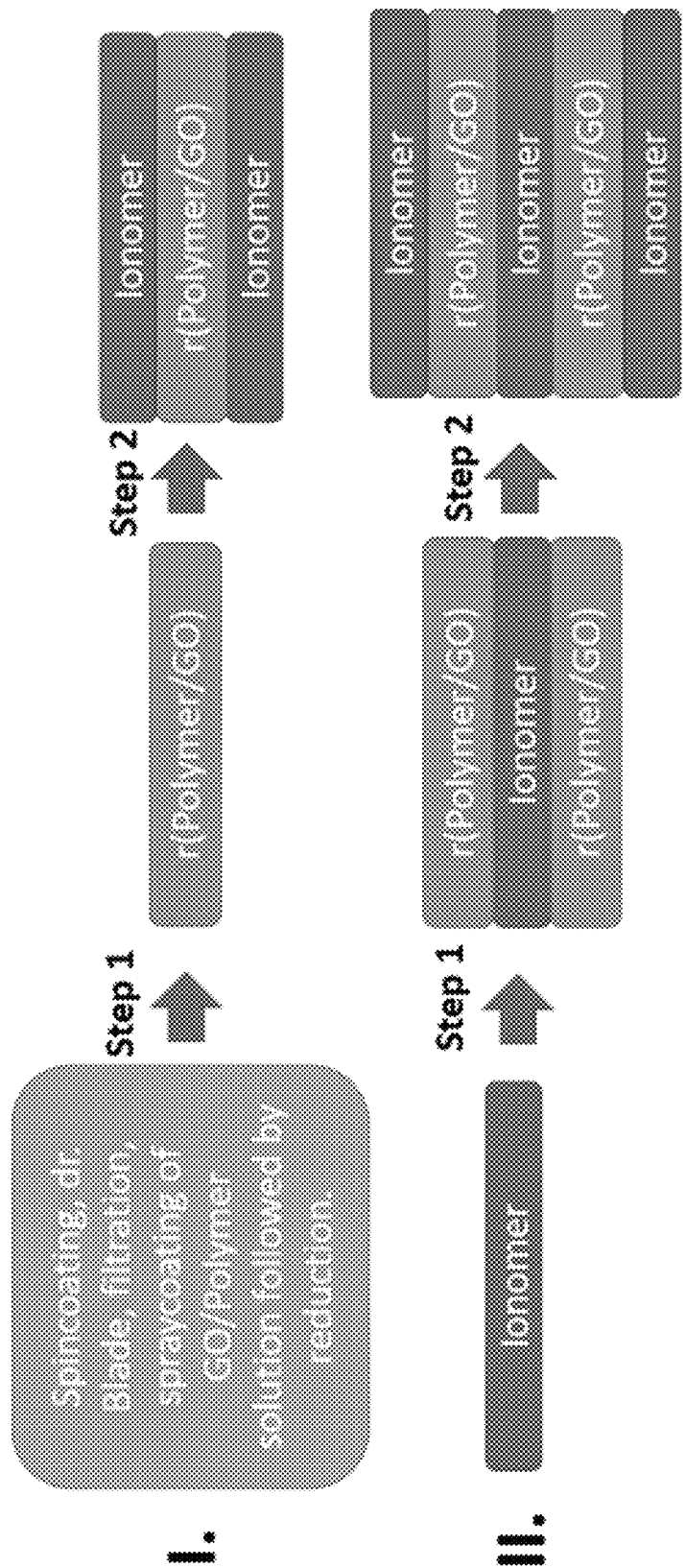
FIG. 32 illustrates the manufacturing process of r(GO/polymer) sandwiched with Nafion membranes.

The flow chart for such manufacturing with graphene is shown in FIG. 32. Starting with graphene on a metal substrate prepared using CVD process.

Step 1: Graphene on a metal foil is either hot pressed or rolled onto Ionomer films. Alternatively, Ionomer film can be deposited by the by spray-coating or direct casting from the solution.

Step 2: The metal foil is removed by either peeling off or dissolution.

Step 3: Defects are introduced into the graphene layer by Plasma, oxidizers, or ion bombardment.

Step 4: The second layer of ionomer can be laminated, spray coated or cast from the solution to encapsulate graphene layer.

r(Polymer/GO) Membrane Manufacturing Flowchart.

Figure 33:
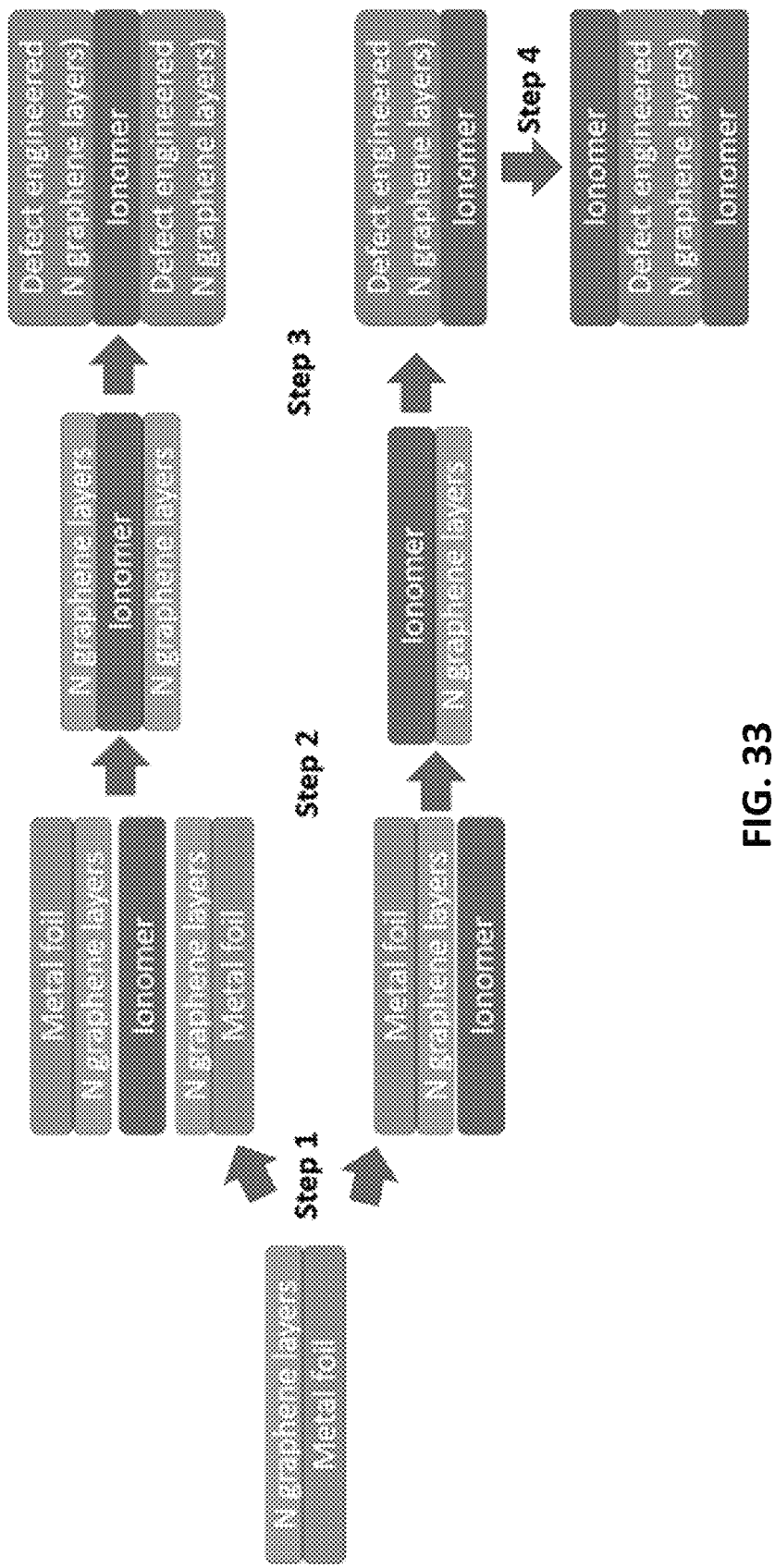
FIG. 33 illustrates the manufacturing process of CVD graphene sandwiched with Nafion membranes.
Figure 34:
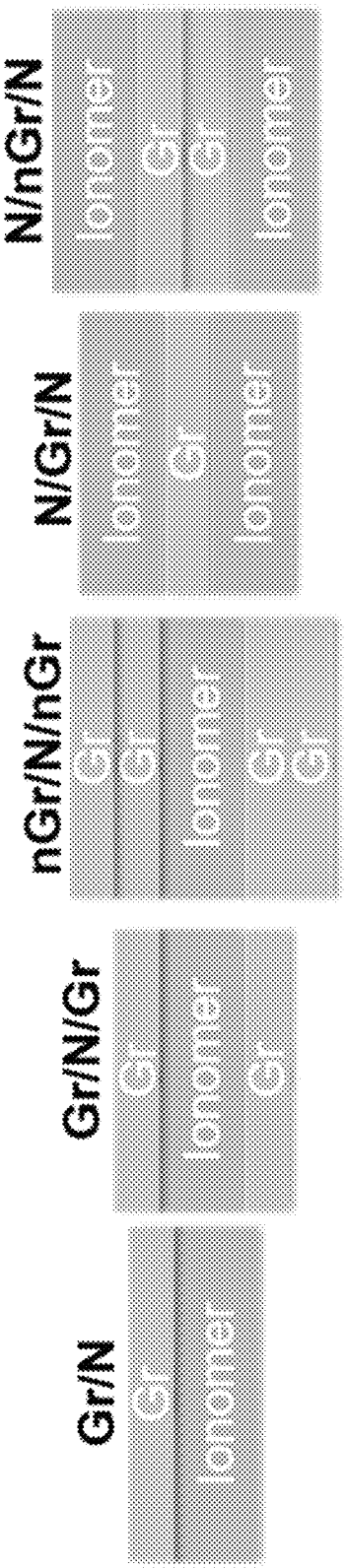
FIG. 34 shows possible CVD graphene/ionomer sandwich structures.

The manufacturing flow chart, shown in FIG. 33, illustrates the manufacturing process of CVD graphene sandwiched with Nafion membranes. Graphene grown on a metal or metal alloy foil using CVD method is not released from the foil as free standing but, instead, in step 1, it is either hot pressed or rolled onto an ionomer film or the ionomer film is spray-coated or casted onto graphene from a solution. In a typical route (the top), the same graphene on foil is assembled on the opposite side of the ionomer. In step 2, the metal foil is removed by either peeling off or by dissolution. In step 3, the defects are introduced into the graphene layers by plasma, ozone, or ion bombardment treatment. In the alternative route (bottom), graphene is only on one side is stripped off the foil in step 2 and treated in step 3, followed by step 4, where the second layer of ionomer is laminated or cast from the solution to encapsulate the graphene layer from both sides.

There are two basic approaches for membrane manufacturing.

I. In the first approach, the membrane is cast from GO/Polymer solution on an inert polymer filter membrane by a suitable method, including, e.g., spray-coating, spin coating, dr. Blade and after filtration is reduced to release a free standing r(Polymer/GO) film. Such prepared membrane is encapsulated by Ionomer by spray-coating, hot pressing/ rolling or dip coating.

II. In the second approach, ionomer is the holding piece on which GO/Polymer is deposited on from one or both sides, followed by reduction. For r(Polymer/GO) protection, an additional layer of Ionomer can be deposited on top, if necessary.

Measurements.

r(GO/PVP) membranes were characterized using following techniques:

Proton selectivity: The open circuit voltage (OCV) was measured using a typical U-tube cell and Ag/AgCl (3M KCl) electrodes from Gamry Instruments, where pH1-pH2 solutions were made with HCl and various concentrations of KCl identical on both sides. The membrane was sealed using parafilm sheets with 0.3 cm$^2$ circular opening.

Raman spectroscopy. The representative membranes were analyzed using a Renishaw inVia Qontor micro-Raman spectrometer equipped with a 532, 633 and 785 nm lasers operating at 1-10% power. Multiple points across membrane area were checked confirming samples' uniformity.

Figure 7:
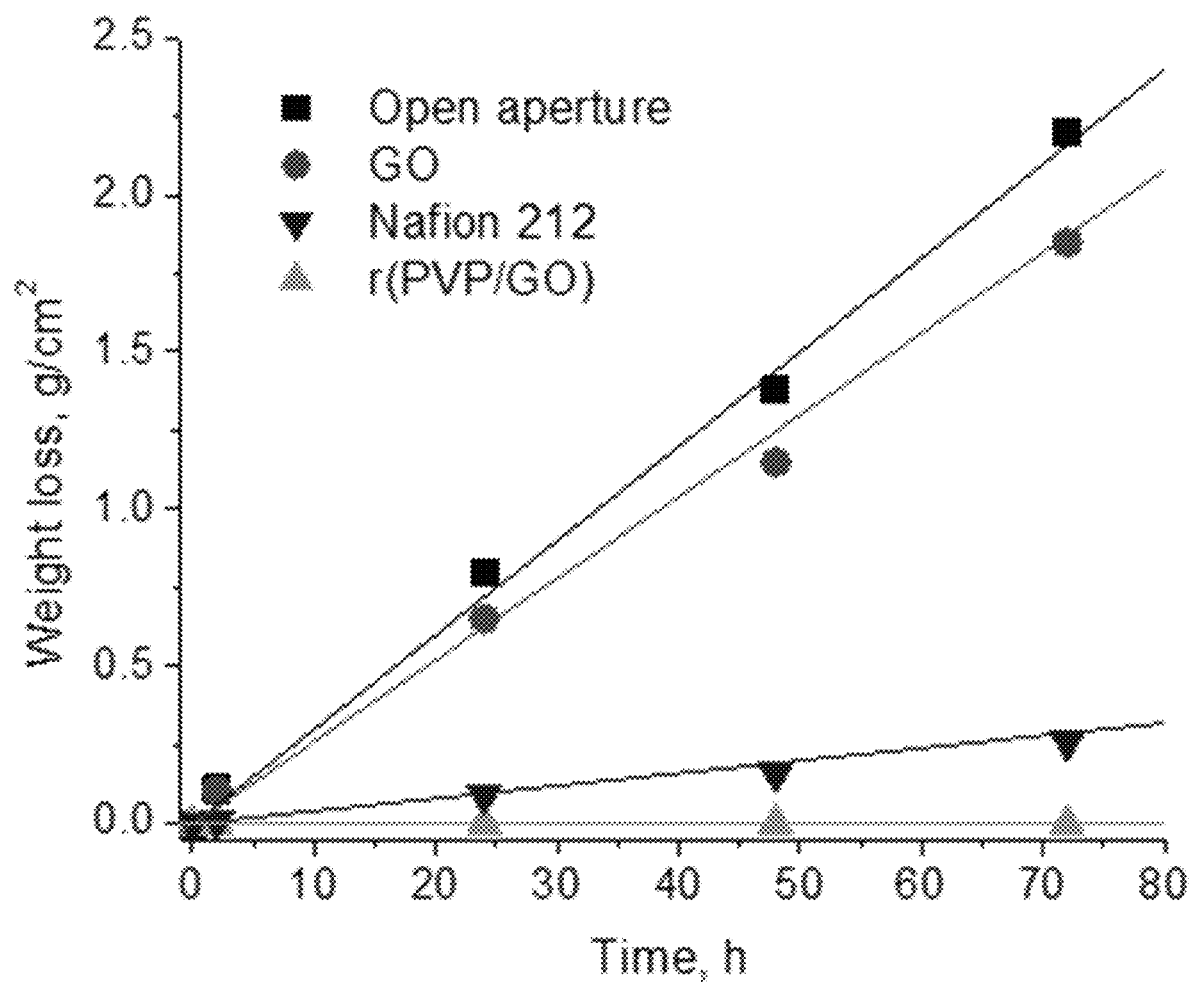
FIG. 7 shows kinetics of water vapor crossover across different membranes.
Figure 8:
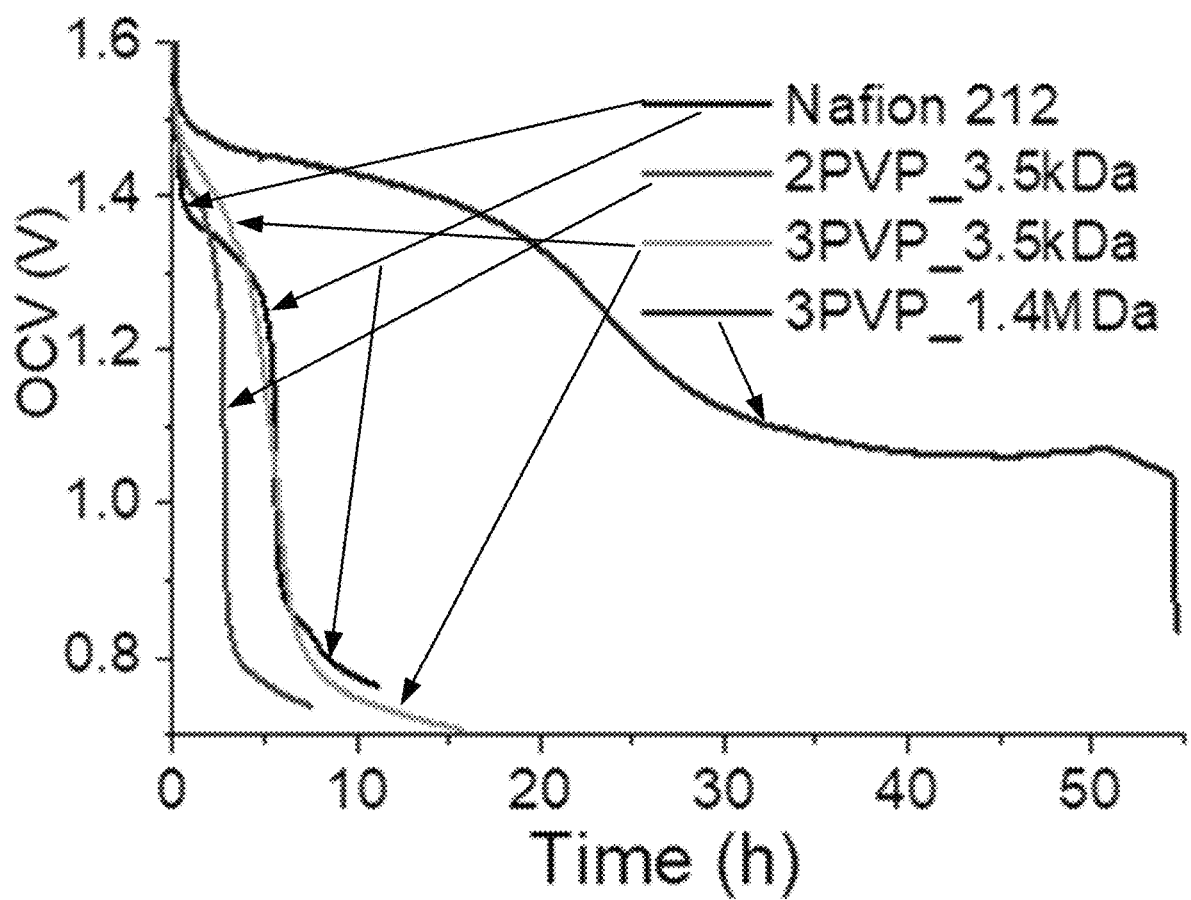
FIG. 8 shows the stage of charge OCV in a charged vanadium battery (1.5M V in 3M $H_2SO_4$) for 0.5 mL and graphite electrodes on each side for the four different membranes, all with 0.3 cm$^2$ opening area.

X-ray diffraction. X-ray diffraction patterns for membranes were obtained by placing them on a glass slide using a PANalytical Empyrean X-Ray Diffractometer with Cu Kα line generated at 40 kV and 25 mA at a scan rate of 4° min$^{-1}$ and the step size of 0.02°. The effect of humidity was evaluated by wetting a sample in water for 2 hours and measuring immediately after, while the sample was wet. Low angle peaks in FIG. 1A-1B. The 22° peak behaves dramatically different. FIG. 7A shows that its intensity, not the position, depends on the fraction of PVP. This peak corresponds to touching rGO sheets that appear even in the samples diluted by PVP. The intensity (area of the overlap) drops linearly with the PVP fraction but the probability of such overlaps to form continuous (percolative) network drops much more precipitously and causes stronger decline in the electronic conductance. A decline of this peak's intensity for a tilted sample (SI) together with well defined (001) and (002) peaks suggest that GO and rGO sheets are well-packed in a nacre-like structure and that the GO sheets are individually dispersed in the PVP matrix and retain such dispersion after reduction, without forming multilayer rGO stacks. Interestingly, reduction of GO/PVP composites does not result in a decrease of the interlayer distance in contrast to the reduction of pure GO membrane (FIGS. 1A-1B). Reduction of 1PVP/GO results in a small distance increase, while such increase for 2 and 1.5PVP/GO samples (that is 2:1 and 1.5:1 PVP:GO ratios) is quite significant (FIGS. 7C-7D), suggesting a noticeable uptake of $I_3^-$ along with possible reorganization of PVP.

FTIR. FTIR spectra were recorded using Nicolet iS10 spectrometer in a transmission mode. Two types of samples were investigated showing matching results: free standing membrane films and films on a Si wafer. Free standing r(GO/PVP) membranes were thinner (~2 μm) but otherwise identically produced to standard membranes. Films on Si wafers were casted using spin coating of the same solutions using low rpm to achieve noticeable thickness. The background signals were, correspondingly, empty opening and a Si wafer exposed to the same treatment but without the film. The spectra are shown in FIGS. 11A-11D. As can be seen, when rGO flakes contact each other continuously, they have a metallic appearance and reflect IR radiation very well in the whole range. When rGO flakes are separated (partially or in full) by PVP, the reflection of IR is less efficient, especially at low frequencies. In addition, spectral features for the freestanding r(GO/PVP) and for such membrane prepared on Si are identical. Finally, the intensity of the most pronounced carbonyl peak of PVP decreases after reduction by a factor of about 2.5. Complexation of PVP with $HI_3$ in the stoichiometry of 2PVP monomers per one $HI_3$ causes disappearance of the carbonyl signal and appearance of a wide peak at around 760 cm$^{-1}$. The latter is not seen because of the above-mentioned relative increase of transmittance in r(GO/PVP) at low frequencies. The carbonyl signal decline can be used to estimate the PVP:$HI_3$ stoichiometry as roughly one $HI_3$ per 4-5 monomer PVP units.

X-ray photoelectron spectroscopy. XPS data was acquired using Thermo Scientific Model K-Alpha XPS instrument. The spectra were obtained using micro-focused, monochromatic Al Kα X-rays (1486.6 eV) with a 400 μm X-ray spot size. Depth profiles were measured using a monoatomic Ar-ion source operated at 2 kV ion energy. The sputter rate was calibrated using standard thickness SiO$_2$ films and was ~12 nm/min. Data were collected and processed using the Thermo Scientific Advantage XPS software package. The XPS data shown in FIGS. 12A-12C support the conclusions of the Raman analysis shown in FIGS. 1C-1E. Spectrum was obtained on a r(0.65PVP/GO) membrane that showed an OCV~50 mV. As expected, the surface composition of the prepared films contains I, O, N, and C, as shown by the XPS spectra in FIG. 9A. The casted films' depth profile analyses suggest that nitrogen exists only in the r(PVP/GO) film (from PVP polymer), while iodine is present in both the reduced r(GO) and r(PVP/GO) films (FIG. 9B). Both $I_2$ (~620.5 eV) and $I_3^-$ (618.7) were detected confirming the Raman assessment. Assignment of the iodine species bands was performed according to previous reports. Based on the composition profile, the ratio of atomic % for N and I is approximately N:I=2:1.5, which corresponds to roughly one 13 per four PVP monomer units.

Figure 10A:
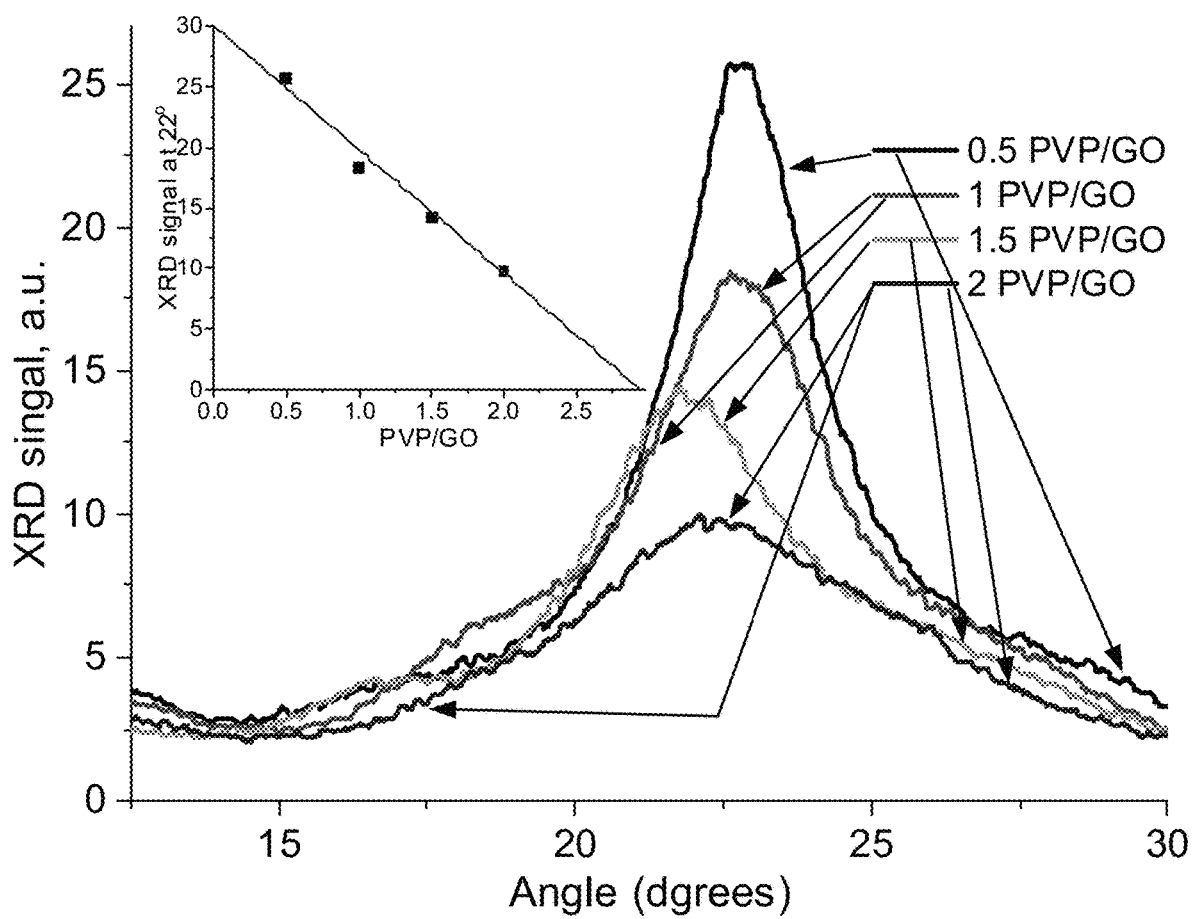
FIG. 10A shows XRD patterns for composite films prepared from (PVP/GO) in different proportions after reduction with HI. The insert illustrates the variation of the intensity at 22° on the PVP/GO ratio.
Figure 10B:
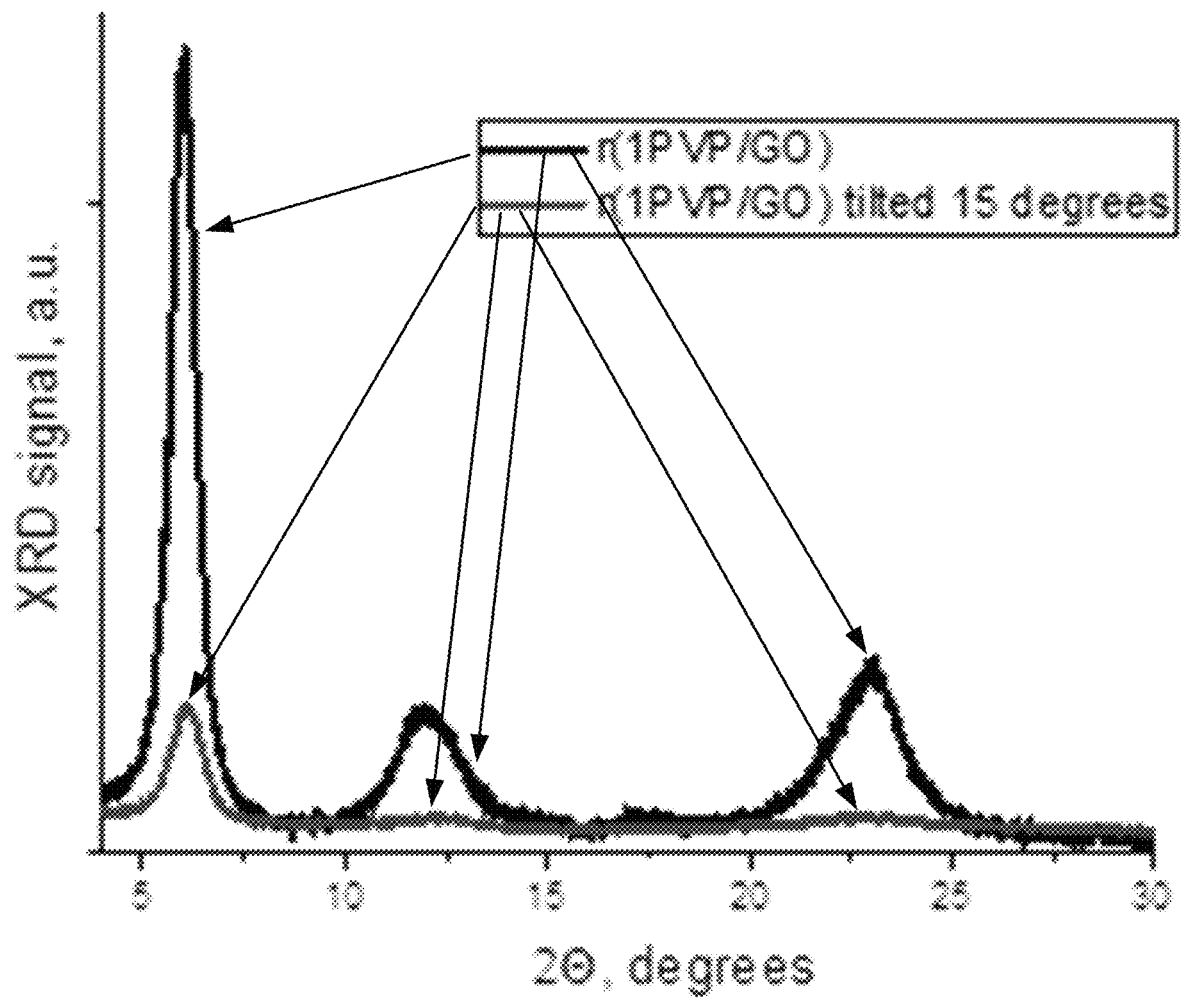
FIG. 10B shows XRD patterns of r(1PVP/GO) and same sample tilted by 15°.
Figure 10C:
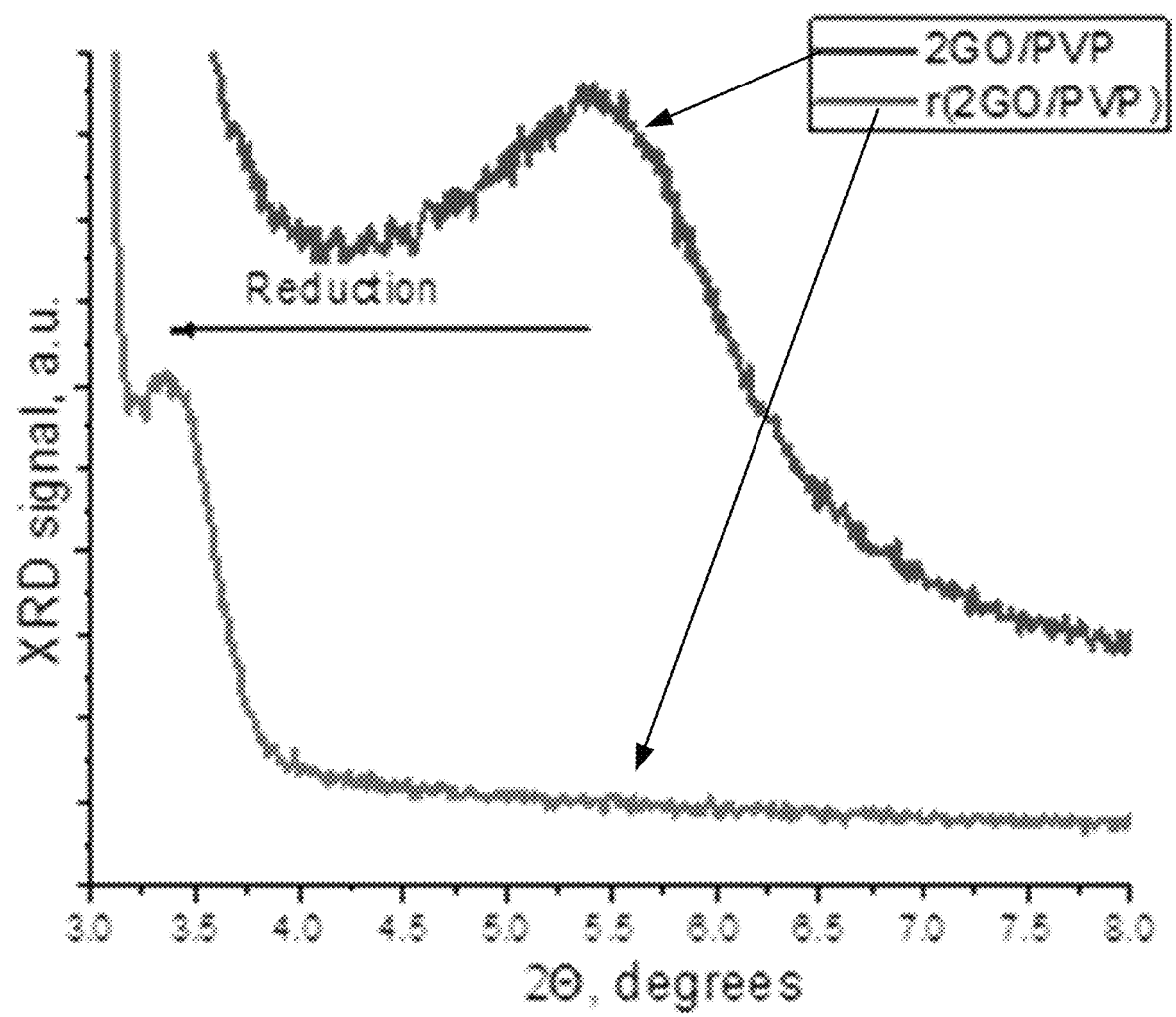
FIG. 10C shows XRD curves of 2PVP/GO before and after reduction.

Thermogravimetric analysis. TGA measurements were carried out on a Thermal Analysis (TA) Instruments Q500 analyzer. The samples were placed in platinum pans and the temperature ramps were performed using heating rate of 10° C./min under 20 sccm flow of nitrogen. Temperature ramps were performed after equilibrating the samples at 105° C. for 20 min in order to remove bulk water. The TGA and the derivative (DTG) curves in shown in FIGS. 10A and 10B for GO/PVP and r(GO/PVP) membranes (respectively) are quite different; the latter demonstrates a better thermal stability with no significant variation until about 300° C. The samples were kept at 105° C. for 20 minutes to reduce the amount of water, which is reflected in a lower mass at the starting point of 100° C. This loss of water is greater in GO/PVP (10%) than in r(GO/PVP) (6%). Moreover, there is noticeable difference in the step at 200° C. representing the decomposition of —COOH and OH groups in graphene oxide of GO/PVP sample, whereas no such major weight loss is observed for r(GO/PVP), confirming a complete reduction of GO with HI vapor treatment. Also, PVP decomposes in the temperature range up to 450° C., which is observed in both samples and implies they have almost the same amount of PVP in them. The additional loss close to 50% at higher temperatures for the r(GO/PVP) sample is due to the presence of iodine. Such a high temperature for iodine loss indicates its strong interaction with PVP and rGO. The amount of iodine can vary depending on conditions; the estimate based on one $HI_3$ per two PVP units suggests about 1.7 times greater the amount of iodine compared to PVP, which is close to the experimental.

Figure 14A:
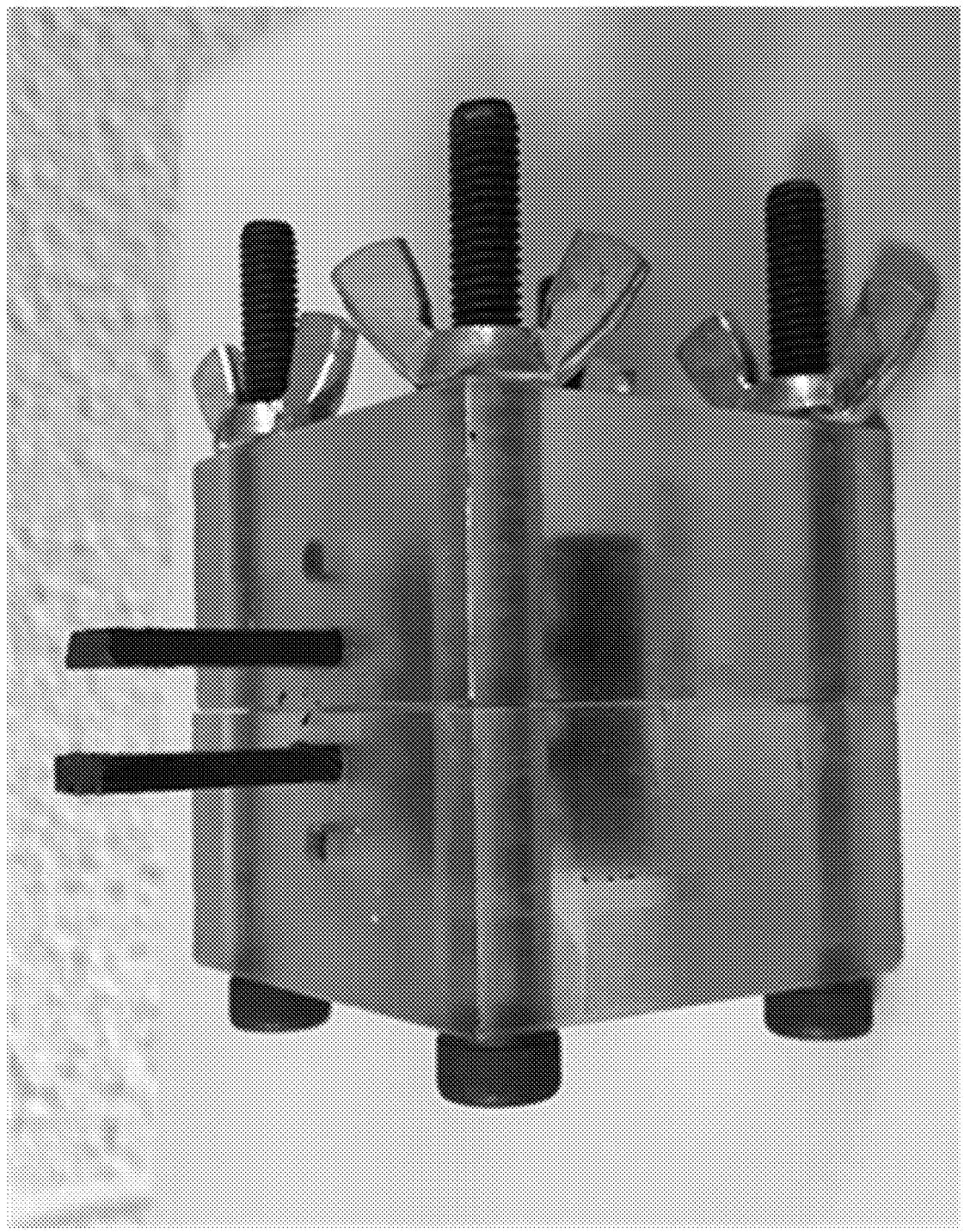
FIG. 14A shows a homemade Poly(methyl methacrylate) (PMMA) cell for proton conductance measurements with two compartments separated by a membrane and graphite electrodes on each side; the blue color is from the VRB electrolyte, 1.5M $VOSO_4$+3M $H_2SO_4$.
Figure 14B:
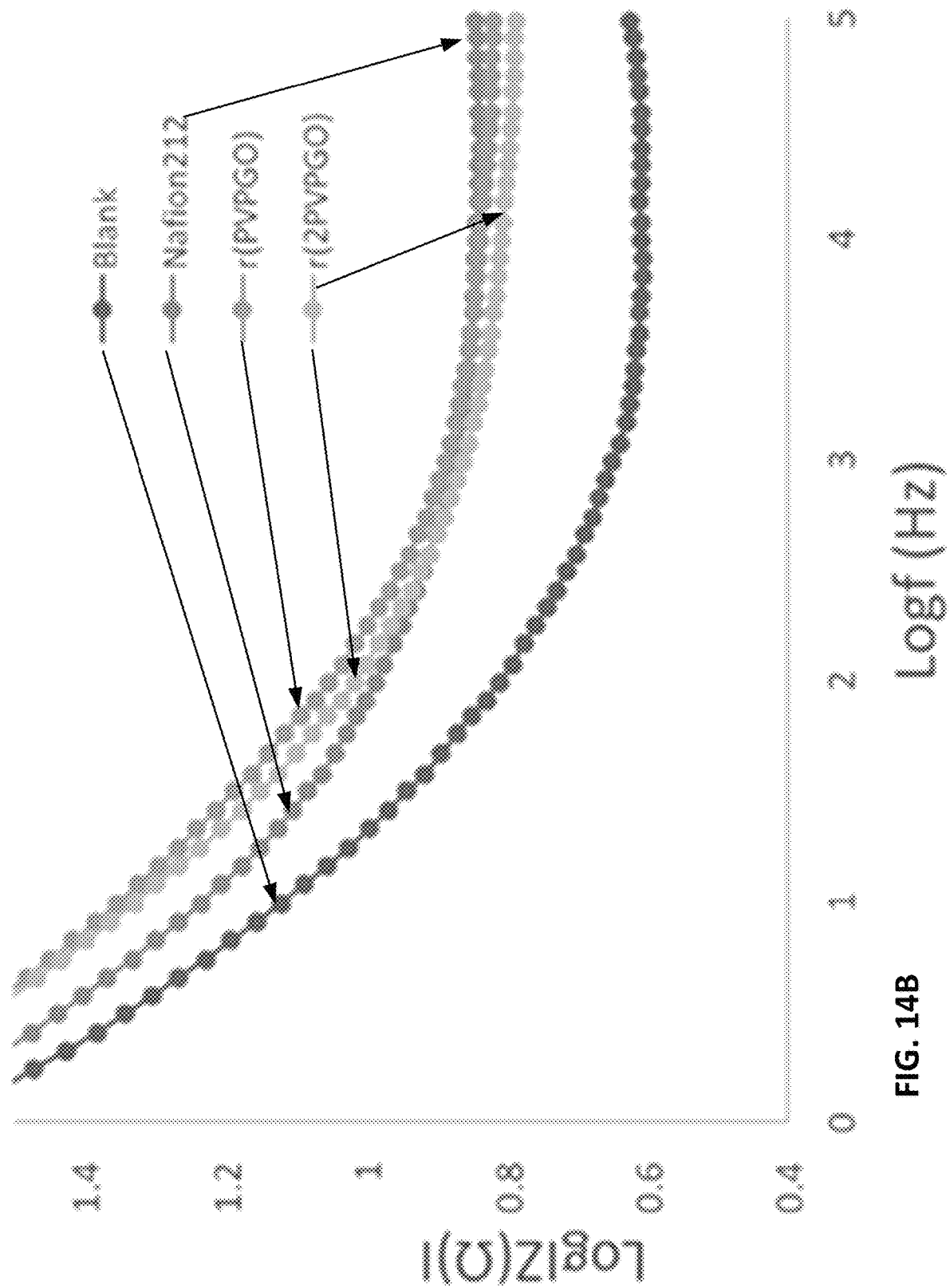
FIG. 14B shows proton conductance data obtained from the cell of FIG. 14A.
Figure 15:
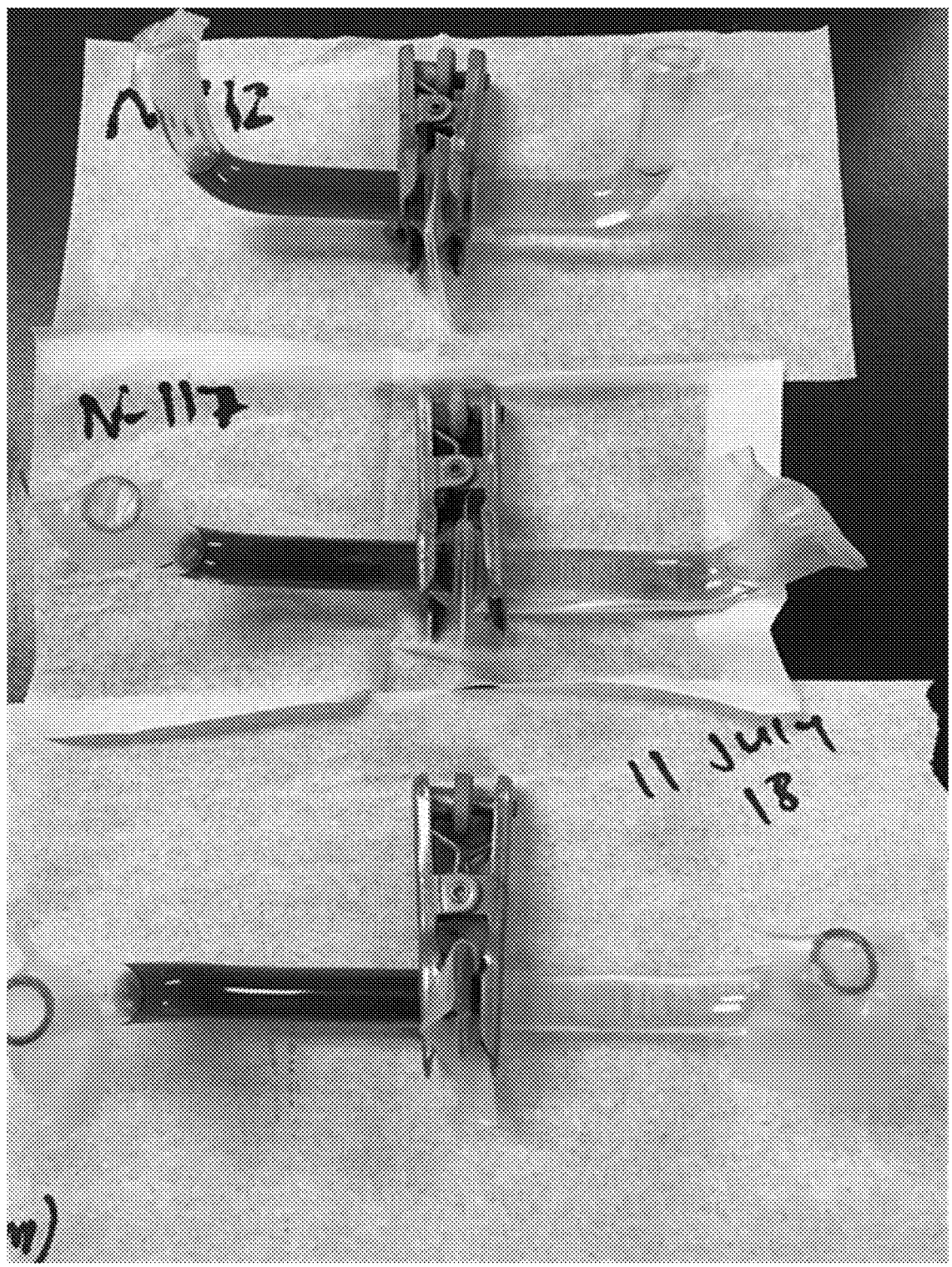
FIG. 15 shows vanadium crossover experiments with U-tubes filled with 1.5M $VOSO_4$ in one compartment and 1.5M $MgSO_4$ in the other and three membranes: Nafion 212, Nafion 117, and r(PVP/GO).

Proton conductance. To eliminate contribution from the electrode reactions, the proton conductance was measured in the AC impedance mode performed with a CH 604B electrochemical workstation (from CH Instruments). A homemade PMMA cell, shown in FIG. 11A, had two compartments (0.5 mL) separated by a membrane of interest with a 1 $cm^2$ cross section and a graphite electrode on each side close (3 mm) to it. The impedance was measured at a low voltage (5 mV AC) and for frequencies from 0.1 Hz to 100 kHz. A typical vanadium redox battery (VRB) electrolyte, i.e., 1.5M $VOSO_4$+3M $H_2SO_4$, or just 3M $H_2SO_4$, was used. Frequency dependence of the impedance in all cases shows a capacitive region due to electrodes at low frequencies which declines with increasing frequency and eventually saturates at the resistive part where the reading for resistances were taken. First, the electrolyte solution resistance, $R_{sol}$, was measured and its value was then subtracted from the resistance measured with membrane to obtain the membrane resistance. All measurements for different PVP/GO ratios were normalized by the total mass used for the membrane preparation and the area (0.3 $cm^2$) of the membrane opening. The proton conductance for Nafion212 was measured under identical conditions. Results are shown in FIG. 14B. Representative impedance frequency dependent traces show the resistive contribution at high frequency and the capacitive contribution at low frequency due to polarization at the electrodes. The increase in the resistive contributions due to the membranes is clearly seen.

Crossover experiments. The $VO^{2+}$ permeability of a membrane was measured using a glass U-tube cell/diffusion cell, which was filled with 1.5M $VOSO_4$ solution ($V_A$=4 mL) in one compartment and 1.5M $MgSO_4$ solution in the other compartment ($V_B$=4 mL), respectively. The $VO^{2+}$ concentration in the $MgSO_4$ for different durations was measured (F at 760 nm=20.2 $M^{-1}$ $cm^{-1}$) on a UV-Vis spectrometer from Shimadzu. The extinction coefficient was obtained by calibration with known concentrations of $VOSO_4$ in 0.2M $H_2SO_4$+0.1M $MgSO_4$, The $VO^{2+}$ permeability, P, was calculated by normalizing the flux with the area (A=0.3 $cm^2$) and the membrane thickness, L=11 μm using the following equation:

$$V_B \frac{dc_B}{dt} = A \frac{P}{L}(c_A - c_B)$$

Since neither ions (cations nor anions) move through the membrane of the present invention, water crossover experiments can be carried out also using a similar U-tube cell with a 1M NaCl solution in one compartment and the same volume (4 mL) of water in the other. In the case of Nafion, both water and $Na^+$ ions can move under the osmotic pressure but electroneutrality restricts it only to movement of water and the osmotic pressure thus being approximately twice the salt concentration times RT. The change in the volume was measured in the second compartment for different durations and the crossover of methanol was calculated similarly using the above equation from the slope of the initial part (X Rate=mL/min), the cross section (A=0.3 $cm^2$), and the thickness (L=11 μm). Water does not pass through membranes of the present invention, but it does pass through Nafion. Because in a methanol/water mixture crossover of water in Nafion is significantly suppressed, methanol crossover experiments can be carried out in a similar manner for both using a similar U-tube cell with 1:1 water:methanol solution (12.5M) in one compartment and the same volume (3.2 mL) of water in the other. The change in the volume was measured in the second compartment for different durations and the crossover of methanol was calculated similarly using the equation above from the slope of the initial part (X Rate=mL/min), the cross section (A=0.3 $cm^2$), and the thickness (L=11 μm).

Vanadium battery discharging. The cell with 0.5 mL solutions of 1.5M vanadium in 3M $H_2SO_4$ on the negative side and 1 mL solution of 1.5M vanadium in 3M $H_2SO_4$ on the positive side was charged using graphite electrodes at 1.9-2V for 10 h using a membrane of interest, r(GO/PVP) or Nafion 212. The charging results into V(II) violet and V(V) yellow color solutions on the negative and positive halfcells, respectively. The 0.5 mL solution from the positive side was removed and the self-discharge was monitored by a potentiostat for equal volumes (0.5 mL) of V(II) and V(V) on both sides of the cell with the membrane opening area 0.3 $cm^2$.

Note that in the specification and claims, "about" or "approximately" means within twenty percent (20%) of the numerical amount cited. As used herein, the singular forms "a," "an," and "the" include plural referents unless the context clearly dictates otherwise. Thus, for example, reference to "a functional group" refers to one or more functional groups, and reference to "the method" includes reference to equivalent steps and methods that would be understood and appreciated by those skilled in the art, and so forth.

Having thus described a preferred embodiment, it should be apparent to those skilled in the art that certain advantages of the described method and apparatus have been achieved.

It should also be appreciated that various modifications, adaptations and alternative embodiments thereof may be made within the scope and spirit of the present invention. The invention is further defined by the following claims. The entire disclosures of all patents and publications cited above are hereby incorporated by reference.

What is claimed is:

1. A proton conductive membrane, comprising:
 a proton selective layer of 80-100% carbon with sp2 hybridization having a thickness of 0.3-100 nm, with remaining 0-20% of hydrogen, oxygen, nitrogen and sp3 carbon;
 wherein the sp2 carbon is in a form of graphene-like material;
 the proton selective layer having a plurality of pores formed by cyclical structures of any of 7, 8, 9 or 10 sp2 carbon atoms or a combination thereof, with the pores having an effective diameter of up to 0.6 nm;
 an ionomeric polymer layer on the proton selective layer, wherein a total thickness of the proton conductive membrane is less than 50 microns and wherein the proton conductive membrane is electrically non-conductive.

2. The membrane of claim 1, wherein the ionomeric polymer is PFSA (perfluorinated sulfonic acid).

3. The membrane of claim 1, wherein the graphene-like material is reduced graphene oxide (rGO).

4. The membrane of claim 1, wherein the graphene-like material is CVD graphene.

5. The method of claim 1, wherein a D to G Raman band ratio of the membrane is more than 0.1.

6. The membrane of claim 1, wherein the graphene-like material is CVD graphene bombarded by $He^+$ or $Ne^+$ ions.

7. The membrane of claim 1, wherein the graphene-like material is CVD graphene treated by nitrogen, hydrogen or oxygen plasma.

8. The membrane of claim 1, wherein the graphene-like material is CVD graphene treated by ozone.

9. The membrane of claim 1, wherein the ionomeric polymer is PVP (polyvinylpyrrolidone) or PVA (poly vinyl alcohol) with iodide or bromide counterion dissolved inside.

10. The membrane of claim 1, wherein the graphene-like material is a layered structure of reduced graphene oxide (rGO) and polymer between the rGO layers of the structure.

11. The membrane of claim 1, further comprising a second layer of graphene-like material, with the ionomeric polymer sandwiched between the layer of graphene-like material and the second layer of graphene-like material.

12. The membrane of claim 9, further comprising a second ionomeric polymer layer, with the layer of graphene-like material sandwiched between the layer of ionomeric polymer layer and the second ionomeric polymer layer.

13. The membrane of claim 1, wherein the membrane has the following properties: not exceeding 0.6 ohm·$cm^2$ proton resistance (APR), a level of $VO^{2+}$ permeability coefficient less than $2\times10^{-9}$ $cm^2$/min and methanol permeability coefficient less than $2\times10^{-10}$ $cm^2$/s.

* * * * *